United States Patent
Kanno et al.

(10) Patent No.: US 7,251,354 B2
(45) Date of Patent: Jul. 31, 2007

(54) ELECTRONIC COMPONENT INSPECTION APPARATUS

(75) Inventors: Yukio Kanno, Iwata (JP); Yoshiaki Fukukawa, Iwata (JP)

(73) Assignee: Yamaha Hatsudoki Kabushiki Kaisha, Shizuoka (JP)

( * ) Notice: Subject to any disclaimer, the term of this patent is extended or adjusted under 35 U.S.C. 154(b) by 130 days.

(21) Appl. No.: 10/506,809

(22) PCT Filed: Mar. 7, 2003

(86) PCT No.: PCT/JP03/02699

§ 371 (c)(1),
(2), (4) Date: Feb. 14, 2005

(87) PCT Pub. No.: WO03/075027

PCT Pub. Date: Dec. 9, 2003

(65) Prior Publication Data

US 2005/0129301 A1 Jun. 16, 2005

(30) Foreign Application Priority Data

| Mar. 7, 2002 | (JP) | ............................. 2002-062379 |
| Mar. 7, 2002 | (JP) | ............................. 2002-062380 |
| Mar. 11, 2002 | (JP) | ............................. 2002-066158 |
| Mar. 11, 2002 | (JP) | ............................. 2002-066159 |
| Mar. 14, 2002 | (JP) | ............................. 2002-071072 |
| Nov. 29, 2002 | (JP) | ............................. 2002-348785 |

(51) Int. Cl.
*B65G 43/08* (2006.01)
*H01L 21/06* (2006.01)
*G01M 19/00* (2006.01)
*G01N 21/84* (2006.01)

(52) U.S. Cl. ................. 382/145; 73/865.9; 414/222.02

(58) Field of Classification Search .... 73/865.8–865.9; 382/145; 414/222.02; 209/552
See application file for complete search history.

(56) References Cited

U.S. PATENT DOCUMENTS

| 7,058,216 B2 * | 6/2006 | Kawada ................... 382/145 X |
| 7,162,072 B2 * | 1/2007 | Matsushita ................... 382/145 |
| 2003/0027363 A1 * | 2/2003 | Kodama ....................... 438/14 |
| 2003/0059964 A1 * | 3/2003 | Kawai et al. ................. 438/14 |

FOREIGN PATENT DOCUMENTS

JP   1-92671 A   4/1989

(Continued)

*Primary Examiner*—Thomas P. Noland
(74) *Attorney, Agent, or Firm*—Keating & Bennett, LLP

(57) ABSTRACT

An electronic component inspection apparatus includes an inspection socket which inspects a component, a tray disposition area in which a component waits before it is inspected, tray disposition areas which store a component after it has been inspected, components transfer mechanisms each of which has a vacuum or suction nozzle that can pick up and hold a component to transfer the component, a component position confirmation camera which can capture an image of the component that is being transferred, and a controller which transfers a component to the inspection socket, via a position in which the component position confirmation camera captures an image of the component being held by the suction nozzle while the component is being transferred from the tray disposition area to the inspection socket, and based on that captured image, controls the drive of the components transfer mechanisms so that the component is set in the inspection socket.

23 Claims, 52 Drawing Sheets

FOREIGN PATENT DOCUMENTS

| | | | |
|---|---|---|---|
| JP | 04256591 A * | 9/1992 |
| JP | 6-58982 A | 3/1994 |
| JP | 07015186 A * | 1/1995 |
| JP | 07-198780 A | 8/1995 |
| JP | 10-123207 A | 5/1998 |
| JP | 11-97489 A | 4/1999 |

* cited by examiner

FIG. 6

| | AREA130a | AREA130b | AREA130c | AREA130d |
|---|---|---|---|---|
| DISPOSITION 1 | ALREADY-INSPECTED 1 | ALREADY-INSPECTED 2 | EMPTY TRAY | NOT-YET-INSPECTED |
| DISPOSITION 2 | EMPTY TRAY | ALREADY-INSPECTED 1 | ALREADY-INSPECTED2 | NOT-YET-INSPECTED |
| DISPOSITION 3 | ALREADY-INSPECTED 1 | ALREADY-INSPECTED 2 | NOT-YET-INSPECTED | EMPTY TRAY |

511  512a 512b 521a  522a 521b  522b 531a  532a 531b  532b 541  542 544

543a 543b

ELECTRONIC COMPONENT INSPECTION APPARATUS

BACKGROUND OF THE INVENTION

1. Field of the Invention

The present invention relates to an electronic component inspection apparatus for inspecting package components such as a package IC, or electronic components such as a bare chip that is diced from a wafer.

2. Description of the Related Art

In the manufacturing process for electronic components such as a semiconductor device, various inspections of the electronic component, such as an IC, which are finally manufactured, must be made. For example, there is known a device inspecting apparatus (i.e., an electronic component inspection apparatus), disclosed in Japanese Patent Laid-Open No. 10-148507.

This inspecting apparatus includes an unloader portion, a loader portion, an empty tray portion, a heating portion, two sorting portions, an IC socket, a component transfer mechanism, and the like. The first sorting portion, the unloader portion, the loader portion and the empty tray portion are disposed in line in the X-axis direction. The IC socket (i.e., an inspection portion) is disposed in the Y-axis direction separate from the above-described elements. In addition, the second sorting portion and the heating portion are disposed in line away from the first sorting portion and the like in the Y-axis direction.

A component on the loader portion is transferred to the heating portion, using a suction pad (hereinafter, referred to as a suction nozzle) of the component transfer mechanism (hereinafter, referred to as a component transferring device). Then, the heated component (hereinafter, referred to as the component) is transferred to the IC socket and is inspected. Among the components that have been inspected, the one which has met a standard is transferred to the unloader portion, and the one which has not met the standard is transferred to the first or second sorting portion, respectively, by the component transfer mechanism.

In such an inspecting apparatus, an inspection of the components is done after they have been precisely positioned in a predetermined direction with respect to the inspection portion. This is important to realize firm and precise inspections of components. In the apparatus according to the prior art, a CCD camera is placed in the component transferring device so that components on the loader portion are imaged before they are inspected, so that the positions or other characteristics of the components can be determined from those images. Thus, the positions in which the components will be picked up by the suction nozzle are corrected in advance, and then, the components are picked up and transferred.

However, when the components are picked up by the suction nozzle, they may slip out of position. Also, while components are being transferred, they may be shaken, or other problems may occur, such that the position of the component relative to the suction nozzle shifts. Therefore, in the apparatus according to the prior art, components cannot necessarily be precisely positioned in the inspection portion. Hence, this problem needs to be corrected.

According to the above-described prior art, right before components are set in the inspection portion, a component can be positioned and set a first time, and an image of the component can be captured by a CCD camera. Then, the position of the component is corrected and it is suctioned and picked up again, and then, it is set again in the inspection portion. However, even in that case, when a component is picked up after its image has been captured, a suction shift may occur. Besides, a component has to be picked up again, which takes additional time. This prevents components from being inspected effectively and precisely.

In addition, in the apparatus according to the prior art, the sorting portions or the inspection portion is located in a position which is displaced in the Y-axis direction from the loader portion or the like. Therefore, when the component transferring device transfers components from the loader portion to the inspection portion, or when it transfers components from the inspection portion to the unloader portion or the sorting portions (especially, to the side of the heating portion), the suction nozzle needs to be extensively moved not only in the X-axis direction but also in the Y-axis direction. Hence, the apparatus tends to become larger in the Y-axis direction, thereby preventing a reduction in the size of the apparatus. Besides, the suction nozzle moves over a great distance in both the X-axis and Y-axis directions. This makes it difficult, for example, to increase the transfer speed from the viewpoint of control, thus preventing accurate and efficient inspections.

SUMMARY OF THE INVENTION

In order to overcome the problems described above, preferred embodiments of the present invention provide an electronic component inspection apparatus which is capable of inspecting components effectively and precisely, and which has a significantly reduced size.

An electronic component inspection apparatus according to a preferred embodiment of the present invention includes an inspection portion which inspects a component, a component standby portion in which a component waits before it is inspected, a component storage portion which stores a component after it has been inspected, a component transferring device which has a suction nozzle that applies suction to and picks up a component and transfers the component between the component standby portion or component storage portion and the inspection portion, an image capture device which captures an image of the component that is being transferred by the component transferring device, and a controller that transfers the component to the inspection portion, via a position in which the image capture device captures an image of the state in which the component is held by the suction nozzle while the component is being transferred from the component standby portion to the inspection portion, and based on that captured image result, controls the drive of the component transferring device so that the component is set in the inspection portion.

Furthermore, an electronic component inspection apparatus according to another preferred embodiment of the present invention includes an inspection portion which inspects a component, a component standby portion in which a component waits before it is inspected, a component storage portion which stores a component after it has been inspected, and a component transferring device which has a suction nozzle that applies suction to and picks up a component and transfers it between the component standby portion or component storage portion and the inspection portion, wherein the inspection portion, the component standby portion and the component storage portion are disposed in a line within a range of motion of the suction nozzle.

Other features, elements, steps, characteristics and advantages of the present invention will become more apparent

BRIEF DESCRIPTION OF THE DRAWINGS

FIG. 6 is a table, showing an example of the disposition of a tray T in the tray disposition area.

DETAILED DESCRIPTION OF PREFERRED EMBODIMENTS

Hereinafter, an electronic component inspection apparatus according to a first preferred embodiment of the present invention will be described in detail with reference to the drawings.

Figure 1:
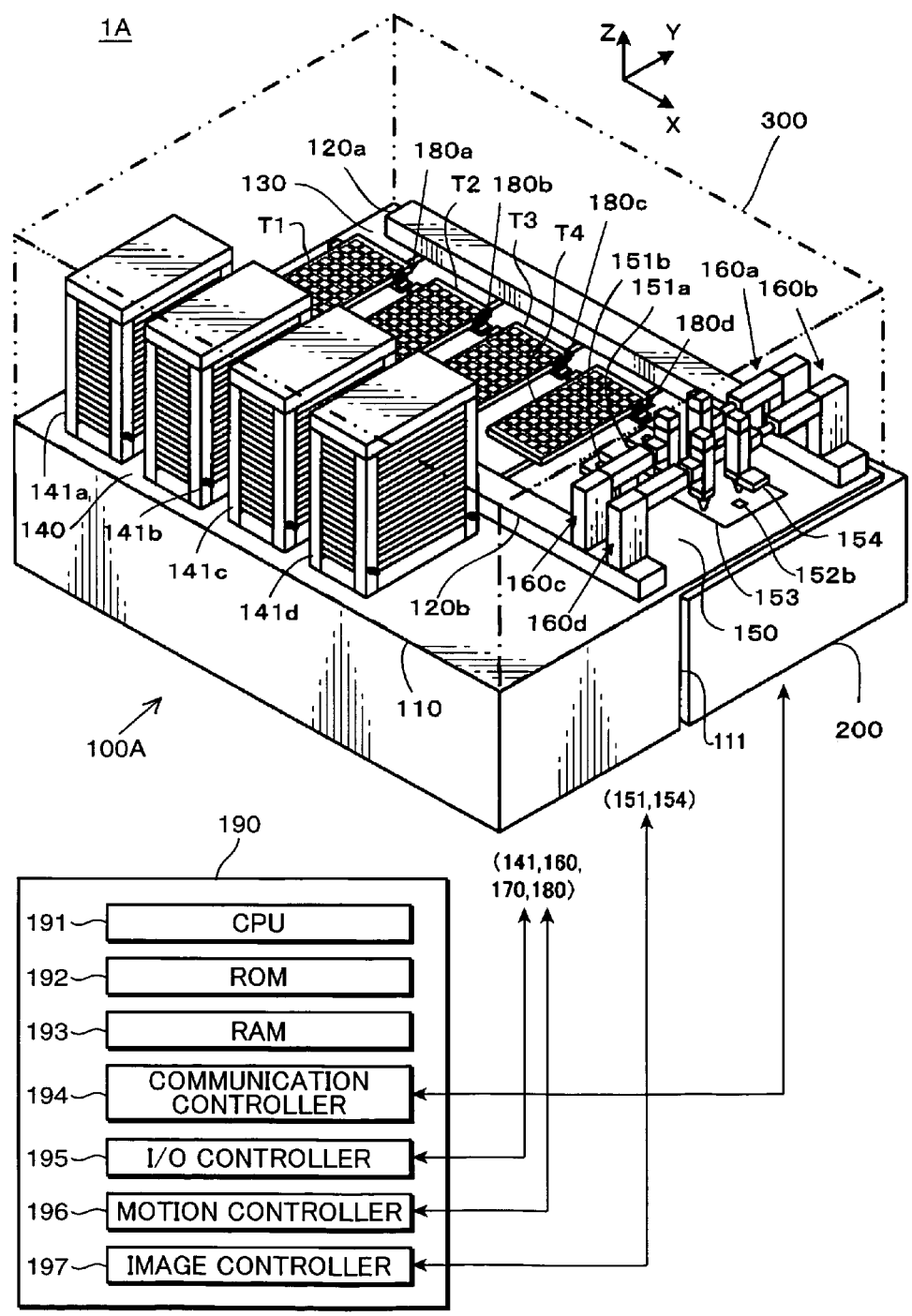
FIG. 1 is a perspective view of an electronic component inspection apparatus according to a first preferred embodiment of the present invention.
Figure 2:
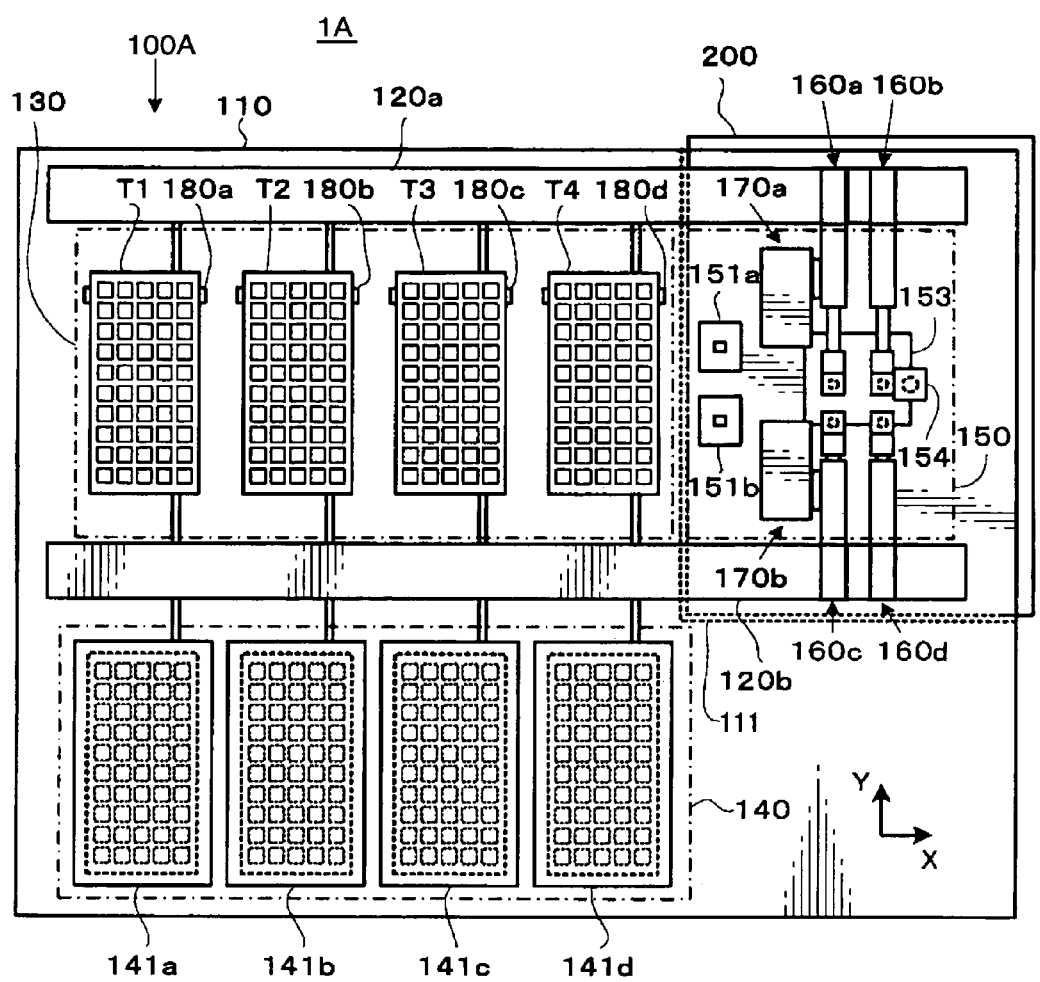
FIG. 2 is a top view of the electronic component inspection apparatus according to the first preferred embodiment, seen from the Z-axis direction in FIG. 1.
Figure 3:
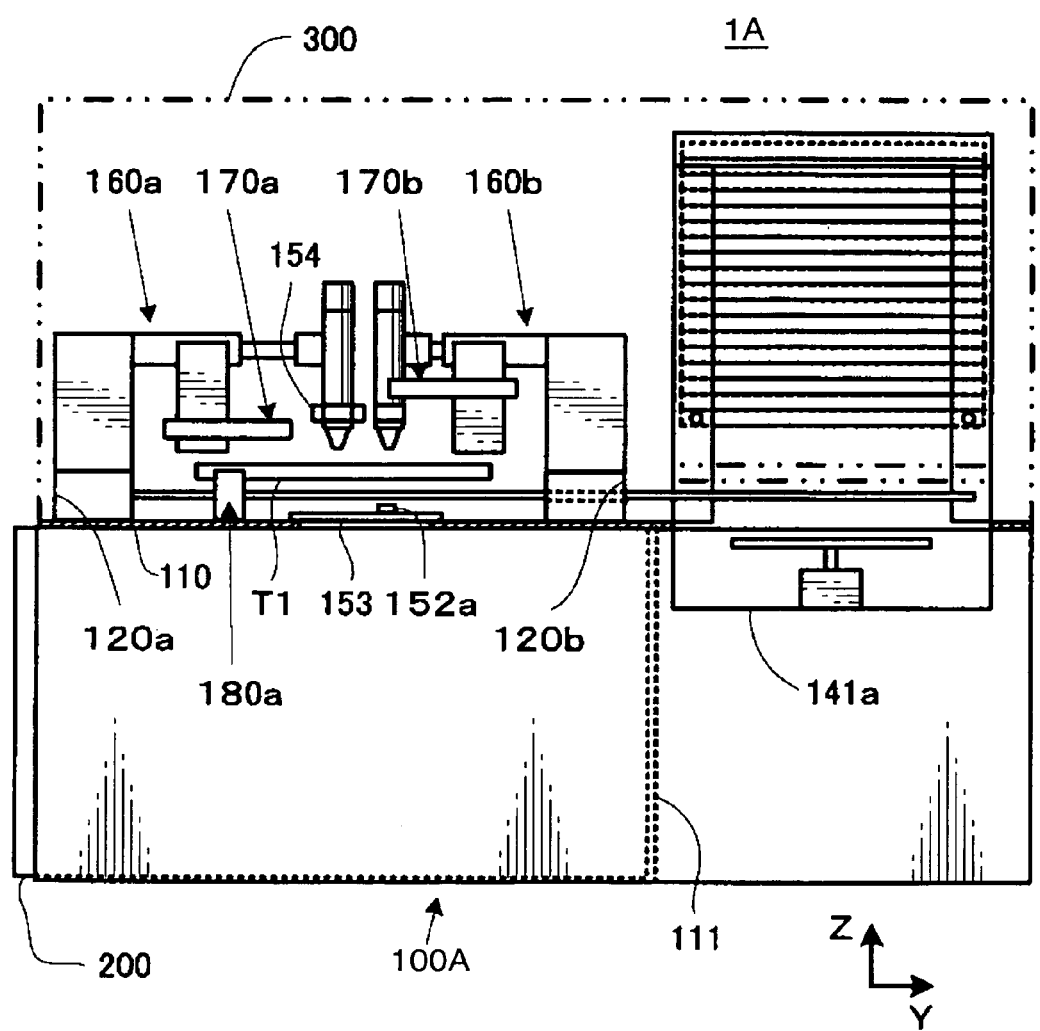
FIG. 3 is a side view of the electronic component inspection apparatus according to the first preferred embodiment, seen from the X-axis direction in FIG. 1.
Figure 4:
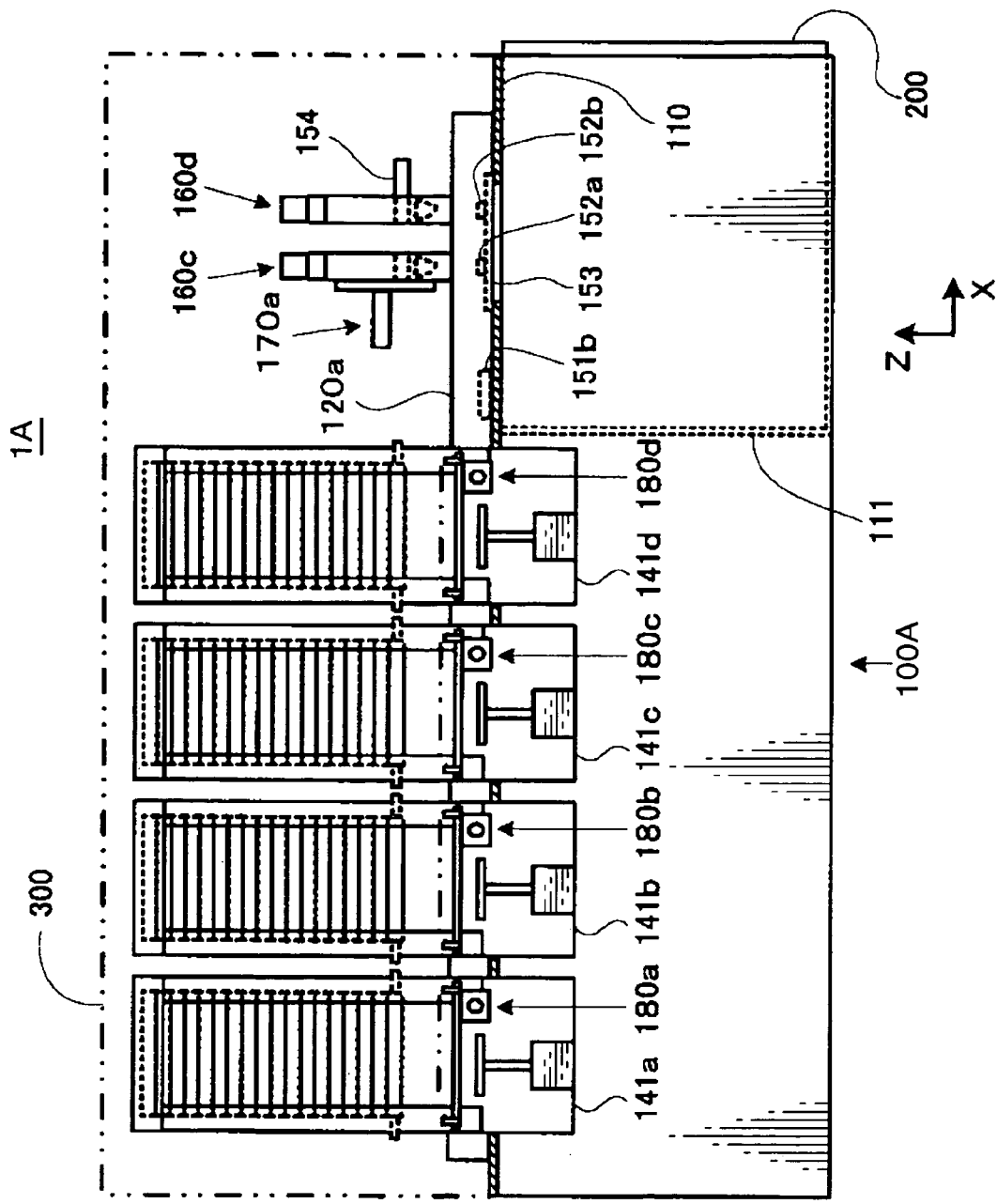
FIG. 4 is a front view of the electronic component inspection apparatus according to the first preferred embodiment, seen from the Y-axis direction in FIG. 1.

FIG. 1 is a perspective view of an electronic component inspection apparatus 1A according to the first preferred embodiment of the present invention. FIGS. 2 to 4 are a top view, a side view and a front view of the electronic component inspection apparatus 1A, seen from the Z, X and Y-axis directions in FIG. 1, respectively.

The electronic component inspection apparatus 1A is an apparatus that transfers and inspects an electronic component D. As shown in FIGS. 1 to 4, the electronic component inspection apparatus 1A is preferably configured by combining an electronic component transfer unit 100A, which transfers the electronic component D, and an electronic component inspection unit 200, which inspects the electronic component D.

The electronic component inspection apparatus 1A is the electronic component transfer unit 100A which mainly transfers components to be inspected, before an inspection plate 153 which includes inspection sockets 152a, 152b (described later) is attached, or after the inspection plate 153 has been attached. Alternatively, in addition to the electronic component transfer unit 100A, it is an apparatus which includes the electronic component inspection unit 200 that is a unit related to the inspection control of electronic components. Herein, the electronic component inspection unit 200 is preferably connected via a signal line to the inspection sockets 152a, 152b and a control portion 190 of the electronic component transfer unit 100A, respectively. It executes an inspection of an electronic component, and outputs data concerning the inspection result to the control portion 190 or another portion, or stores it, and in addition, displays it.

The electronic components D are general electronic components that may include a semiconductor device such as an IC device, for example. A tray (mentioned later) is a container according to preferred embodiments of the present invention.

The electronic component transfer unit 100A preferably includes a base stand 110, two X-axis robots 120 (120a, 120b), a tray disposition area 130 (130a to 130d), a stocker disposition area 140 (140a to 140d), an inspection area 150, a components transfer mechanism 160 (160a to 160d), an X-direction tray transfer mechanism 170 (170a, 170b), a Y-direction tray transfer mechanism 180 (180a to 180d), the control portion 190, a cover 300, and other elements.

In the above-described configuration of the electronic component inspection apparatus 1A, the elements represented by reference numerals that have an alphabetical suffix (e.g., a, b, etc.) are each described below without a suffix (which is also applied even in the drawings), except in the case where they should be distinguished.

The base stand 110 preferably has a substantially rectangular shape at its upper surface, and has a substantially L-shape at its bottom surface. Under the inspection area 150, the base stand 110 has a space 111 that is preferably shaped like a substantially rectangular parallelepiped. In the space 111, the electronic component inspection unit 200 is inserted so as to be connected to the electronic component transfer unit 100A. The space 111 opens on both sides in. the X and Y-axis directions, so that the electronic component inspection unit 200 can be inserted even from either side in the X and Y-axis directions.

The X-axis robots 120a, 120b are not shown in detail in the figure, but these robots 120a, 120b include an X-axis rail which is defined by a fixed magnet, a linear motor which is defined by a movable magnet that can move along the X-axis rail, a screw shaft which is connected to a servo motor, a single screw robot which is defined by a movable nut that is fitted to the screw shaft and the X-axis rail and that can move along the X-axis rail and prevented from turning, and other elements. The X-axis robots 120a, 120b move the components transfer mechanisms 160a to 160d in the X-axis direction, and thereby, the X-axis robots 120a, 120b transfer the electronic component D. According to this preferred embodiment, the two X-axis robots 120a, 120b are preferably used, thus increasing the efficiency of inspections.

According to this preferred embodiment, the X-axis robots 120a, 120b define the track according to various preferred embodiments of the present invention. The X-axis robots 120a, 120b and components transfer mechanisms 160a to 160d define the component transfer device according to various preferred embodiments of the present invention. As described above, if the X-axis robots 120a, 120b have the X-axis rail, the X-axis rail can also be regarded as the track according to various preferred embodiments of the present invention.

The tray disposition area 130 is set between the X-axis robots 120a, 120b on the base stand 110. It includes four substantially rectangular areas (i.e., the tray disposition areas 130a to 130d) in which trays T1 to T4 are each disposed.

Figure 5:
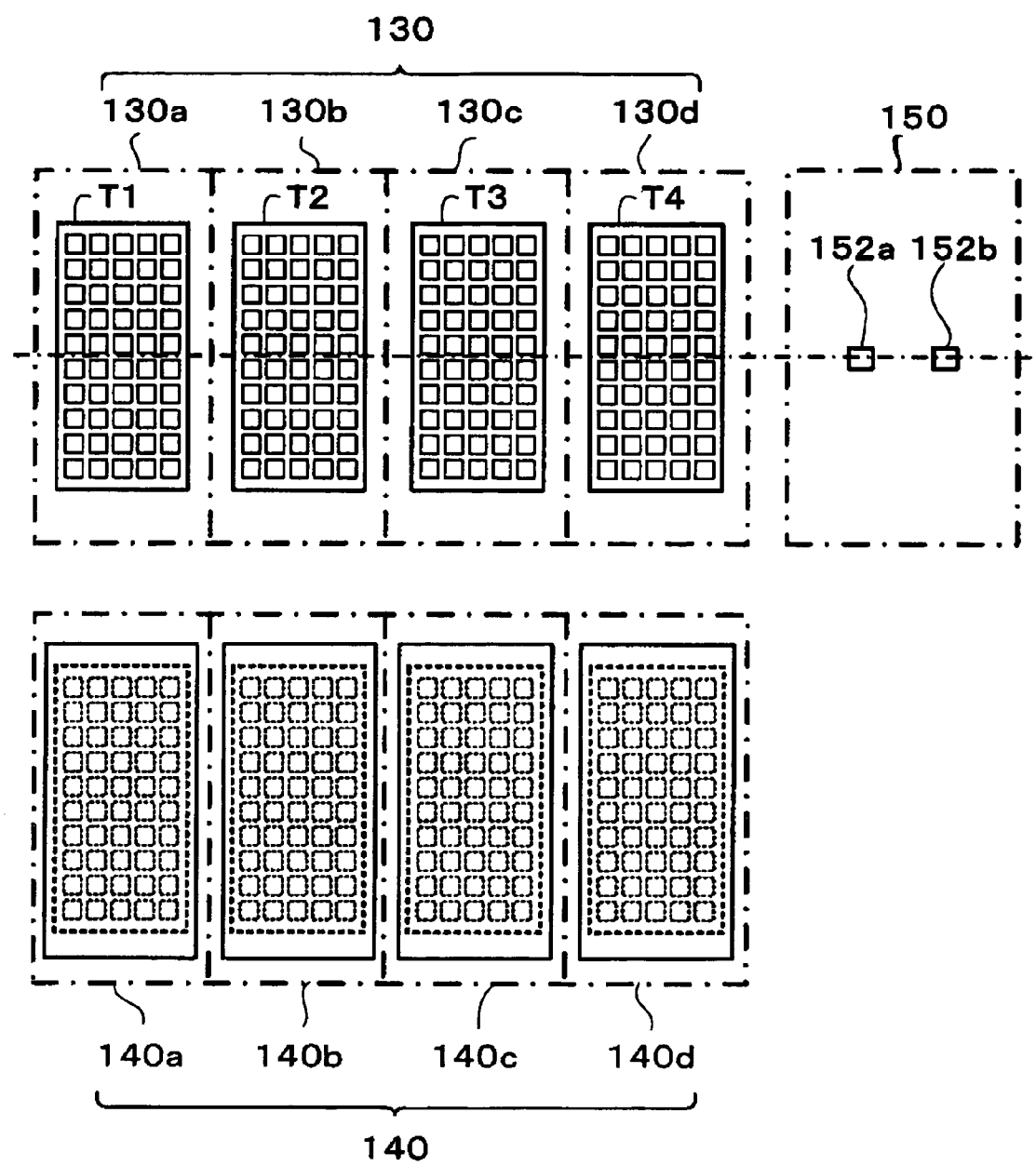
FIG. 5 is a representation, showing the relationship between a tray disposition area and a stocker disposition area.

Specifically, as shown in FIG. 5, the tray disposition area 130 is divided into the tray disposition area 130a (i.e., the component storage portion according to preferred embodiments of the present invention) in which the tray T1 is disposed that stores, from among the components that have already been inspected, components that have been determined to meet a standard, the tray disposition area 130b (i.e., the component storage portion according to preferred embodiments of the present invention) in which the tray T2 is disposed that stores, from among the components that have already been inspected, components that have been determined not to meet the standard, the tray disposition area 130c in which the empty tray T3 is disposed, and the tray disposition area 130d (i.e., the component standby portion according to preferred embodiments of the present invention) in which the tray T4 is disposed that stores components that have not yet been inspected.

These tray disposition areas 130*a* to 130*d* are arranged in line in the X-axis direction, together with the inspection sockets 152*a*, 152*b* (described later). Hence, the trays T1 to T4 are disposed in line in the X-axis direction. This saves space in the Y-axis direction thereby reducing the size of the electronic component inspection apparatus 1A.

As described later, by the components transfer mechanism 160, the electronic components D are transferred to the inspection area 150 from the tray T4 of the tray disposition area 130*d*, and then, the components are inspected. On the other hand, by the components transfer mechanism 160, the electronic components D which have been inspected are transferred from the inspection area 150 to the tray disposition area 130*a* or 130*b*. Then, based on the inspection results, they are stored in the tray T1 or T2. If the tray T4 of the tray disposition area 130*d* becomes empty (i.e., if it becomes the empty tray T3) when the electronic components Dare removed, then by the X-direction tray transfer mechanism 170, the empty tray T3 is transferred from the tray disposition area 130*d* to the tray disposition area 130*c*.

The tray disposition area 130 can be suitably set to be longer in the Y-axis direction than the side of each tray T1 to T4 in the Y-axis direction, and shorter than twice its length.

The specific configuration of the trays T1 to T4 is not limited according to various preferred embodiments of the present invention. However, on each of their upper surfaces, a structure (e.g., hollows or protrusions) is preferably formed and is used to sort the electronic components D and place the components. In the example shown in the figure, the electronic components D can be stored, ten pieces longitudinally and five pieces laterally.

Herein, the trays T1 to T4 are described below simply as the tray T without any reference number, except the case where they especially need to be distinguished from each other.

Hereinafter, the disposition of the tray T will be described in further detail.

According to this preferred embodiment, as described above, the trays T are arranged in the tray disposition areas 130*a* to 130*d* in the order of the trays T1, T2 for components that have already been inspected, the empty tray T3 and the tray T4 for components that have not yet been inspected. However, this order can be suitably changed. As an example of the disposition of the trays T, dispositions 1 to 3 in FIG. 6 can be considered. Among them, the disposition 1 is a disposition that is already shown according to this preferred embodiment.

According to the dispositions 1 to 3 in FIG. 6, the tray T4 for components that have not yet been inspected is disposed on the side (or on the right-hand side in the figure) of the inspection area 150 from the two trays T1, T2 for components that have already been inspected. If the trays are disposed in this way, the electronic components D that have not yet been inspected can be prevented from getting. mixed into the trays T1, T2 for components that have already been inspected. In other words, when the electronic components D that have not yet been inspected are transferred to the inspection area 150, they will not pass through the trays T1, T2 for components that have already been inspected. Therefore, even if the electronic components D that have not yet been inspected drop from the components transfer mechanism 160, they will not get mixed into the trays T1, T2 for components that have already been inspected.

In addition, according to the disposition 1 in FIG. 6, the empty tray T3 is disposed between the trays T1, T2 for components that have already been inspected and the tray T4 for components that have not yet been inspected. Therefore, there is an advantage in that the empty tray T3 can be quickly moved between the disposition area 130*d* of the tray T4 for components that have not yet been inspected and the disposition areas 130*a*, 130*b* of the trays T1, T2 for components that have already been inspected, and the disposition area 130*c* of the empty tray T3. Such a movement of the tray T3 is achieved using the X-direction tray transfer mechanism 170.

If there is no problem in that the electronic components D may drop from the components transfer mechanism 160, in the dispositions shown in FIG. 6, the disposition of the tray T4 for components that have not yet been inspected and the disposition of the trays T1, T2 for components that have already been inspected may also be switched. Even in either case, the distance by which the electronic components D are transferred remains unchanged, thereby keeping the speed of inspections at the same level.

With respect to the two trays T1, T2 for components that have already been inspected, which of them should be disposed in the tray T1 for up-to-standard components or the tray T2 for below-standard components, in other words, which of the trays T1, T2 should be disposed on the side of the inspection area 150, may be determined according to the yield of an inspection.

Generally, such a yield is about 50% or higher, and thus, if the tray T1 for up-to-standard components is placed closer to the inspection area 150 than the tray T2 for below-standard components, the speed of inspections can be increased.

In contrast, if the yield is lower than about 50%, the tray T2 for below-standard components should be placed closer to the inspection area 150 than the tray T1 for up-to-standard components. This is advantageous to make the speed of inspections higher.

According to such a yield, the number of the required trays T1 for up-to-standard components is different from that of the required trays T2 for below-standard components. Usually, the yield is about 50% or higher, and consequently, the number of the trays T1 for up-to-standard components becomes larger.

The tray T1 to T4 of each tray disposition area 130*a* to 130*d* is moved independently of each other in the Y-axis direction, by the Y-direction tray transfer mechanism 180 (described later). Therefore, even if the components transfer mechanism 160 is not moved (i.e., if it is given little or no movement) in the Y-axis direction, the electronic components D can be attached and detached at a desirable place inside of the trays T1 to T4. In other words, all the electronic components D that are stored in the tray T can be inspected, and the already-inspected electronic components D can be stored in all the storage places of the tray T. Hence, the whole tray T can be used efficiently, thus reducing the number of the trays T that are provided based on the number of the electronic components D.

Furthermore, the movement of the electronic components D by the components transfer mechanism 160 and the movement of the tray T by the Y-direction tray transfer mechanism 180 can be performed at the same time. This makes the speed of inspections higher and makes an inspection process more efficient.

The tray T is also moved when all the electronic components D have been transferred from the tray for not-yet-inspected components, and when the already-inspected electronic components D have filled the tray for already-inspected components. In other words, the tray T4 for not-yet-inspected components that has become empty is moved to the tray disposition area 130c of the empty tray T3. Then, by the Y-direction tray transfer mechanism 180, the tray T1 (or the tray T2) for already-inspected components, which is full of the electronic components D, is sent out to the stocker disposition area 140 (described later).

Thereafter, the empty tray T3 on the tray disposition area 130c is moved to the tray disposition area 130a (or 130b) for already-inspected components. This movement is made by the X-direction tray transfer mechanism 170, but it may also be conducted using a suction head 165 (described later). In such a case, the suction head 165 transfers the electronic component D and also transfers the tray T. This reduces production costs for the apparatus (i.e., it makes it possible to omit the X-direction tray transfer mechanism 170).

FIG. 5 shows the relationship between the tray disposition area 130 and the stocker disposition area 140 (described later). As shown in this figure, the stocker disposition area 140 is disposed along the X-axis robot 120b, and it is divided into the four stocker disposition areas 140a to 140d which correspond to the above-described tray disposition areas 130a to 130d.

In each stocker disposition area 140a to 140d, stocker disposition areas 141a to 141d are disposed and can store the trays T, which are piled. Specifically, four openings are formed along the X-axis robot 120b on the base stand 110, and in these openings, the stocker disposition areas 141a to 141d are each disposed so as to be attached and detached.

Among these stockers 141 (or the stockers 141a to 141d), the stockers 141a, 141b are stockers for already-inspected components (e.g., for up-to-standard components and for below-standard components, respectively) which store the trays T1, T2, respectively. The stocker 141c is an empty-tray storage stocker that stores the tray T3. The stocker 141d is a stocker for not-yet-inspected components that stores the tray T4.

As described already, the stocker disposition area 140 is divided into the stocker disposition areas 140a, 140b for already-inspected components trays, the stocker disposition area 140c for empty trays, and the stocker disposition area 140d for not-yet-inspected components trays. The stockers 141a to 141d are each disposed in these division areas. The division areas correspond to the tray disposition areas 130a to 130d, respectively.

In this way, each stocker 141 stores a predetermined tray T so that it corresponds to the division areas of the tray disposition area 130. Thus, the tray T can be efficiently transferred between the stocker 141 and the tray disposition area 130. According to this preferred embodiment, the above-described stockers 141a to 141d, which are disposed in the stocker disposition area 140, each defines the container storage portion according to various preferred embodiments of the present invention.

Figure 7:
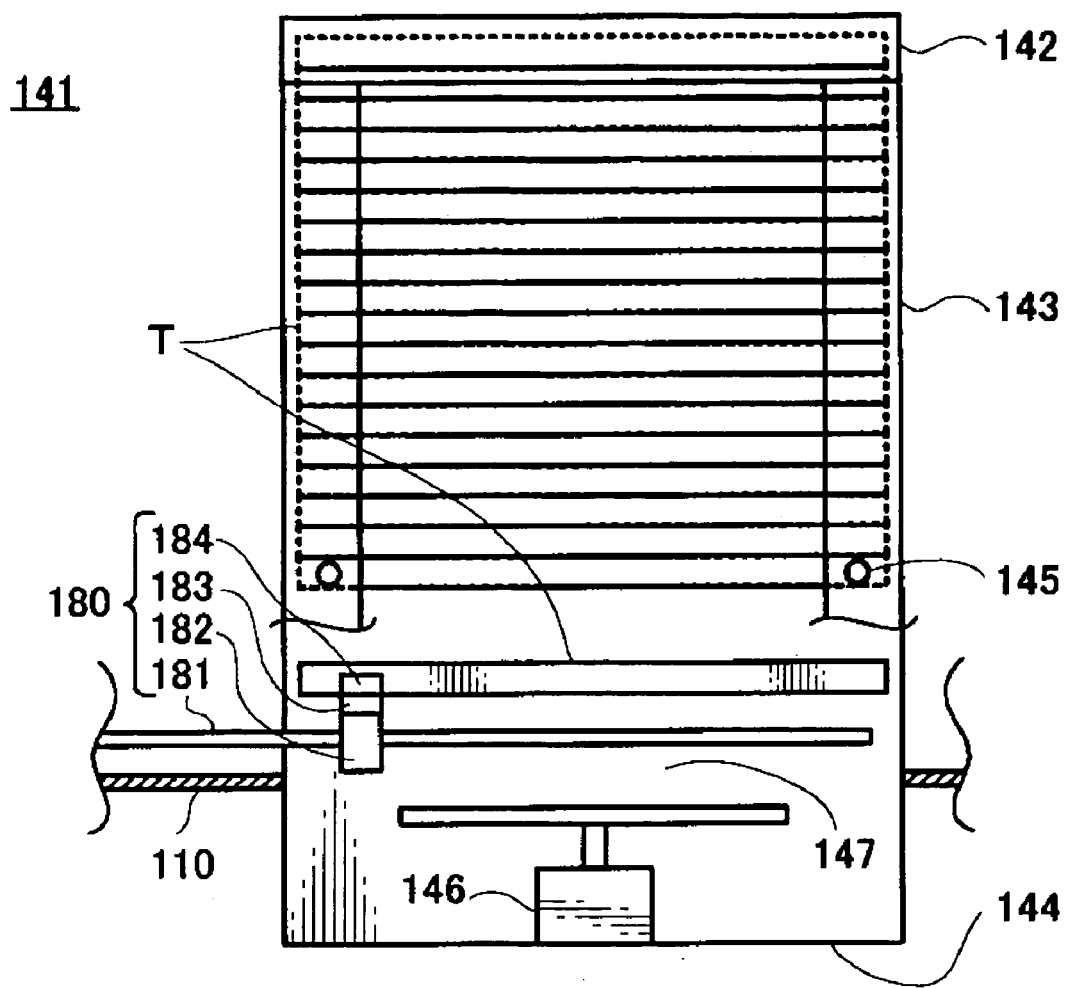
FIG. 7 is an enlarged side view of a stocker.
Figure 8:
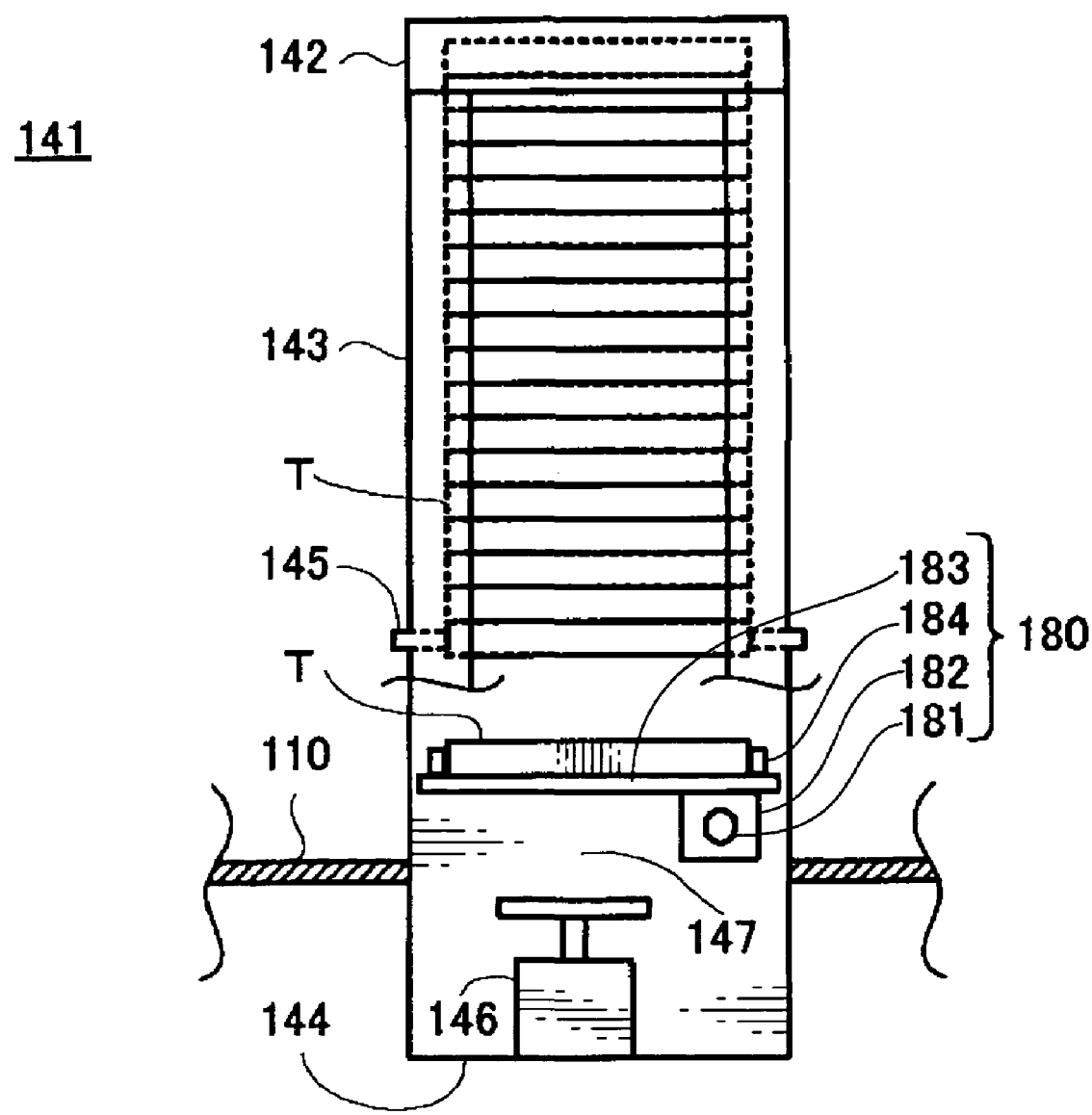
FIG. 8 is an enlarged front view of the stocker.

FIG. 7 and FIG. 8 are a side view and a front view of the stocker 141 (141a to 141d).

With respect to the stockers 141a to 141d, the trays T which they each store have different roles, but the configurations of the trays are the same. Therefore, the stockers 141a to 141d are described below without an alphabetical suffix (which is also applied even in the drawings) except in the case where they should be distinguished.

The stocker 141 preferably includes four struts 143, a bottom portion 144, four tray separation hooks 145, and a tray lift mechanism 146. Inside of it, a tray-transfer-mechanism entry region 147 is formed which the Y-direction tray transfer mechanism 180 (described later) enters. The struts 143, the tray separation hooks 145 and the tray-transfer-mechanism entry region 147 are disposed above the upper surface of the base stand 110. The bottom portion 144 and the tray lift mechanism 146 are disposed below the upper surface of the base stand 110.

The strut 143 is connected to a member which is connected to the base stand 110 and is a pillar which has a substantially L-shape section. It corresponds to each of the four corners of the tray T and prevents the tray T from moving in the two-axis directions of X-Y.

The bottom portion 144 is connected to the struts 143, and preferably includes a bottom plate that preferably has a substantially rectangular shape, and four side plates. The side plates may also be excluded, and in that case, the struts 143 are connected directly to the bottom plate, which is the bottom portion 144.

Herein, the stocker 141 has, at its front wall (i.e., in the figure, right-hand portion), a door that can be opened and closed. Thus, the tray T can be easily inserted into, and carried out from, the stocker 141. A ceiling portion 142 cannot be detached and attached as the ceiling of the stocker 141. However, in the case where the tray T is, from above the stocker 141, inserted into and carried out from the stocker 141, it can be detached and attached.

The tray separation hooks 145 are disposed in the member to which the four struts 143 are connected. The tray separation hooks 145 are disposed on opposite sides relative to each other of the lowermost tray T inside of the stocker 141. Specifically, a concave portion is preferably formed on each opposite side of the tray T, and the tray separation hook 145 is inserted into the concave portion of the tray T. This prevents the lowermost tray T from dropping downward (i.e., in the negative Z direction). A drive mechanism (not shown) is connected to the tray separation hooks 145, and the tray separation hooks 145 are inserted into the concave portions on the sides of the tray T and are removed from them. Through the insertion and removal, the tray T is fixed and removed in the negative Z direction.

The tray lift mechanism 146 moves a flat plate (or a tray placement plate), which the tray T is placed on, up and down. The tray lift mechanism 146 lifts and lowers the tray T in the stocker 141.

The tray lift mechanism 146 can move up and down the tray placement plate, in a state where the Y-direction tray transfer mechanism 180 in which the tray T is not placed is located inside of the tray-transfer-mechanism entry region 147. In addition, the Y-direction tray transfer mechanism 180 has, on its tray side, a portion which is cut off into a substantially U-shape. Therefore, while the tray lift mechanism 146 is raising the tray placement plate, the Y-direction tray transfer mechanism 180 in which the tray T is not placed can be moved into the tray-transfer-mechanism entry region 147. Hence, the tray placement plate of the tray lift mechanism 146 can be lifted ahead, thereby shortening the time necessary for carrying the tray T out from the stocker 141.

The tray-transfer-mechanism entry region 147 is a space that preferably has a substantially rectangular parallelepiped shape. The tray-transfer-mechanism entry region 147 is located above the upper surface of the base stand 110 and below the tray separation hooks 145. The Y-direction tray transfer mechanism 180 moves into the tray-transfer-mechanism entry region 147 and moves out of the tray-transfer-mechanism entry region 147, from the positive Y-axis direction.

Figure 9A:
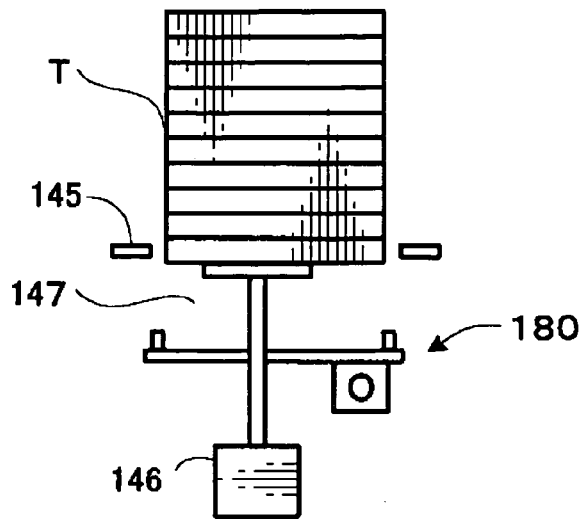
FIGS. 9A-9C are representations showing movement of the tray T in the stocker.

The movement of the tray T from the inside of the stocker 141 to the tray disposition area 130 is achieved with the following process. Herein, an operation for the movement of the tray T inside of the stocker 141 is described with reference to FIGS. 9A-9C.

(1) The tray lift mechanism 146 operates to lift the tray placement plate. Then, if the tray placement plate comes into contact with the bottom surface of the lowermost tray Tin the stocker 141, the tray separation hooks 145 are removed (i.e., the tray separation hooks 145 are removed from the inside of the concave portions on the sides of the tray T) (see FIG. 9A).

(2) The tray lift mechanism 146 operates to move down the tray placement plate by a height of one tray T. Then, the second tray from the bottom is set to a height position that corresponds to the tray separation hooks 145.

Figure 9B:
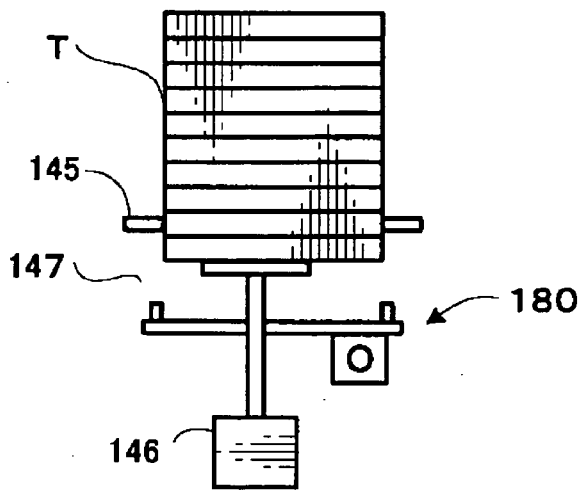

(3) The tray separation hooks 145 operate to fix the second tray T from the bottom (i.e., the tray separation hooks 145 are inserted into the concave portions on the sides of the second tray T from the bottom) (see FIG. 9B).

(4) The tray lift mechanism 146 operates to move down the lowermost tray T together with the tray placement plate. At this time, the second tray T from the bottom is fixed to the tray separation hooks 145.

(5) The tray placement plate moves down further so that the lowermost tray T comes to a height position that corresponds to the tray-transfer-mechanism entry region 147. At this time, in advance, the Y-direction tray transfer mechanism 180 moves into the tray-transfer-mechanism entry region 147 and stays there.

Figure 9C:
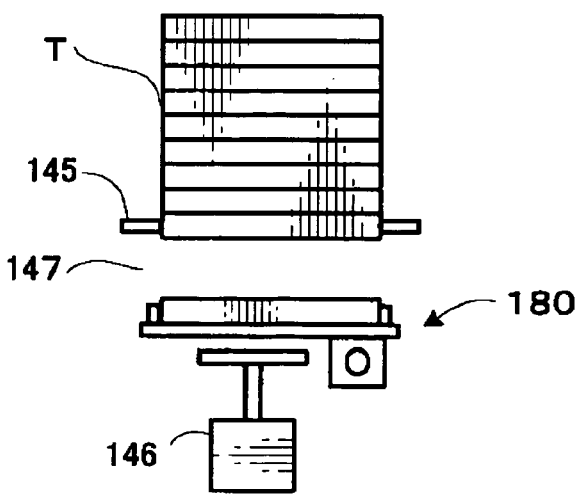

As a result, the tray T on the tray lift mechanism 146 descends onto the Y-direction tray transfer mechanism 180 inside of the tray-transfer-mechanism entry region 147, and is placed there (see FIG. 9C).

The tray T which has been placed on the Y-direction tray transfer mechanism 180 remains and is held on the Y-direction tray transfer mechanism 180, even if the tray placement plate moves down further. In this way, the tray T placed on the tray lift mechanism 146 is transferred to the Y-direction tray transfer mechanism 180.

(6) The Y-direction tray transfer mechanism 180 retreats from the tray-transfer-mechanism entry region 147, and thus, the tray T which is placed on the Y-direction tray transfer mechanism 180 is carried out from the stocker 141 and is place in the tray disposition area 130.

The movement and placement of the tray T from the tray disposition area 130 to the stocker 141 are achieved in the following way.

(1) In the state where the tray T is placed on the Y-direction tray transfer mechanism 180, the Y-direction tray transfer mechanism 180 moves into the tray-transfer-mechanism entry region 147 from the tray disposition area 130. Thereby, the tray T is transferred into the stocker 141 (see FIG. 9C).

(2) The tray lift mechanism 146 operates to move up the tray placement plate. As a result, the tray T that is placed on the Y-direction tray transfer mechanism 180 is transferred to the tray lift mechanism 146 (i.e., the tray placement plate).

The tray placement plate of the tray lift mechanism 146 ascends further, and the placed tray T is moved up to a height position in which it comes into contact with the bottom surface of the lowermost tray T inside of the stocker 141 (see FIG. 9B).

(3) In the state where the tray T stays in contact by the tray lift mechanism 146, the tray separation hooks 145 are removed (i.e., the tray separation hooks 145 are removed from the inside of the concave portions on the sides of the tray T).

(4) The tray lift mechanism 146 operates to move up the tray placement plate by the height of one tray T. Then, the tray T that is placed on the tray lift mechanism 146 is brought to a height position that corresponds to the tray separation hooks 145 (see FIG. 9A).

(5) The tray separation hooks 145 operate to fix the tray T that is placed on the tray lift mechanism 146.

In this way, the tray T on the tray disposition area 130 is stored and fixed in the lowermost portion inside of the stocker 141.

(6) Thereafter, the tray placement plate of the tray lift mechanism 146 descends. At this time, the lowermost tray T of the stocker 141 is fixed to the tray separation hooks 145. Thus, even if the tray placement plate moves down, the tray T remains held inside of the stocker 141. The tray placement plate of the tray lift mechanism 146 moves down below the tray-transfer-mechanism entry region 147.

In the manner described above, the tray T on the tray disposition area 130 is stored and fixed in the lowermost portion inside of the stocker 141.

Hence, the stockers 141*a* to 141*d* store the trays T such that they are piled on top of one another, thus making it easier to exchange the tray T. In other words, the trays T are piled up above the tray-transfer-mechanism entry region 147, and thereby, the lowermost tray T of the stocker 141 is easily transferred to, and carried out from, the tray-transfer-mechanism entry region 147. Besides, the distance between the tray-transfer-mechanism entry region 147 and the tray disposition area 130 is the same in any of the stockers 141. Thus, the time during which the tray T is transferred between them is uniform, thereby helping make the speed of inspections higher.

The inspection area 150 is located between X-axis robots 120*a*, 120*b*, and is preferably a substantially rectangular area which is set on the line along which the tray disposition area 130 extends in the X-axis direction. Below it, the electronic component inspection unit 200 is disposed.

Figure 10:
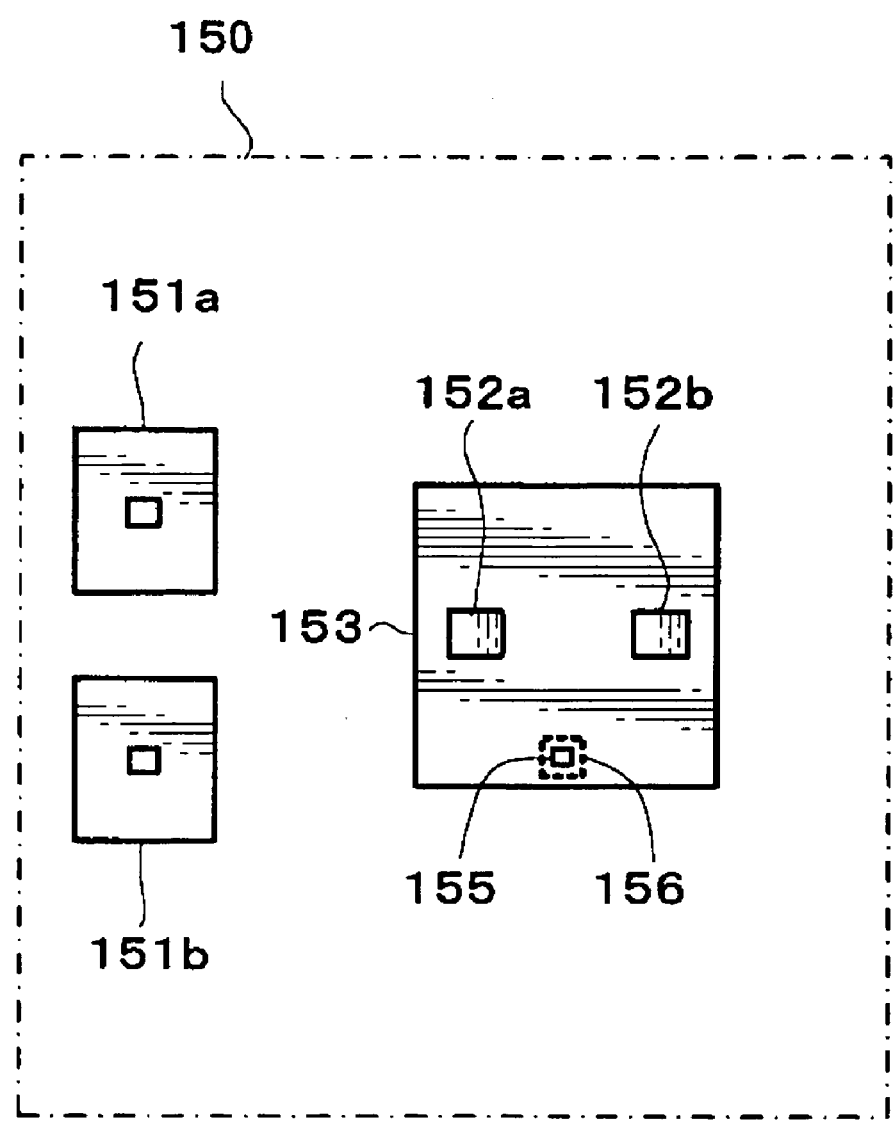
FIG. 10 is an enlarged top sectional view of an inspection area.
Figure 11:
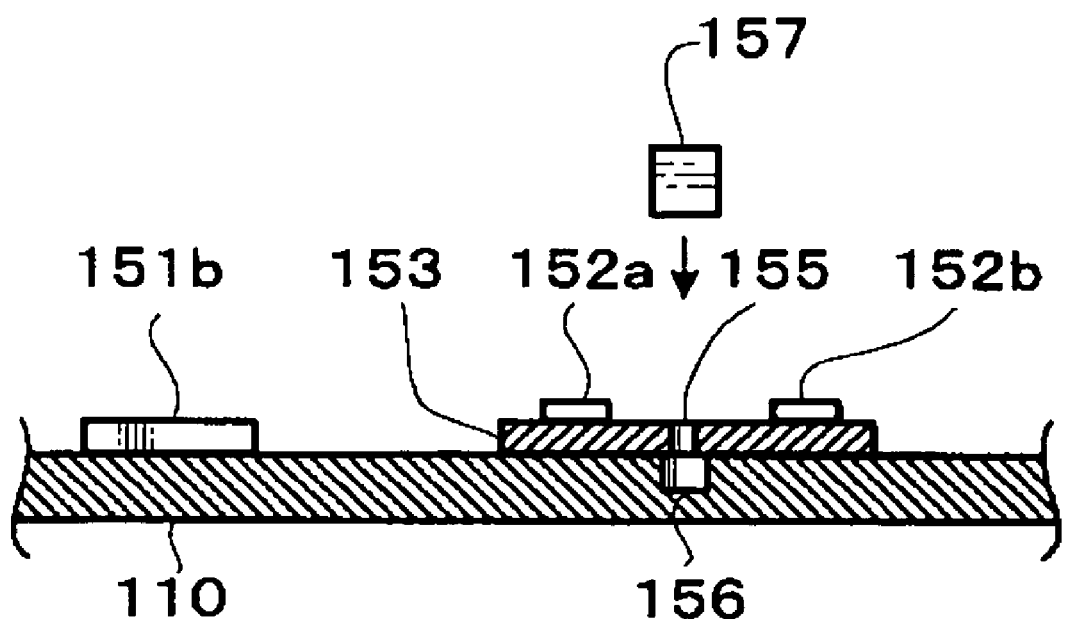
FIG. 11 is an enlarged sectional view of the inspection area.

FIG. 10 and FIG. 11 are a top view and a sectional view of the inspection area 150, respectively. As shown in these figures, in the inspection area 150, there are disposed two component position confirmation cameras 151*a*, 151*b* that define the image capturing device according to various preferred embodiments of the present invention, and the two inspection sockets 152*a*, 152*b* that are the inspection portion according to various preferred embodiments of the present invention. The component position confirmation cameras 151*a*, 151*b* are placed on the base stand 110. The inspection sockets 152*a*, 152*b* are placed on the inspection plate 153, and via the inspection plate 153, are set to the base stand 110 so that they can be attached and detached. These component position confirmation cameras 151*a*, 151*b* and inspection sockets 152*a*, 152*b* are each described below without an alphabetical suffix (which is also applied even in the drawings) except in the case where they should be distinguished.

The component position confirmation cameras 151*a*, 151*b* are preferably image capturing cameras which are used to confirm the position (i.e., the holding state) of the electronic components D which are transferred by the components transfer mechanism 160. The component position confirmation cameras 151*a*, 151*b* are preferably defined by a line sensor, a CCD camera, a vision camera or other suitable device. The configuration of the component position confirmation cameras 151*a*, 151*b* is not limited especially, as long as two-dimensional image information (or in some cases, in one-dimensional image information) of the electronic components D can be obtained.

The component position confirmation cameras 151*a*, 151*b* are preferably arranged along the Y-axis direction on the inspection area 150 and in line symmetrically with respect to the Y-axis direction. The component position confirmation cameras 151*a*, 151*b* each capture the image of the electronic components D that pass over them. The captured image is processed, and thus, the position of the electronic components D with respect to the components transfer mechanism 160 is detected. As a result, when the electronic components D are suctioned and picked up at the components transfer mechanism 160, the positional shift (in the X, Y and R-axis directions) of the electronic components D is detected. Thus, when the electronic components D are connected to the inspection socket 152, the position of the electronic component D is corrected, thereby making such a connection more certain. In other words, the electrodes of the electronic components D can be more reliably and accurately be brought into contact with, and connected to, the electrodes of the inspection socket 152.

The component position confirmation cameras 151a, 151b can also be used to inspect the outside appearance of the electronic components D. In the same way as the case where the position of the electronic components D is confirmed, the inspection is performed when the components transfer mechanism 160 that has suctioned and picked up the electronic component D passes over the component position confirmation cameras 151a, 151b. In this way, the electronic component inspection apparatus 1A can inspect not only the electronic components D electrically, but can also easily inspect the outside appearance of the components. Besides, if a code is shown on the surface of the electronic component D, such a code can be read using the component position confirmation cameras 151a, 151b. This makes it possible to judge the component types from the electronic components D themselves (i.e., it makes an inspection multifunctional).

The inspection sockets 152a, 152b are preferably electrically connected to both the electronic components D and the electronic component inspection unit 200. Thus, it is an electric connection member that allows the electronic component inspection unit 200 to inspect the electronic components D electrically.

The inspection sockets 152a, 152b are arranged in line in the X direction with respect to the Y-axis direction along the inspection area 150. The inspection plate 153 is a substantially flat plate which the inspection sockets 152a, 152b are connected to, and it can be attached to and detached from the base stand 110.

In the inspection area 150, the disposition of the component position confirmation camera 151 and the inspection socket 152 will be described in detail.

According to this preferred embodiment, the number of the component position confirmation cameras 151 and the inspection sockets 152 is preferably two, respectively, and the inspection sockets 152 are arranged in the Y-axis direction. However, the number and disposition of the component position confirmation cameras 151 and the inspection sockets 152 can also be changed.

Figure 12A:
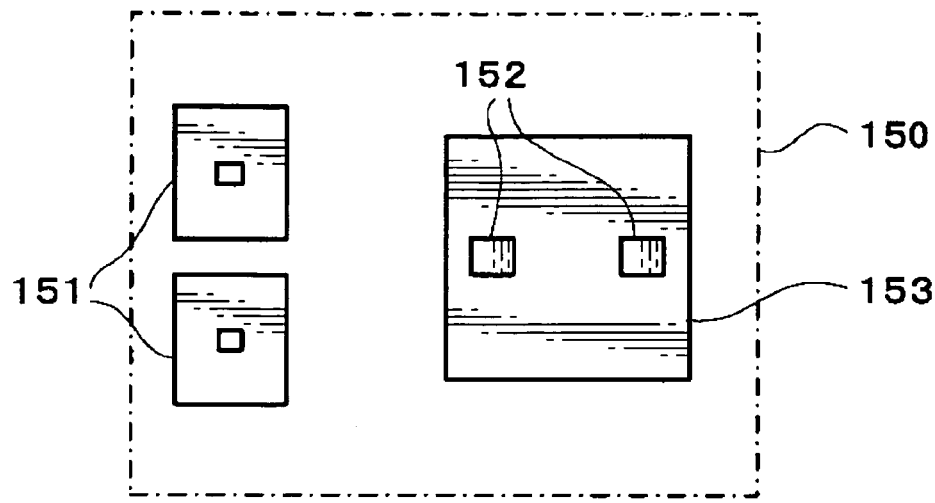
FIGS. 12A-12C are top views of a component position confirmation camera and an inspection socket, showing examples of their disposition.
Figure 12B:
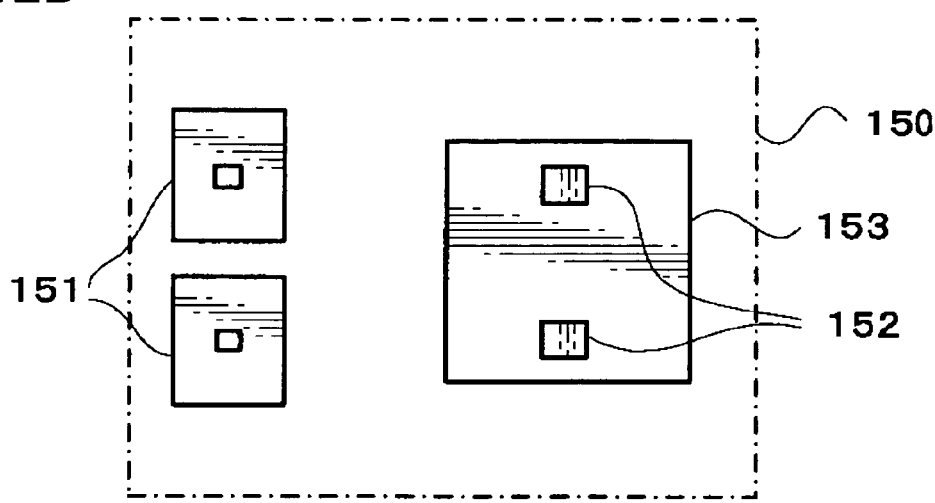
Figure 12C:
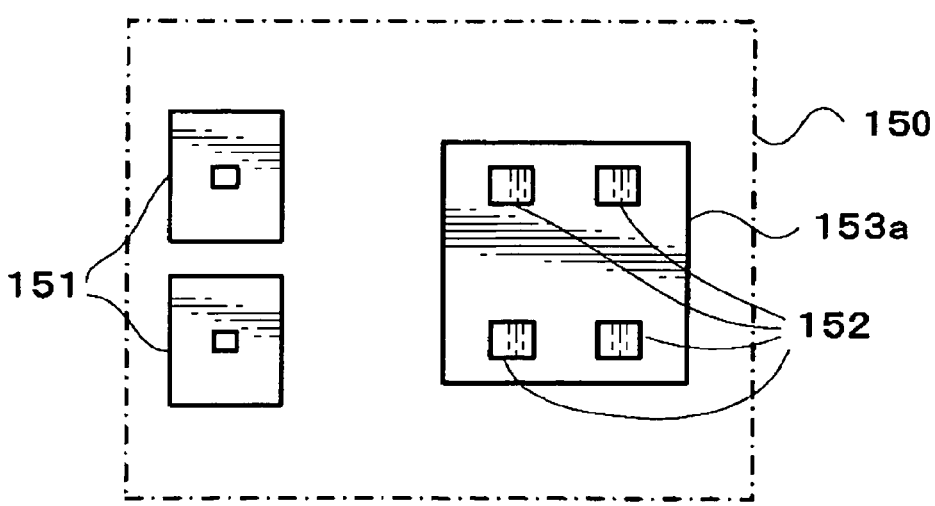
Figure 13A:
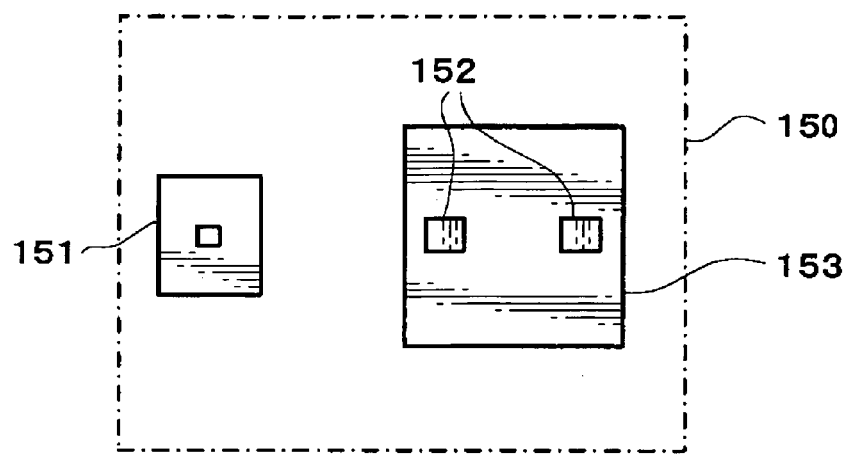
FIGS. 13A-13C are top views of the component position confirmation camera and the inspection socket, showing examples of their disposition.
Figure 13B:
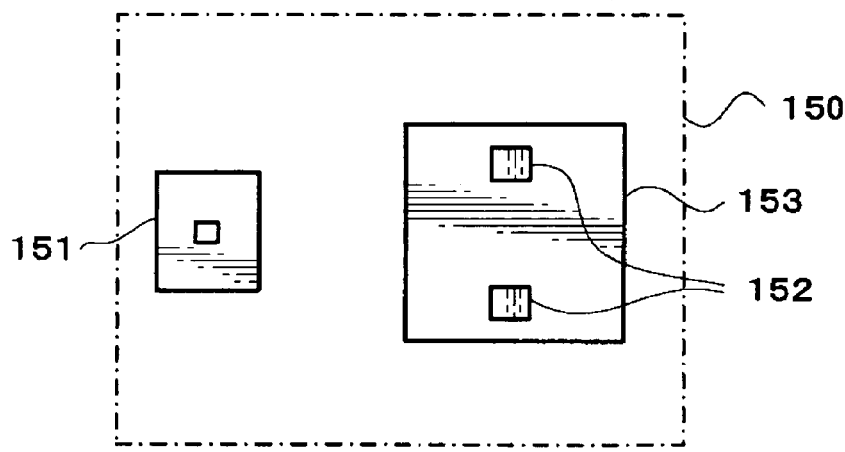
Figure 13C:
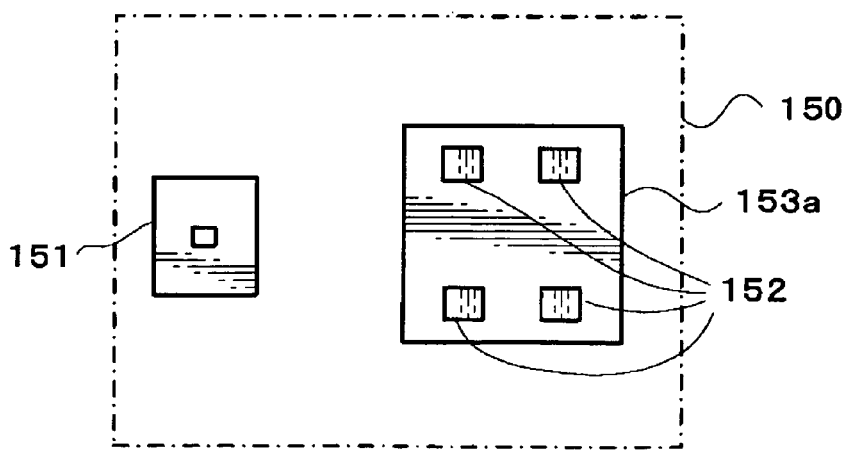

FIGS. 12A-12C and FIGS. 13A-C are top views of the component position confirmation camera 151 and the inspection socket 152, typically showing an example of their disposition. FIGS. 12A-12C show the case where the number of the component position confirmation cameras 151 is two, and FIGS. 13A-13C show the case where the number of the component position confirmation cameras 151 is one.

As shown in FIGS. 12A-12C and FIGS. 13A-13C, in examples of the disposition of the component position confirmation camera 151 and the inspection socket 152, the number of the component position confirmation cameras 151 is one or two, and the number of the inspection sockets 152 is two or four. Among these combinations, FIG. 12A corresponds to the disposition according to the preferred embodiment shown in FIG. 10.

The greater the number of inspection sockets 152 used, the more easily a larger number of the electronic components D can be inspected at the same time and in parallel. Besides, if a plurality of the component position confirmation cameras 151 is provided, the position of several such electronic components D can be confirmed simultaneously.

It is preferable that the number and disposition of cameras 151 be suitably selected according to the number or disposition of the components transfer mechanisms 160. According to this preferred embodiment, the inspection sockets 152 are disposed in the direction that extends in the X-axis direction in a substantially middle of the tray T. This makes it possible to shorten the distance by which the components transfer mechanism 160 moves in the Y-axis direction.

The direction in which the inspection plate 153 is attached to the base stand 110 is kept fixed. The attachment types of two types of the inspection plates 153 in FIGS. 12A and 12B and FIGS. 13A and 13B are supposed to be recognized using an inspection-position confirmation camera 154 (described later), or inputted in the control portion 190 using an input unit (not shown).

As shown in FIGS. 12A and 12B and in FIGS. 13A and 13B, the direction in which the inspection plate 153 is attached may also be changed. In that case, the direction in which the inspection sockets 152 are arranged in line is changed from the X-axis direction to the Y-axis direction.

The direction in which the inspection sockets 152a, 152b are attached can be detected (i.e., the direction in which the inspection plate 153 is attached can be detected) by recognizing their images using the inspection-position confirmation camera 154, or by inputting data. However, according to this preferred embodiment, as shown in FIG. 10 and FIG. 11, the attachment direction is detected by forming an opening portion 155 in the inspection plate 153 and forming, in the base stand 110, an opening detection portion 156 which corresponds to the opening portion 155. In other words, the opening portion 155 is detected by the opening detection portion 156, and based on whether it is detected or not, the direction in which the inspection plate 153 is attached can be detected.

As the opening detection portion 156, for example, an optical sensor can be used. Specifically, for example, as shown in FIG. 11, above the opening detection portion 156, a light emitting portion 157 is provided. Based upon whether or not the light that is emitted from the light emitting portion 157 and transmitted toward the opening detection portion 156 is shielded by the inspection plate 153, the direction in which the inspection plate 153 is attached can be detected.

In addition, the opening detection portion 156 may also be configured by a limit switch. In that case, the opening portion 155 can be detected using the switching ON or OFF of the limit switch. If the opening portion 155 is located on the limit switch, the limit switch is turned OFF. If the opening portion 155 does not come onto the limit switch, the limit switch is pressed by the inspection plate 153, and it is turned ON. At this time, there is no need to configure the opening portion 155 as a hole that penetrates the inspection plate 153. It is sufficient that the opening portion 155 is a concave portion into which the tip of the limit switch can be inserted.

The components transfer mechanism 160 (160a to 160d) is used to pick up and transfer the electronic components D. The components transfer mechanisms 160a, 160b are placed in the x-axis robot 120a, and the components transfer mechanisms 160c, 160d are placed in the X-axis robot 120b. In this way, the components transfer mechanisms 160a, 160b and the components transfer mechanisms 160c, 160d are placed in the different X-axis robots 120*a*, 120*b*, respectively. As a result, the electronic components D can be transferred independently of each other in the X-axis direction, thus increasing the efficiency of inspections of the electronic components D.

Figure 14:
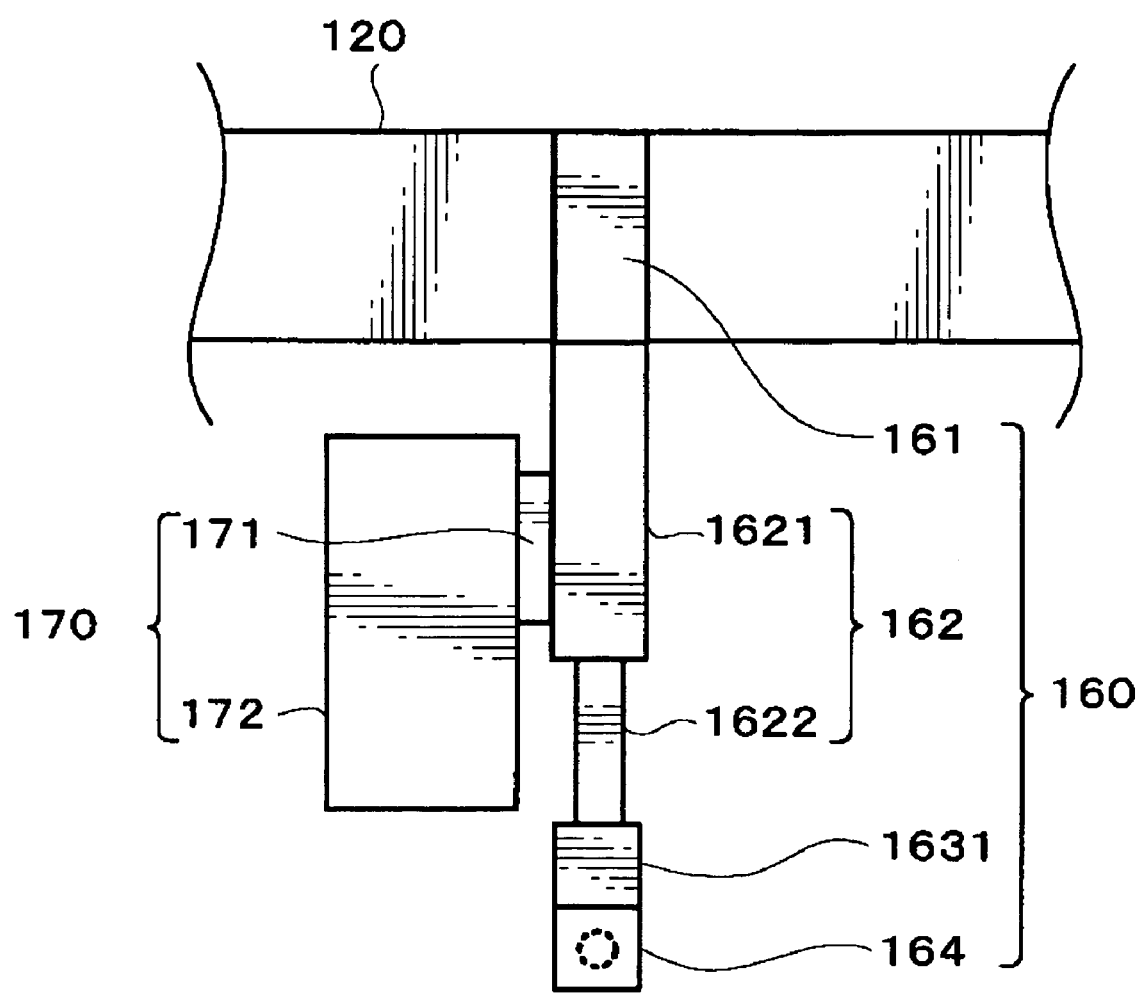
FIG. 14 is an enlarged top view of a components transfer mechanism.
Figure 15:
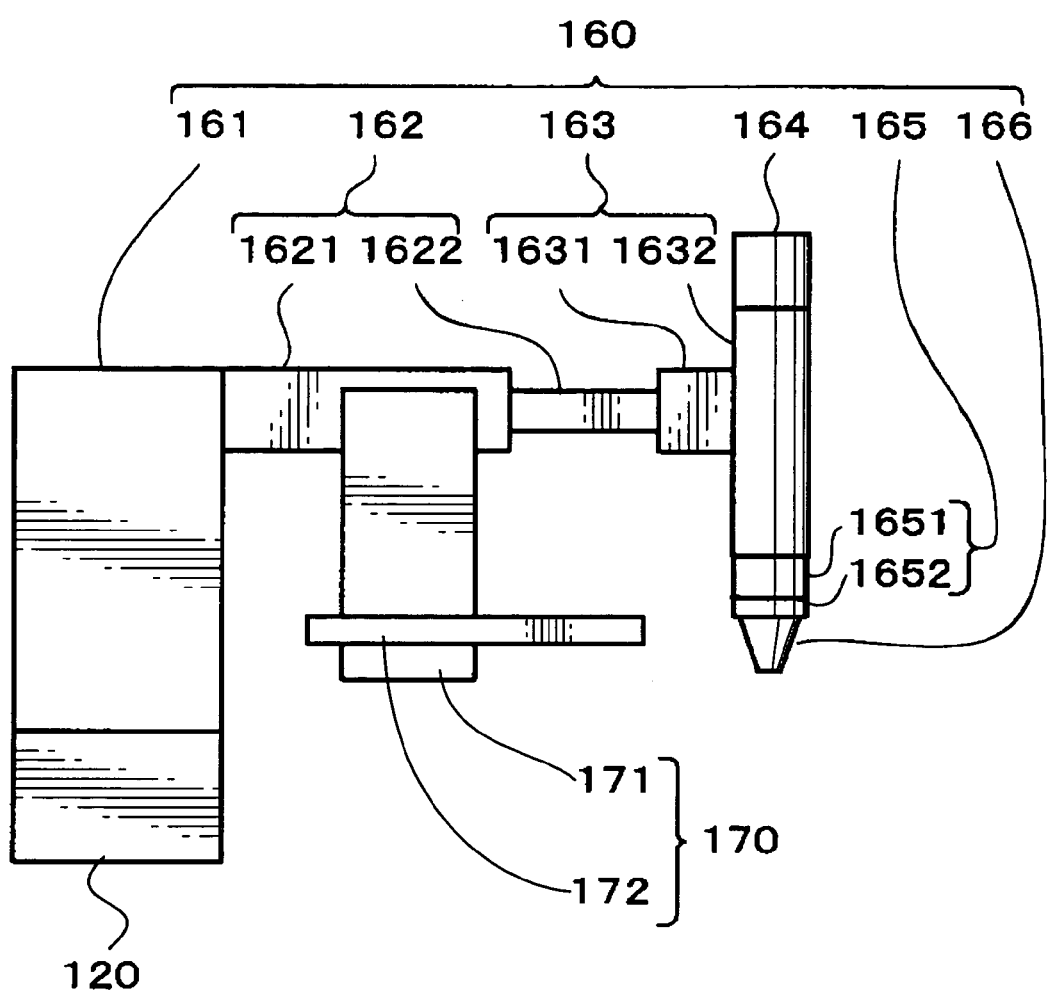
FIG. 15 is an enlarged side view of a components transfer mechanism.

FIG. 14 and FIG. 15 are an enlarged top view and side view of the components transfer mechanism 160, respectively. As shown in these figures, each components transfer mechanism 160 preferably includes an X-direction drive portion 161, a Y-direction drive portion 162, a Z-direction drive portion 163, an R-direction drive portion 164, the suction head 165, and a suction nozzle 166.

Among the four components transfer mechanisms 160*a* to 160*d*, in the components transfer mechanisms 160*a*, 160*c* on the side of the tray disposition area 130, the X-direction tray transfer mechanisms 170*a*, 170*b* are provided, respectively. The inspection-position confirmation camera 154 is connected to a suction head 165*b* of the components transfer mechanism 160*b* on its opposite side.

The X-direction drive portion 161 moves in the X-axis direction on the X-axis robot 120, thereby allowing the suction head 165 to move in the X-axis direction.

The Y-direction drive portion 162 is connected to the X-direction drive portion 161, and preferably includes by a Y-direction drive base body 1621 and a Y-direction drive body 1622.

The Y-direction drive body 1622 is expanded and contracted in the Y-axis direction with respect to the Y-direction drive base body 1621, so that the suction head 165 can be moved in the Y-axis direction. If the components transfer mechanisms 160*a*, 160*b* come close to the components transfer mechanisms 160*c*, 160*d* in the X-axis direction, then the Y-direction drive portion 162 allows the suction head 165 to move in the Y-axis direction. As a result, the components transfer mechanisms 160*a*-160*d* can be prevented from interfering (or coming into contact) with each other.

The Z-direction drive portion 163 is connected to an end portion of the Y-direction drive body 1622, and preferably includes a Z-direction drive base body 1631 and a Z-direction drive body 1632. The Z-direction drive body 1632 is moved up and down in the Z direction with respect to the Z-direction drive base body 1631, so that the suction head 165 can be moved in the Z direction.

Such an up-and-down movement in the Z direction can also be made, like the Y-direction drive portion 162, using a ball screw, ball nut mechanism, or a drive body such as a hydraulic cylinder mechanism and a linear motor mechanism. Conversely, in the Y-direction drive portion 162, like the Z-direction drive portion 163, based upon a shift in movement between members, the suction head 165 can be moved in the Y-axis direction.

The R-direction drive portion 164 is connected to an upper end of the Z-direction drive body 1632, and is used to allow the suction head 165 to rotate (i.e., rotate in the R direction, or rotate in the right and left directions on the X-Y plane) along the Z axis.

The suction head 165 preferably includes a head body 1651, and a suction-nozzle support member 1652. The head body 1651 is connected to the lower end of the Z-direction drive body 1632. The head body 1651 can be moved independently in the X-axis, Y-axis and Z directions by the X-direction drive portion 161, the Y-direction drive portion 162 and the Z-direction drive portion 163, respectively.

The suction-nozzle support member 1652 is connected to a lower end of the head body 1651, and supports the suction nozzle 166. The suction-nozzle support member 1652 rotates with respect to the head body 1651, using the R-direction drive portion 164.

At the time of these movements, the X-direction drive portion 161, the distances by which the Y-direction drive portion 162, the Z-direction drive portion 163 and the R-direction drive portion 164 are moved are detected, using an encoder and the like. Then, feedback to the control portion 190 is executed, thus making the control of the various drive portions 161-164 more precise and accurate.

The suction nozzle 166 is connected to the suction head 165 so that it can be attached and detached. Inside of its tip, a negative or positive air pressure is produced using a suction mechanism (not shown). As a result, the suction nozzle 166 can apply suction or a vacuum to pick up and hold an electronic component D, and can release the suction or vacuum to release the electronic component D. The suction head 165 may also be replaced and changed according to the shape of the electronic component D.

The suction nozzle 166 is connected to the suction head 165, and thus, it moves in the X, Y and Z directions and rotates on the R axis, along with each movement of the X-direction drive portion 161, the distance by which the Y-direction drive portion 162, the Z-direction drive portion 163 and the R-direction drive portion 164.

The inspection-position confirmation camera 154 is preferably located on the side of the suction head 165*b*. In the case where there is an identification code on the inspection socket 152, the tray T and the inspection plate 153, the inspection-position confirmation camera 154 can obtain the image of this identification code from above. The inspection-position confirmation camera 154 is preferably configured by a line sensor, a CCD camera, a vision camera or other suitable device. The inspection-position confirmation camera 154 configuration is not limited especially, as long as two-dimensional image information (or in some cases, one-dimensional image information) of the electronic components D can be obtained. The image captured by the inspection-position confirmation camera 154 is processed, and thus, the position of the inspection socket 152 or the tray T, and the identification code, are detected.

The inspection-position confirmation camera 154 can placed in each of the components transfer mechanisms 160*a* to 160*d*. In this case, the position of the electronic components D that have not yet been inspected on the tray T can be confirmed, using the inspection-position confirmation camera 154. Then, based on the confirmed position, the position of the suction nozzle 166 can be corrected. According to this configuration, when the electronic components D are suctioned, a shift in the position (i.e., in the X, Y and Z directions) of the electronic components D with respect to the suction nozzle 166 is kept down. As a result, when the electronic components D are suctioned by the suction nozzle 166, the suction quality can be prevented from deteriorating, thus increasing the efficiency of inspections.

Furthermore, the position of the inspection socket 152 is confirmed, and when the electronic components D are connected (or attached) to the inspection socket 152, the position of the electronic components D can be corrected. As a result, when the electronic components D are attached to the inspection socket 152, the attachment quality can be prevented from deteriorating, thus making an inspection more accurate and reliable.

As shown in FIG. 14 and FIG. 15, the X-direction tray transfer mechanism 170 (170*a*, 170*b*) preferably includes a Z-direction tray drive portion 171, and a tray suction portion 172.

The Z-direction tray drive portion 171 is connected to the Y-direction drive base body 1621. The Z-direction tray drive portion can be moved in the X-axis direction by the X-direction drive portion 161, and moves the tray suction portion 172 up and down.

The tray suction portion 172 is preferably a flat plate that can be moved in the X and Z directions by the X-direction drive portion 161 and the Z-direction tray drive portion 171. Along a lower surface of the tray suction portion 172, there are formed one or several suction holes (not shown). The tray suction portion 172 is connected to a suction mechanism (not shown). The tray suction portion 172 applies a vacuum via the suction hole and stops the vacuum, so that the tray T can be suctioned/picked up and released. The suctioning/picking up and releasing of the tray T by the tray suction portion 172 and the suctioning/picking up and releasing of the electronic components D by the suction nozzle 166 can be conducted independently of each other.

Using the X-direction tray transfer mechanism 170, the tray T on the tray disposition area 130 can be transferred. This transfer is conducted as described below.

(1) The X-direction drive portion 161 moves the tray suction portion 172 in the X-axis direction and moves it above the tray T to be transferred.

(2) The Z-direction tray drive portion 171 moves the tray suction portion 172 down, and allows its lower surface to come into contact with, or come close to, the upper surface of the tray T to be transferred.

(3) The tray suction portion 172 is operated so that the tray suction portion 172 suctions the tray T.

(4) The Z-direction tray drive portion 171 moves the tray suction portion 172 up. The tray T that has been suctioned by the tray suction portion 172 moves up together with the tray suction portion 172.

(5) The X-direction drive portion 161 moves the tray suction portion 172 that has suctioned the tray T onto a transfer target position in the X-axis direction.

(6) The Z-direction tray drive portion 171 moves the tray suction portion 172 that has suctioned the tray T down, and allows the lower surface of the tray T to come into contact with, or come close to, the tray disposition area 130.

(7) The suction or vacuum applied to the tray T by the tray suction portion 172 is released, and the Z-direction tray drive portion 171 moves the tray suction portion 172 up. As a result, the tray T that has been released from the tray suction portion 172 remains at the place up to which it has been transferred.

This transfer of the tray T in the X-axis direction is used, for example, in the case where, when the electronic components D are carried out from the tray T4 for components that have not yet been inspected and then the tray becomes empty, this empty tray is transferred to the position of the tray T3 (i.e., the tray disposition area 130*c*).

In addition, it is used in the case where, when the electronic components D that have already been inspected fills the trays T1, T2 for components that have already been inspected, instead of these trays T1, T2, the empty tray T3 is transferred to the position of the trays T1, T2 (i.e., the tray disposition areas 130*a*, 130*b*) as a new tray for already-inspected components. The trays T1, T2 for already-inspected components that are full of the already-inspected electronic components D are transferred to the inside of the stocker 141 by the Y-direction tray. transfer mechanism 180.

The Y-direction tray transfer mechanism 180 (180*a* to 180*d*) is a mechanism that transfers the tray T in the Y-axis direction between the trays T1 to T4 and the stockers 141*a* to 141*d*. As shown in FIG. 7 and FIG. 8, the Y-direction tray transfer mechanism preferably includes a shaft 181, a movement portion 182, a tray placement portion 183, and a pair of tray fixing portions 184.

The shaft 181 is preferably a ball screw that is a substantially cylindrical pole with a screw thread. The shaft is arranged to extend along the direction from the tray disposition area 130 to the stocker disposition area 140 (specifically, the tray-transfer-mechanism entry region 147 inside of the stocker 141). The shaft 181 is connected to a rotation mechanism that preferably includes a servo motor (not shown). When the rotation mechanism operates, the shaft 181 rotates on its axis. When the shaft 181 rotates, the operational quantity of the rotation mechanism is detected, using an encoder or other suitable device. Then, its feedback to the control portion 190 is executed, thus making such control more accurate and reliable.

The movement portion 182 is preferably shaped like a substantially flat plate, and has a ball nut portion. The ball nut portion is penetrated by the shaft 181. When the shaft 181 rotates, the ball screw of the shaft 181 engages with the ball nut of the movement portion 182, and thereby, the movement portion 182 moves forward and backward along the axis of the shaft 181.

The tray placement portion 183 preferably is defined by a substantially rectangular flat plate, and on this plate, the tray T is placed. The tray placement portion 183 is connected, at its lower surface near one of its ends, to a side of the movement portion 182. The tray placement portion 183 moves together with the movement portion 182 along the axis of the shaft 181.

The tray fixing portions 184 are each disposed at the four sides on the upper side of the tray placement portion 183. The tray fixing portions 184 each preferably includes a rod member which has a substantially rectangular section. Among the four-side tray fixing portions 184, at least one of the two sides in the X-axis direction can be moved in the X-axis direction, using a movement unit (not shown). Consequently, the interval of the tray fixing portions 184 in the X-axis direction can be suitably controlled. The tray T on the tray placement portion 183 can be pressed and fixed on both sides.

Furthermore, among the four-side tray fixing portions 184, at least one of the two sides in the Y-axis direction may also be moved in the Y-axis direction, using a movement unit (not shown). In that case, the tray T that is different in size in the Y-axis direction can be transferred.

The Y-direction tray transfer mechanism 180 can be used in the case where the tray T is moved from the stocker 141 to the tray disposition area 130, or vice versa. In addition to this, the Y-direction tray transfer mechanism 180 moves the tray T inside of the tray disposition area 130, thus shortening the distance by which the suction head 165 moves in the Y-axis direction. At this time, each tray T can be moved independently or together as one body.

According to this preferred embodiment, the Y-direction tray transfer mechanism 180 defines the container moving device and container transferring device according to various preferred embodiments of the present invention. In other words, by the Y-direction tray transfer mechanism 180, the container moving device is configured, and in addition, the Y-direction tray transfer mechanism 180 is configured to have the function of the container transferring device according to various preferred embodiments of the present invention.

In the electronic component inspection apparatus 1A, as described above, the Y-direction tray transfer mechanism 180 is provided. As a result, the components transfer mechanism 160 removes or inserts the electronic components D from or into the tray T of the tray disposition area 130, without moving the suction nozzle 166 in the Y-axis direction.

The control portion 190 is disposed in the base stand 110, and preferably includes a CPU 191, an ROM 192, an RAM 193, a communication controller 194, an I/O controller 195, a motion controller 196, an image controller 197, and other suitable elements. The control portion 190 controls the drive of the electronic component transfer unit 100A, and communicates with a control portion (not shown) of the electronic component inspection unit 200.

Based upon software which is stored in the ROM 192 and RAM 193, the control portion 190 controls the drive of the electronic component transfer unit 100A and communicates with the electronic component inspection unit 200, through the communication controller 194, I/O controller 195, motion controller 196 and image controller 197. The software causes the transfers of the electronic components D and the tray T, according to a combination of the electronic components D to be inspected and the inspection socket 152, and a signal from the electronic component inspection unit 200. The electronic component inspection unit 200 conducts an inspection based on the software of inspection contents that correspond to the electronic components D. According to this preferred embodiment, the CPU 191 functions as the controlling device that controls the drive of the components transferring device, and as the collision-prevention controlling device.

Each of the ROM 192 and RAM 193 is preferably a storage device that stores fixed and temporary information. The ROM 192 and RAM 192 store, for example, software which represents an operational process and contents of the electronic component transfer unit 100A, information which represents a situation of the electronic component transfer unit 100A, and other suitable information and software. This information includes information on components suction at the time when the suction head 165 has suctioned the electronic components D on the tray T, information on components attachment at the time when the electronic component D have been attached to the inspection socket 152, and other suitable information. Such information is referred to when the suction head 165 suctions/picks up and releases the electronic component D, thereby eliminating malfunctions more certainly.

The ROM 192 and RAM 193 also store information on an attachment direction of the inspection socket 152 which the I/O controller 195 has received from the opening detection portion 156, and software for rotating or moving the suction head 165 in response to this attachment direction. In other words, the suction head 165 is rotated or moved so as to correspond to the inspection socket 152, so that the electronic components D can be firmly attached to the inspection socket 152. In order to increase the efficiency of inspections (i.e., in order to prevent the speed of inspections from being reduced) it is preferable that the suction head 165 be rotated while the suction head 165 is moving.

The communication controller 194 communicates with the electronic component inspection unit 200. The communication controller 194 outputs, to the electronic component inspection unit 200, for example, information on whether the electronic components D are properly placed in the inspection socket 152, or further, information on the types of the electronic components D. The communication controller 194 inputs, from the electronic component inspection unit 200, information on inspection the results of inspection of the electronic components D by the electronic component inspection unit 200. The communication controller 194 also inputs and outputs information on a unit state that represents a state of the electronic component transfer unit 100A, and other suitable information. Hence, when the electronic components D are transferred and inspected, information is exchanged between the electronic component transfer unit 100A and the electronic component inspection unit 200.

The communication between the communication controller 194 (i.e., the electronic component transfer unit 100A) and the electronic component inspection unit 200 can be conducted by various methods, such as wire and radio. For example, if an operator connects a signal coupler, communication can be conducted between the electronic component transfer unit 100A and the electronic component inspection unit 200. In addition, when the electronic component inspection unit 200 is inserted in the space 111 under the electronic component transfer unit 100A, signal couplers of both the electronic component inspection unit 200 and the electronic component transfer unit 100A may also be automatically connected.

The I/O controller 195 and the motion controller 196 are each connected to the components transfer mechanism 160, the X-direction tray transfer mechanism 170, the Y-direction tray transfer mechanism 180, and a drive unit (not shown) that drives the stocker 141. The drive unit is connected to the X-direction drive portion 161, the Y-direction drive portion 162, the Z-direction drive portion 163, the R-direction drive portion 164, or other suitable elements.

The I/O controller 195 inputs, from the components transfer mechanism 160 or the like, state information on its state. The motion controller 196 outputs, to the components transfer mechanism 160 or the like, an operation command on the contents of an operation.

Consequently, control or other characteristics of the suction is executed to achieve the suction/pick-up, transfer and release of the electronic components D by the components transfer mechanism 160, and the suction/pick-up, transfer and release of the tray T by the X-direction tray transfer mechanism 170, and the fixing, transfer and fixing removal of the tray T by the Y-direction tray transfer mechanism 180, and the transfer of the tray T to and from the stocker 141, or the like.

In addition, the I/O controller 195 receives, from the opening detection portion 156, information on the direction in which the inspection socket 152 is attached. This information is used to rotate or move the suction head 165 so that it corresponds to the inspection socket 152, and thereby, to allow the electronic components D to be certainly attached to the inspection socket 152.

The image controller 197 is connected to the component position confirmation cameras 151a, 151b and the inspection-position confirmation camera 154. The image controller 197 outputs an image capture command which is used to command the cameras 151a, 151b, 154 to capture an image, inputs the result of a captured image (i.e., image information) from the cameras 151a, 151b, 154, or conducts such an operation. The captured image information is processed by the CPU 191. Consequently, the position of the suction head 165, the position of the electronic component D with respect to the suction head 165, the position of the inspection socket 152 or the tray T, the position of the electronic component D with respect to the inspection socket 152 or the tray T, and the like, are detected.

A control portion (not shown) on the side of the electronic component inspection unit 200 which controls an input and an output of a signal for inspecting an electronic circuit, and the control portion 190 which mainly controls the side of the electronic component transfer unit 100A, may also be united. In that case, they are disposed on the side of the electronic component inspection unit 200, or they are disposed on the side of the electronic component transfer unit 100A.

The electronic component inspection unit 200 is electrically connected to the inspection socket 152, and inspects the electronic component D electrically.

In the electronic component inspection unit 200, a measuring device and the like are provided to inspect the electronic components D. These measuring devices are electrically connected to the inspection socket 152. As a result, the electronic component inspection unit 200 can inspect the electronic components D via the inspection socket 152.

The electronic component inspection unit 200 is configured to be inserted into the space 111 of the base stand 110, from either of the two X and Y directions. This is because the space 111 is opened in the two directions on the sides of the electronic component transfer unit 100A. Consequently, the electronic component transfer unit 100A can be easily connected to the electronic component inspection unit 200.

Next, an operation will be described which is conducted to inspect components using the electronic component inspection apparatus 1A, based on the control of the control portion 190.

Figure 16:
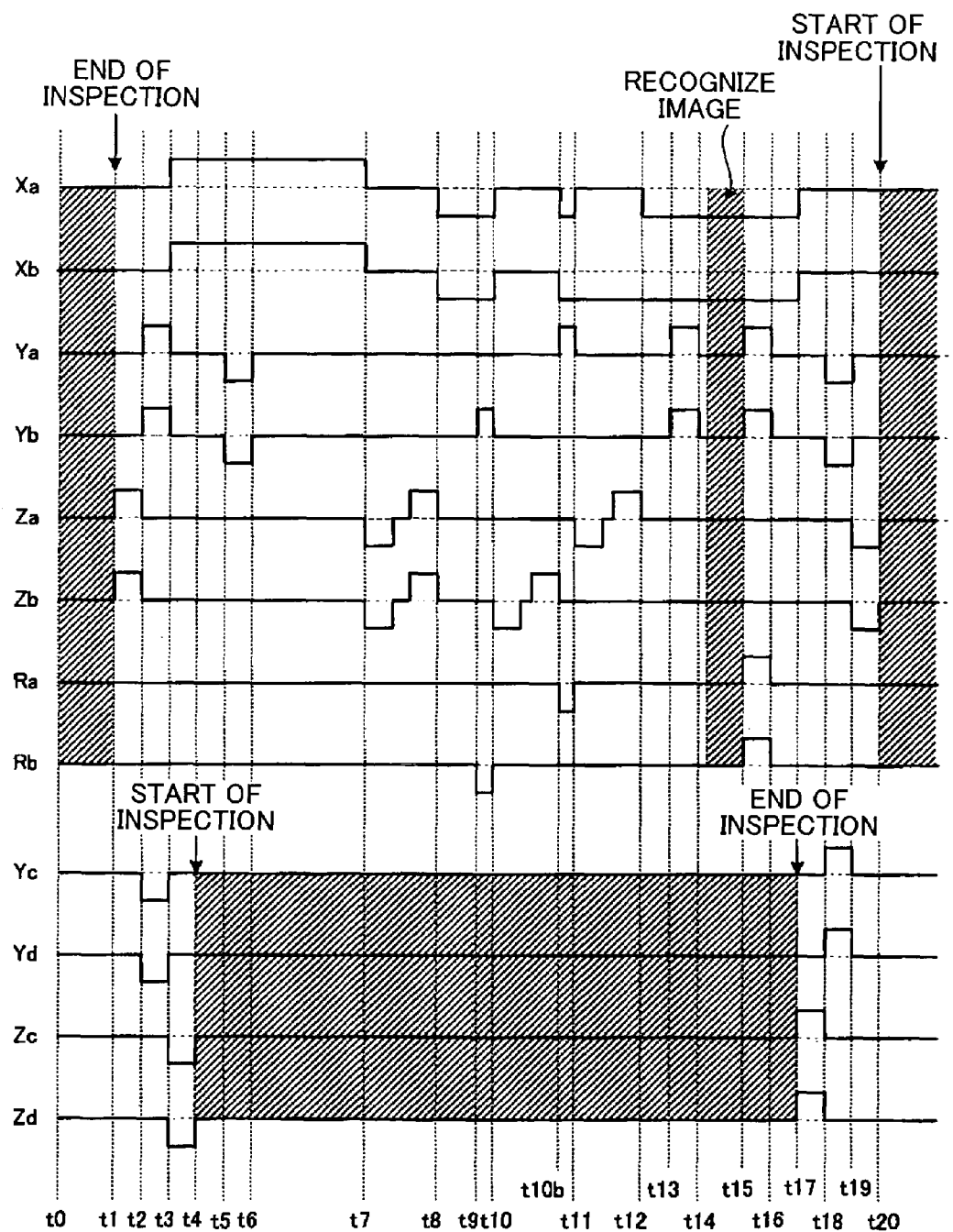
FIG. 16 is a timing chart, showing an operational process of the electronic component inspection apparatus.

FIG. 16 is a timing chart, showing an operational process of the electronic component inspection apparatus 1A. FIG. 17 to FIG. 24 are top views which show the state of the electronic component inspection apparatus 1A when it operates according to the operational process shown in FIG. 16.

In FIG. 16, the horizontal axis is time and the vertical axis represents an output state of a drive instruction in each of the X, Y, Z and R directions. The suffixes a to d of X, Y, Z and R shown here correspond to the components transfer mechanisms 160a to 160d, respectively. Within a period of time shown in FIG. 16, suction heads 165c, 165d do not move in the X and R directions. Thus, in FIG. 16, the description of Xc, Xd, Rc, Rd is omitted. In addition, in the following description, in order to distinguish electronic components that are held by each of the components transfer mechanisms 160a to 160d, the numerals 1 to 6 are given to the reference character D.

Figure 17:
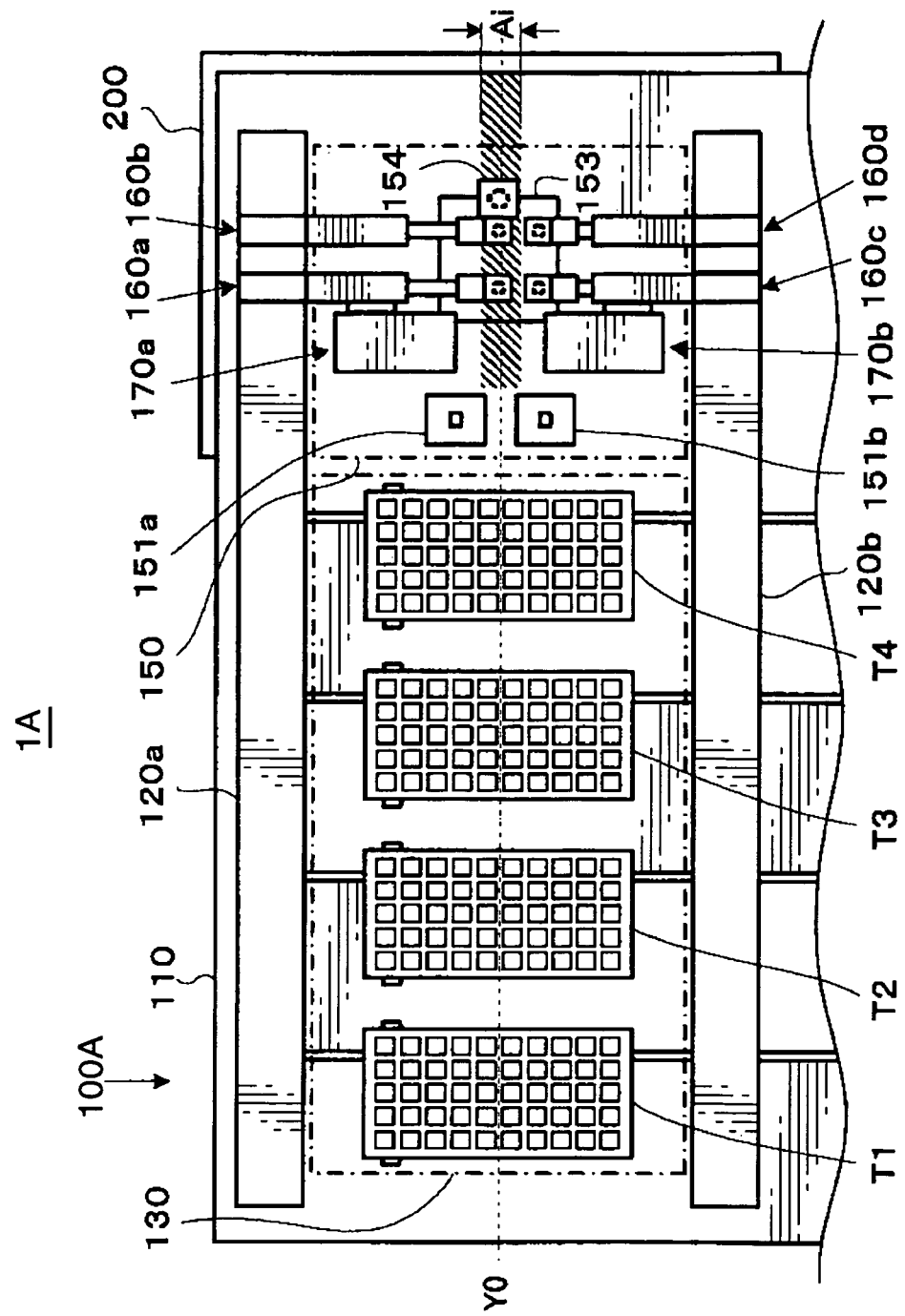
FIG. 17 is a top view of the electronic component inspection apparatus when it operates in accordance with the operational process shown in the timing chart of FIG. 16.

(1) Time t0 (see FIG. 17)

At a time t0, electronic components D1, D2 are connected to the inspection sockets 152a, 152b, and are being inspected.

Suction heads 165a, 165b are pressing the electronic components D1, D2 which are connected to the inspection sockets 152a, 152b against the inspection sockets 152a, 152b, respectively. On the other hand, the suction heads 165c, 165d are suctioning electronic components D3, D4 that have not yet been inspected, and are standing by in the negative Y-axis direction (i.e., downward in FIG. 17) of the suction heads 165a, 165b, respectively.

(2) Time t1 to t2

At a time t1, the inspection of the electronic components D1, D2 is completed.

The air pressure which is applied to the inside of each suction nozzle 166a, 166b is switched from a positive pressure to a negative pressure. Then, the suction heads 165a, 165b each move in the positive Z-axis direction (i.e., go upward). As a result, the electronic components D1, D2 which have been suctioned/picked up by the suction heads 165a, 165b move away from the inspection sockets 152a, 152b, respectively.

Figure 18:
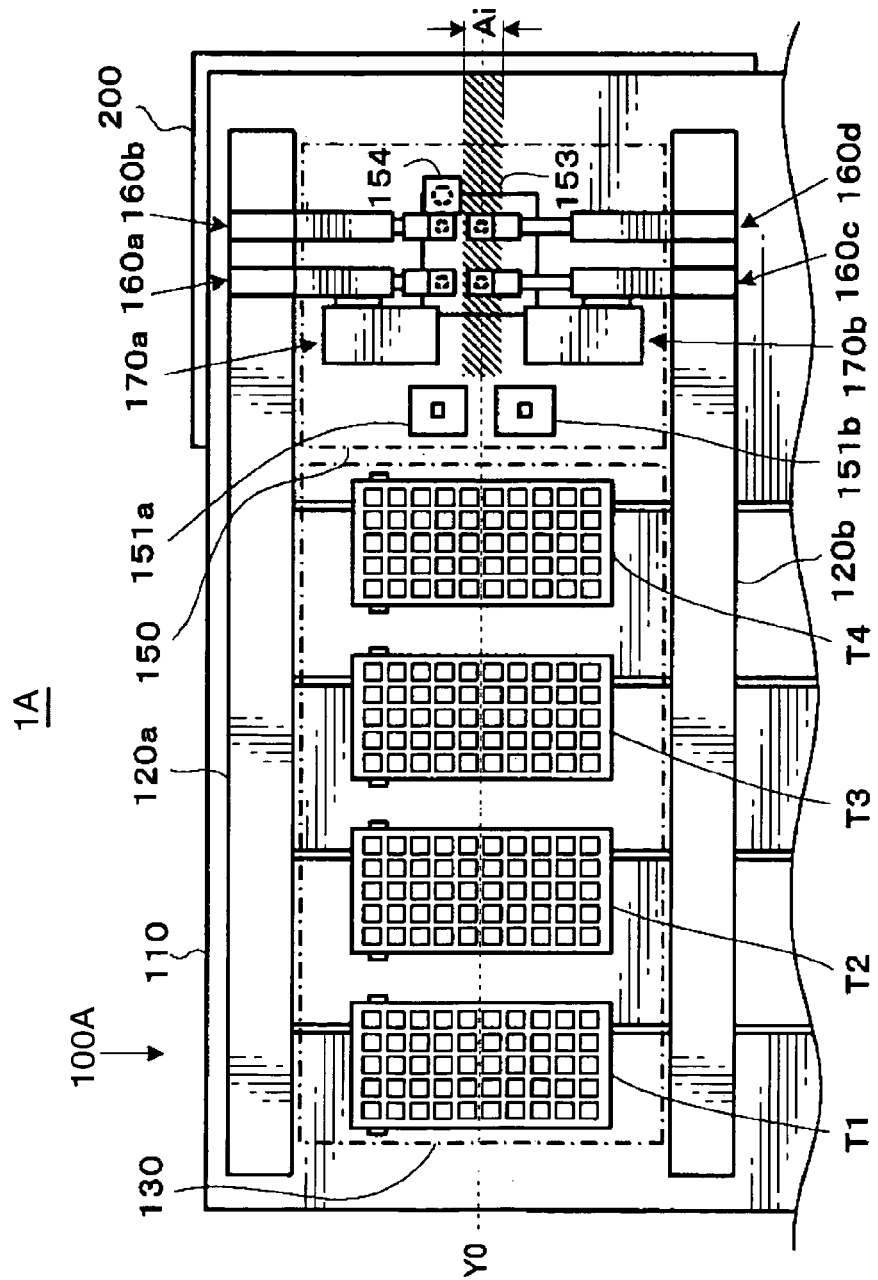
FIG. 18 is a top view of the electronic component inspection apparatus when it operates in accordance with the operational process shown in the timing chart of FIG. 16.

(3) Time t2 to t3 (see FIG. 18)

The suction heads 165a to 165d move together in the positive Y-axis direction (i.e., upward in FIG. 18). Consequently, instead of the suction heads 165a, 165b, the suction heads 165c, 165d are located above the inspection sockets 152a, 152b.

(4) Time t3 to t4

At a time t3, the suction heads 165a, 165b start to move in the negative X-axis direction (i.e., leftward in FIG. 18). Then, the suction heads 165c, 165d move together in the negative Z-axis direction (i.e., go downward). When the suction heads 165c, 165d reach a predetermined height position, the air pressure that is applied to the tip of each suction nozzle 166c, 166d is switched from a negative pressure to a positive pressure. Thereby, the electronic components D3, D4 which have been suctioned/picked up by the suction heads 165c, 165d are set to the inspection sockets 152a, 152b. Then, at a time t4, an inspection of the electronic components D3, D4 is started.

Figure 19:
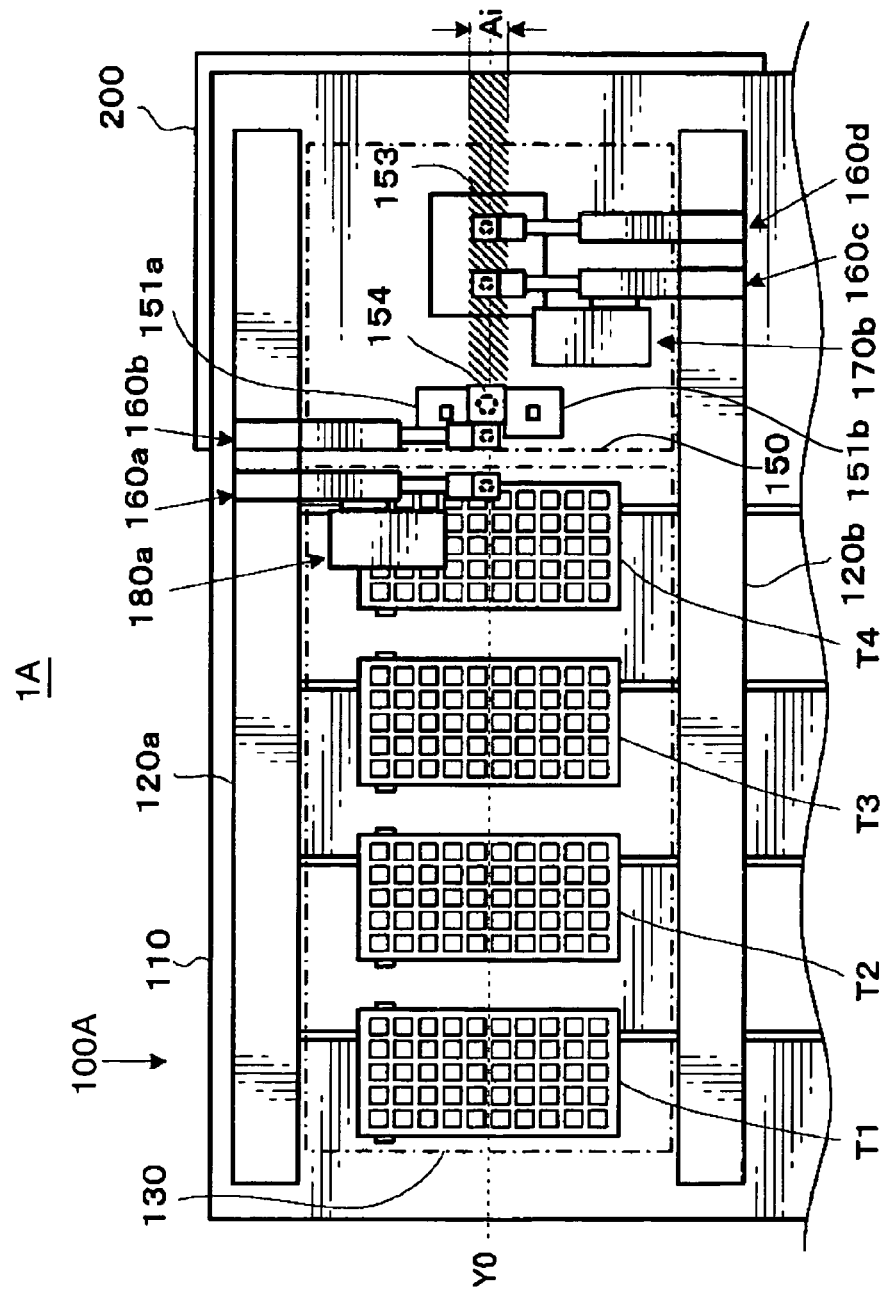
FIG. 19 is a top view of the electronic component inspection apparatus when it operates in accordance with the operational process shown in the timing chart of FIG. 16.

(5) Time t5 to t6 (see FIG. 19)

The suction heads 165a, 165b move in the X-axis direction. Thereby, the suction heads 165a, 165b and the suction heads 165c, 165d are shifted in the X-axis direction. At this time, when the suction head 165b passes through a position of the suction head 165c (i.e., when they pass each other in the X-axis direction), the suction heads 165a, 165b move in the negative Y-axis direction (i.e., downward in FIG. 18).

In other words, when the suction heads 165c, 165d (or the suction heads 165a, 165b) on one side are located above the position of the inspection sockets 152a, 152b, if the suction heads 165a, 165b (or the suction heads 165c, 165d) on the other side are moved in the X-axis direction, then the suction heads 165a, 165b and the suction heads 165c, 165d interfere (or come into contact) with each other. However, as described above, the suction heads 165a, 165b (or the suction heads 165c, 165d) on the one side move in the X-axis direction while they retreat in the Y-axis direction. As a result, the suction heads 165a, 165b and the suction heads 165c, 165d are prevented from interfering with each other. The area in which the suction heads 165a, 165b and the suction heads 165c, 165d interfere (or come into contact) with each other is called a head interference area (which is shown by reference characters Ai in FIG. 17 to FIG. 24), according to this preferred embodiment. When the suction heads 165a, 165b and the suction heads 165c, 165d pass each other, as described above, the suction heads 165a, 165b (or the suction heads 165c, 165d) on the one side are located outside of the head interference area Ai. As a result, the suction heads 165a, 165b and the suction heads 165c, 165d are prevented from interfering (or coming into contact) with each other.

Figure 20:
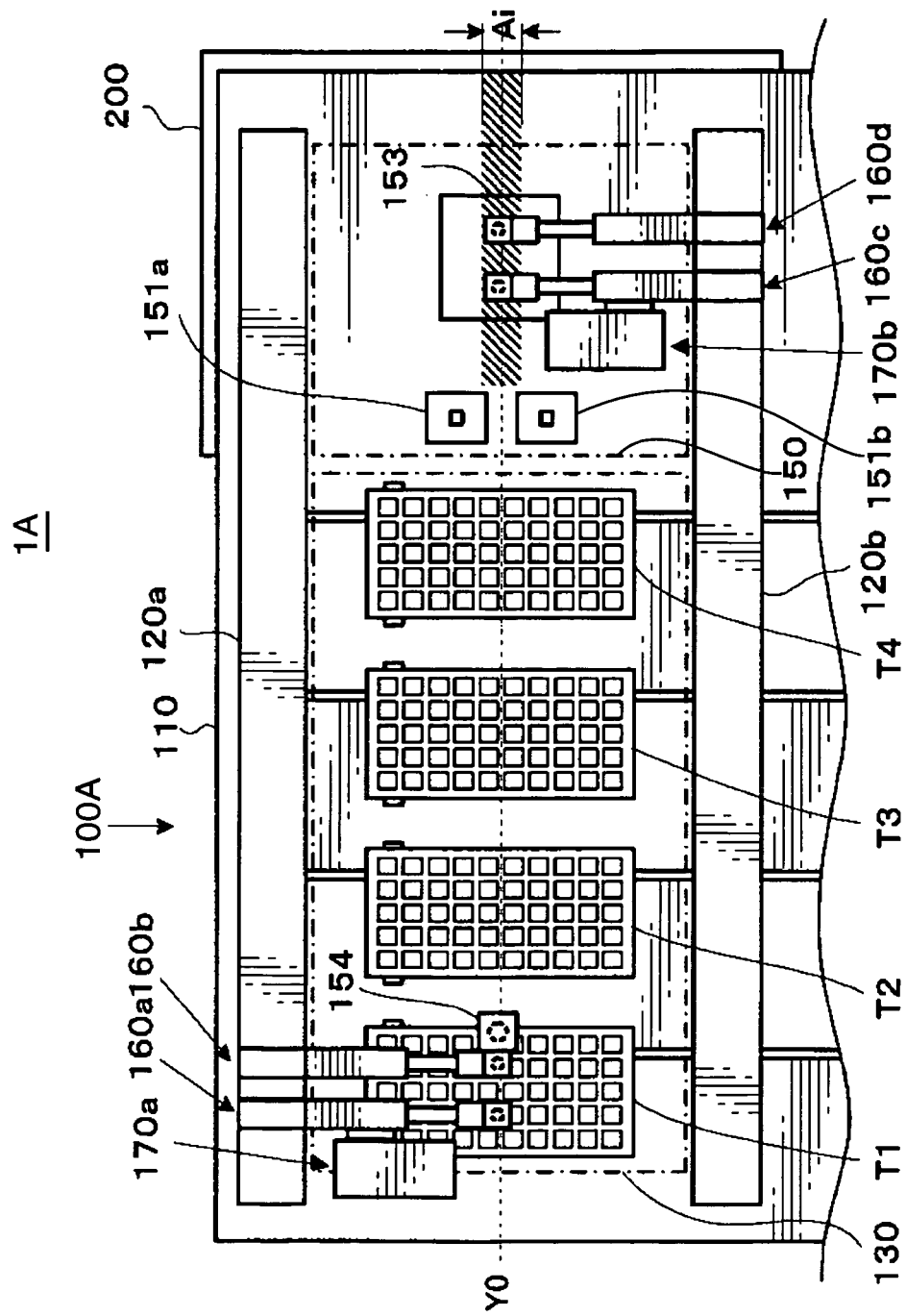
FIG. 20 is a top view of the electronic component inspection apparatus when it operates in accordance with the operational process shown in the timing chart of FIG. 16.

(6) Time t7 to t8 (see FIG. 20)

Among the trays T for the components that have already been inspected, the tray T1 is a tray for components that meet a predetermined standard, and the tray T2 is a tray for components meet a predetermined standard. On the other hand, the electronic components D1 of the suction head 165a are components that meet the standard, and the electronic components D2 of the suction head 165b are components that do not meet the predetermined standard. In such a case, at a time t7, the suction heads 165a, 165b move above the trays T1, T2 for the already-inspected components, respectively. Thereafter, the suction heads 165a, 165b move up, and thus, the electronic components D1, D2 are stored in the trays T1, T2 for the already-inspected components. At this time, the suction heads 165a, 165b move down, and thereafter, the electronic components D1, D2 are released before they move up. As a result, the electronic components D1, D2 are stored in the trays T1, T2 for the already-inspected components.

If both the electronic components D1, D2 of the suction heads 165a, 165b meet the predetermined standard, the suction head 165a (or the suction head 165b) on one side is located above the tray T1 and is moved down. Then, the electronic component D1 is released, and thereafter, the suction head 165a is moved up. Thereafter, the suction head 165b (or the suction head 165a) on the other side is located above the tray T1, and then, the electronic component D2 is released. At this time, the suction head 165b on the other side moves in the X-axis direction, and at the same time, the suction head 165a on the one side is allowed to retreat in the X-axis direction from above the tray T1. As a result, the suction heads are prevented from interfering with each other.

On the other hand, if the electronic components D1 of the suction head 165a are components that do not meet the predetermined standard, and the electronic components D2 of the suction head 165b are components that meet the predetermined standard, then the suction head 165a on the one side is located above the tray T2 and is moved down. Then, the electronic component D1 is released, and thereafter, the suction head 165a is moved up. Thereafter, the suction head 165b on the other side is located above the tray T1, and then in the same way, the electronic component D2 is released. Hence, when the suction head 165b on the other side is set above the tray T1, in order to prevent it from interfering with the suction head 165a on the one side, the suction head 165a is moved in the negative X-axis direction.

(7) Time t8 to t10

At a time t8, the suction heads 165a, 165b start to move in the positive X-axis direction toward the tray T4 for components that have not yet been inspected. At this time, the suction head 165b moves to a reference position in the Y-axis direction and in the R direction. Simultaneously, the Y-direction tray transfer mechanism 180 operates to move the tray T4 in the Y-axis direction. A reference position Y0 in the Y-axis direction is preferably the middle point between the component position confirmation cameras 151a, 151b, and is shown as Y0 in FIGS. 17 to 24.

Figure 21:
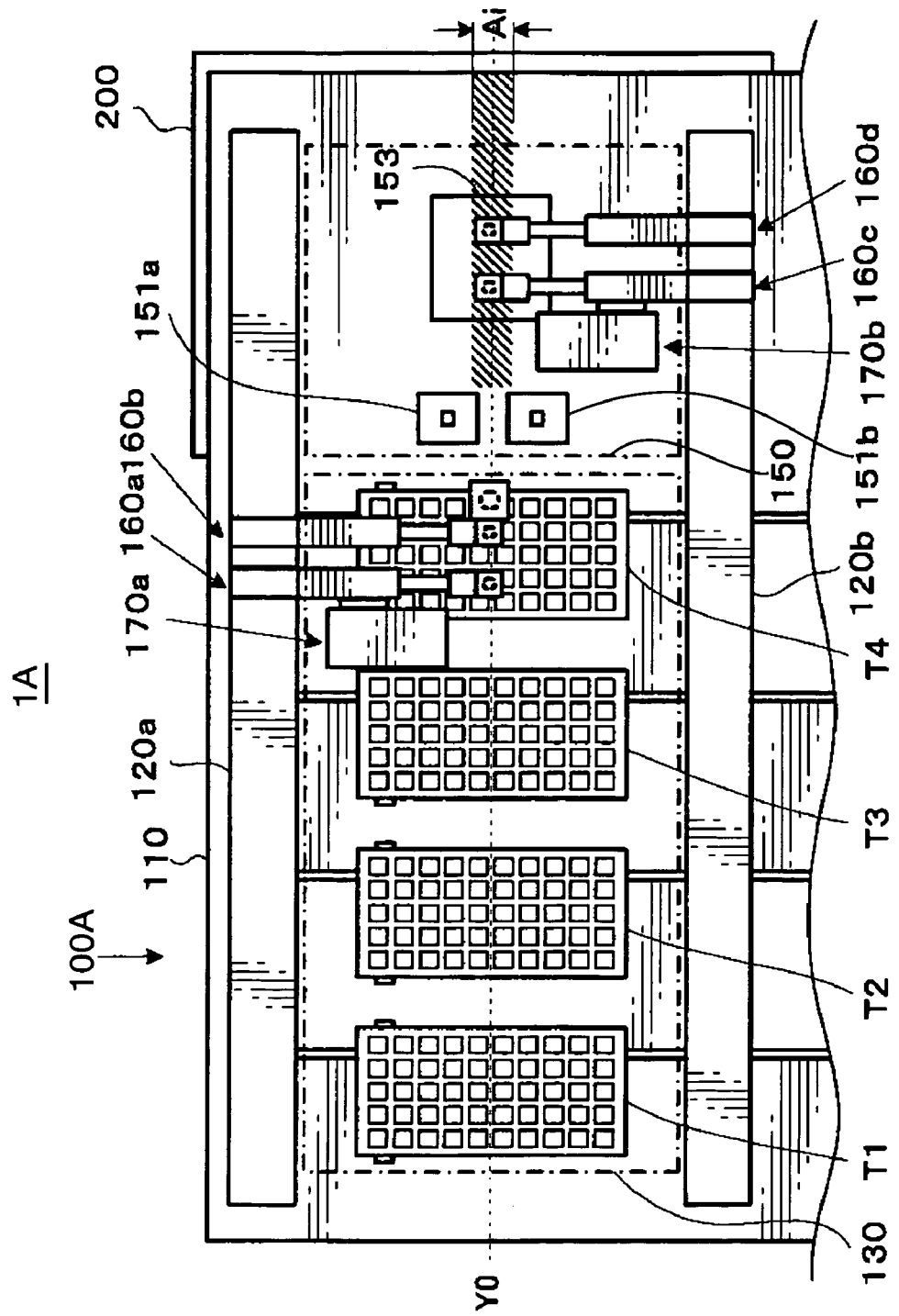
FIG. 21 is a top view of the electronic component inspection apparatus when it operates in accordance with the operational process shown in the timing chart of FIG. 16.

(8) Time t10 to t12 (see FIG. 21)

At a time t10, the suction head 165b on one side reaches up to above the tray T3.

Thereafter, the suction head 165b moves down, and comes into contact with, or close to, the upper surface of an electronic component D6 which is stored in the tray T3. Then, the suction head 165b suctions and picks-up the electronic component D6. As a result, the electronic component D6 is removed from the tray T3, while continuing to be suctioned and held by the suction head 165b.

From a time t10b, the suction heads 165a, 165b move in the positive X-axis direction. Then, at a time t1, the suction head 165a on the other side reaches up to above the tray T3. Then, between the time t11 and a time t12, in the same way as with the case of the suction nozzle 166b on the other side, an electronic component D5 is suctioned and picked-up by the suction nozzle 166a. At the time t12, the suction head 165a starts to move in the positive X-axis direction toward the inspection socket 152a.

Figure 22:
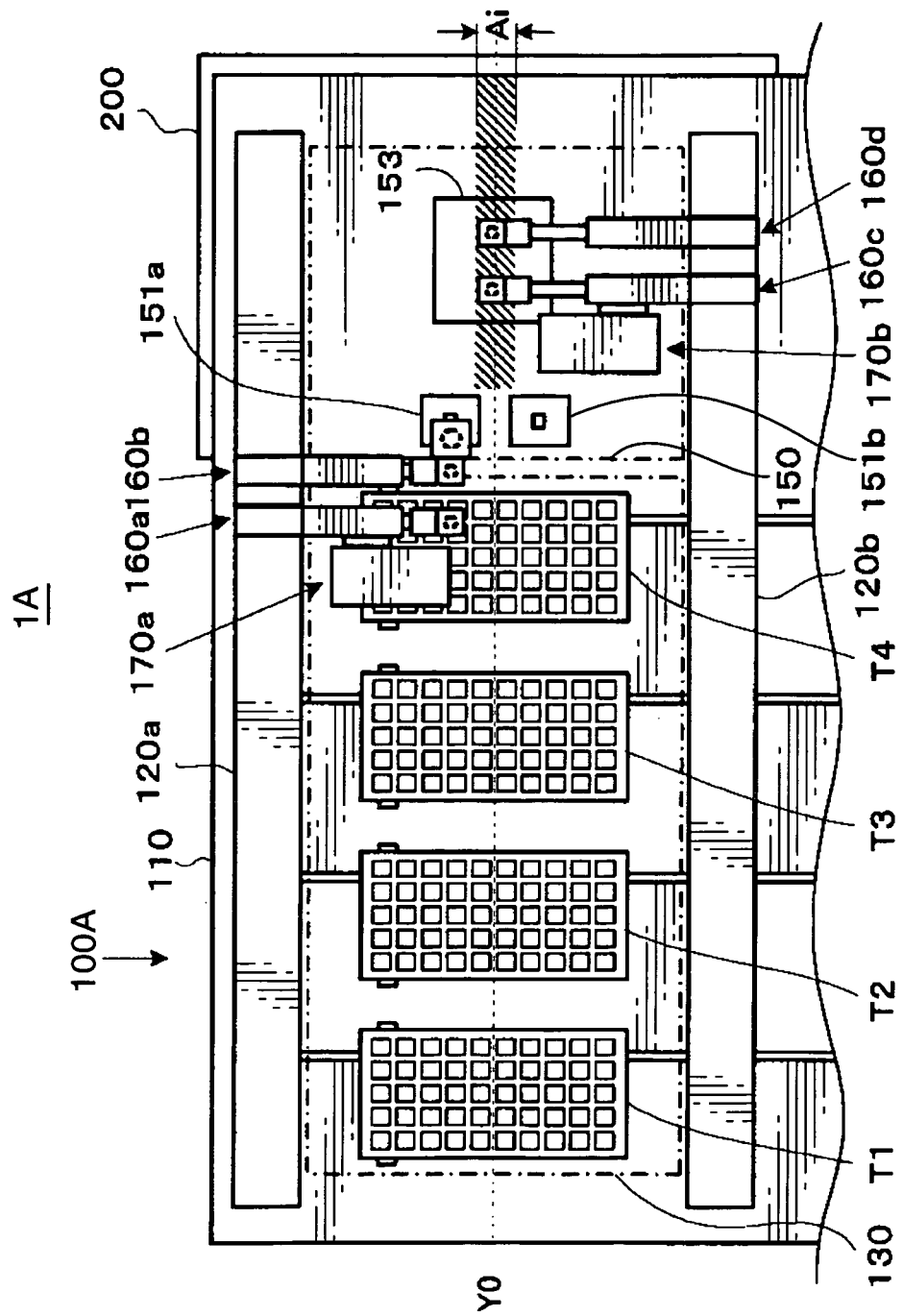
FIG. 22 is a top view of the electronic component inspection apparatus when it operates in accordance with the operational process shown in the timing chart of FIG. 16.

(9) Time t13 to t15 (see FIG. 22)

While moving in the X-axis direction, the suction heads 165a, 165b move in the positive Y-axis direction. This movement in the Y-axis direction is made to prevent the suction heads from interfering with each other within the head interference area Ai. Thus, this movement is made before the suction heads 165a, 165b come into the head interference area Ai.

Thereafter, while the suction heads 165a, 165b are moving in the X-axis direction, they pass above the component position confirmation camera 151a. Specifically, the suction heads 165b, 165a pass, in this order, above the component position confirmation camera 151a. When they pass, an image is captured by the component position confirmation camera 151a. Based upon the captured image information, the position of the electronic components D5, D6 (i.e., the position relative to the suction heads 165a, 165b, the suction state of the electronic components D5, D6) is recognized.

(10) Time t15 to t16

Based upon the position of the electronic components D5, D6 that have undergone the image recognition, while moving in the X-axis direction, the position of the suction heads 165a, 165b in the Y-axis direction and in the R direction is rectified (or corrected). This helps to reliably connect the electronic components D5, D6 to the inspection sockets 152a, 152b. Specifically, when the electronic components D5, D6 are stored in the tray T3, the position in which they are placed may be shifted, or such a problem may take place. This may produce an error when they are suctioned and picked up. However, the above-described processing prevents such an error from being made.

Figure 23:
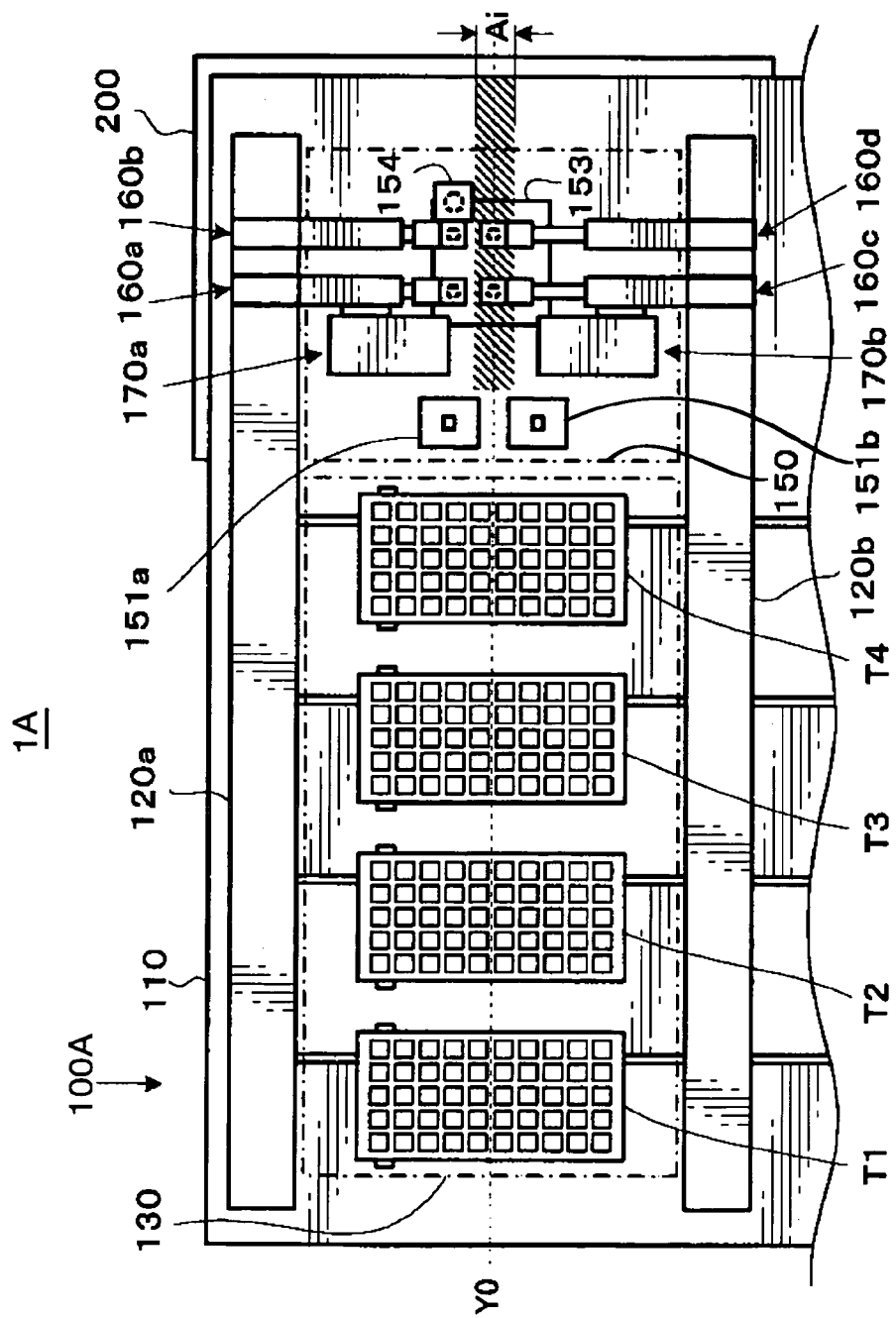
FIG. 23 is a top view of the electronic component inspection apparatus when it operates in accordance with the operational process shown in the timing chart of FIG. 16.

(11) Time t17 to t18 (see FIG. 23)

At a time t17, the movement of the suction heads 165a, 165b in the X-axis direction is completed. In addition, the inspection of the electronic components D3, D4 is completed.

During the period of the time t17 to a time t18, the suction heads 165c, 165d suction/pick-up the electronic components D3, D4, and move upward.

Figure 24:
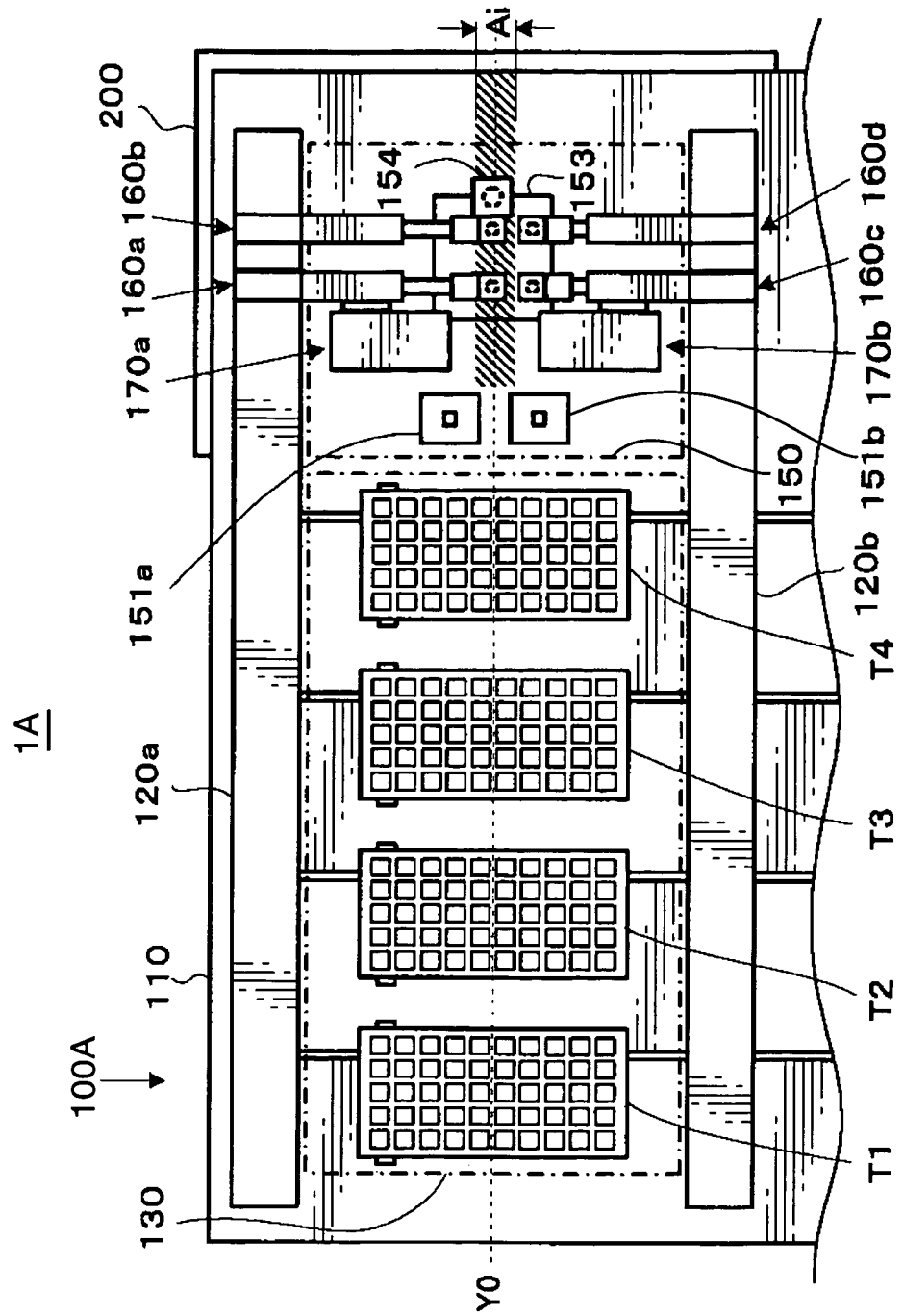
FIG. 24 is a top view of the electronic component inspection apparatus when it operates in accordance with the operational process shown in the timing chart of FIG. 16.

(12) Time t18 to t19 (see FIG. 24)

The suction heads 165a, 165b and the suction heads 165c, 165d move all together in the negative Y-axis direction. Consequently, the suction heads 165a, 165b are located above the inspection sockets 152a, 152b. At this time, the position of the suction heads 165a, 165b is corrected during the time t15 to t16, and thus, the electronic components D5, D6 are put in a suitable position (i.e., upward) so that they can be connected to the inspection sockets 152a, 152b.

(13) Time t19 to t20

The suction heads 165a, 165b move down, and the electronic components D5, D6 are connected to the inspection sockets 152a, 152b. Thereafter, at a time t20, an inspection of the electronic components D5, D6 starts. An operation here is basically the same as in the case during the time t3 to t4, except for the fact that the role of the suction heads 165a, 165b is replaced by that of the suction heads 165c, 165d.

(14) After Time t20

From this time on, the inspection of the electronic components D5, D6 continues. Then, except for the fact that the role of the suction heads 165a, 165b is replaced by that of the suction heads 165c, 165d, the operations which correspond to those after the time t4 are repeated and continued.

In the above-described operations of the electronic component inspection apparatus 1A, the case has been described in which the inspection sockets 152 are preferably arranged in the X-axis direction. But descriptions are omitted regarding how the direction in which the inspection plate 153 is attached is detected, and based on the detected attachment direction, how the position of the suction head 165 is controlled. As a practical matter, however, the type of the inspection socket 152 and the attachment direction are detected by the inspection-position confirmation camera 154, the opening detection portion 156 or other suitable elements. Thereafter, in response to the type of the inspection socket 152 and the attachment direction that been detected, the suction head 165 (165a to 165d) are moved. As a result, at the times t3, t19, the suction head 165 is located above the inspection sockets 152a, 152b.

It is sufficient that the type of the inspection socket 152 and the attachment direction are detected only once when the electronic component inspection apparatus 1A starts to operate.

As described above, in the electronic component inspection apparatus 1A, the component position confirmation camera 151 is preferably disposed in the inspection area 150. Then, the electronic component D is removed from the tray T4 while being suctioned and held by the suction head 165. Thereafter, in this state, this electronic component D is moved to a position above the component position confirmation cameras 151. Then, the state in which the electronic component D is suctioned and held is recognized by its image. Next, based on this image recognition, a shift in the suction is corrected. Then, the electronic component D is inserted into the inspection socket 152. Hence, until the electronic component D is inserted into the inspection socket 152 after being removed from the tray T4, it is transferred while being suctioned and held by the suction nozzle 166 and without being moved down at all. Therefore, while the electronic component D is recognized by its image and is precisely inserted into the inspection socket 152, the electronic component D can be swiftly transferred from the tray T4 to the inspection sockets 152a, 152b.

Particularly, the electronic component D itself, which is held by the suction nozzle 166, is recognized by its image, thereby making it possible to detect the suction state precisely. Thus, the electronic component D can be inserted more precisely and more certainly into the inspection sockets 152a, 152b. Conventionally, after an electronic component that has been placed is recognized by its image, the electronic component is suctioned. In that case, if the electronic component is suctioned after the image has been recognized, a shift may be produced at that time. After that, the shift cannot be corrected, thereby preventing the electronic component from being precisely inserted into an inspection socket. However, in the electronic component inspection apparatus 1A according to this preferred embodiment, immediately before it is inserted into the inspection sockets 152a, 152b, the electronic component D itself that is held by the suction nozzle 166 is recognized by its image, so that the suction state can be checked. Thus, there is no possibility that any suction shift occurs later. Therefore, the electronic component D can be inserted more precisely and more reliably into the inspection sockets 152a, 152b.

Furthermore, in the electronic component inspection apparatus 1A, each tray T1 to T4 (the tray T1 for components that have met the predetermined standard, the tray T2 for components that have not met the predetermined standard, the empty tray T3, and the tray T4 for components before they have been inspected) of the tray disposition area 130, the inspection sockets 152a, 152b, and the component position confirmation camera 151a (or 151b), are arranged substantially in line. As a result, the electronic component D that has been removed from the tray T can be transferred almost along a straight line in the X-axis direction. Therefore, the electronic component D can be transferred at higher speed than in any conventional such apparatus in which the electronic component D is moved over a long distance in both the X-axis direction and the Y-axis direction. Beside, the tray disposition area 130 and the like are arranged along a line in the X-axis direction, thus making the layout of the tray disposition area 130 much more compact. Especially, the electronic component inspection apparatus 1A can be provided which has a compact configuration in the Y-axis direction.

Moreover, in the electronic component inspection apparatus 1A according to this preferred embodiment, the two X-axis robots 120a, 120b are preferably provided. In these X-axis robots 120a, 120b, there is preferably provided, respectively, the pair of components transfer mechanisms 160 (i.e., the components transfer mechanisms 160a, 160b and the components transfer mechanisms 160c, 160d). By the pair of components transfer mechanisms 160, the electronic component D is transferred alternately. Therefore, the electronic components D are transferred without a break to the inspection socket 152, and thus, the electronic components D can be consecutively inspected. This allows the electronic components D to be inspected in an extremely effective manner.

Figure 25:
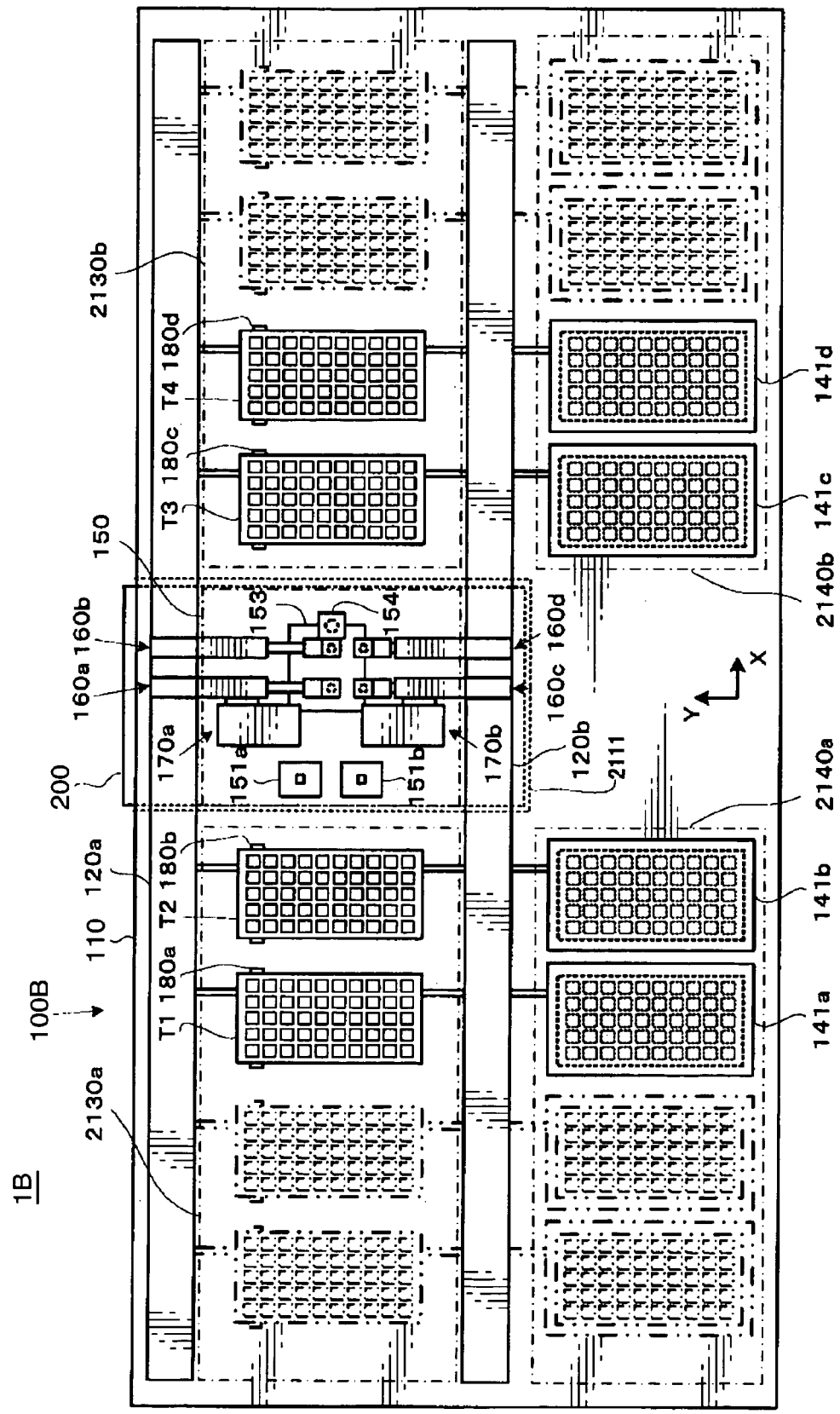
FIG. 25 is a top view of an electronic component inspection apparatus according to a second preferred embodiment of the present invention.

FIG. 25 is a top view of an electronic component inspection apparatus 1B according to a second preferred embodiment of the present invention. The electronic component inspection apparatus 1B shown in this figure preferably includes, as an electronic component transfer unit that transfers the electronic components D, such an electronic component transfer unit 100B as described below. The electronic component inspection apparatus 1B is preferably configured by combining the electronic component transfer unit 100B and the electronic component inspection unit 200.

The electronic component inspection apparatuses 1B to 10I according to the second to ninth preferred embodiments, which will be described hereinafter, each have a basic configuration common to the electronic component inspection apparatus 1A according to the first preferred embodiment. Therefore, in the following description, the portions that are common to those according to the first preferred embodiment are given the same reference characters and numerals as much as possible. Description of common portions is omitted (or simplified), and points of difference are described in detail.

The electronic component transfer unit 100B according to the second preferred embodiment preferably includes the base stand 110, the X-axis robots 120 (120a, 120b), a tray disposition area 2130 (2130a, 2130b), a stocker disposition area 2140 (2140a, 2140b), the inspection area 150, the components transfer mechanism 160 (160a to 160d), the X-direction tray transfer mechanism 170 (170a, 170b), the Y-direction tray transfer mechanism 180 (180a to 180d), the control portion 190, and other components, and a cover is placed over it.

According to this preferred embodiment, the base stand 110 has a substantially U-shape at its bottom portion. The electronic component inspection unit 200 is inserted into a space 2111 of the base stand 110 from the Y-axis direction. According to this configuration where the bottom component of the base stand 110 is substantially U-shaped, the four corners of the base stand 110 can bear the load of such a unit. Thus, even if a mechanical force (e.g., by an earthquake) is applied, the unit could not fall down easily because of its stability.

Near the middle of the base stand 110, the inspection area 150 is located. As the tray disposition area 2130, the two tray disposition areas 2130a, 2130b are provided such that the inspection area 150 is located between them in the X-axis direction. As the stocker disposition area 2140, the two stocker disposition areas 2140a, 2140b are located so as to correspond to the tray disposition areas 2130a, 2130b, respectively.

According to this preferred embodiment, the trays T1 to T4 are sorted and placed at each tray disposition area 2130a, 2130b. The tray T4 for components that have not yet been inspected is placed in an area that is different from that for the trays T1, T2 for components that have already been inspected. This prevents the not-inspected electronic components D from mixing with the already-inspected electronic components D.

According to this second preferred embodiment, as shown by a virtual line, the trays T1 to T4 can each be placed at both of the tray disposition areas 2130a, 2130b. According to this configuration, the speed of inspections can be increased, using the four suction heads 165 effectively. At this time, the electronic components D are transferred from the tray disposition area 2130 to the inspection area 150, and then, they are inspected, alternately between the tray disposition areas 2130a, 2130b. As a result, the inspection area 150 is commonly used for the tray disposition areas 2130a, 2130b, and they can be effectively inspected. This sharing helps reduce production costs and an installation area for the apparatus. In this case, as the component position confirmation camera 151, two cameras are provided for each of the tray disposition area 2130a and the tray disposition area 2130b.

There is no need for the stocker 141 to have the same configuration in both of the stocker disposition areas 2140a, 2140b. For example, where the stocker 141 should be placed on a level, and which the stocker 141 should be placed, over or under the base stand 110 (i.e., in which direction the trays T should be piled), may also be varied according to the stocker disposition areas 2140a, 2140b. A configuration where the stocker 141 is placed under the base stand 110 will be described in detail according to the preferred embodiment mentioned later.

According to the present preferred embodiment, as the X-axis robot 120, two robots are preferably used, but only a single X-axis robot 120 may also be used (e.g., the X-axis robot 120a). In that case, in the X-axis robot 120a, two components transfer mechanisms 160a, 160b are arranged so as to be moved. According to this configuration, the two components transfer mechanisms 160 on the X-axis robot 120a can be efficiently used, thus making inspections efficient.

In addition, in a single X-axis robot 120 (e.g., the X-axis robot 120a), the four components transfer mechanisms 160a to 160d may also be placed. In that case, by the components transfer mechanisms 160a, 160b, the electronic components D are transferred between the tray disposition area 2130a and the inspection area 150. Then, by the components transfer mechanisms 160c, 160d, the electronic components D are transferred between the tray disposition area 2130b and the inspection area 150. This makes it possible to inspect the electronic components D efficiently. In this case, as the component position confirmation camera 151, it is sufficient that one camera is provided for each of the tray disposition area 2130a and the tray disposition area 2130b.

Figure 26:
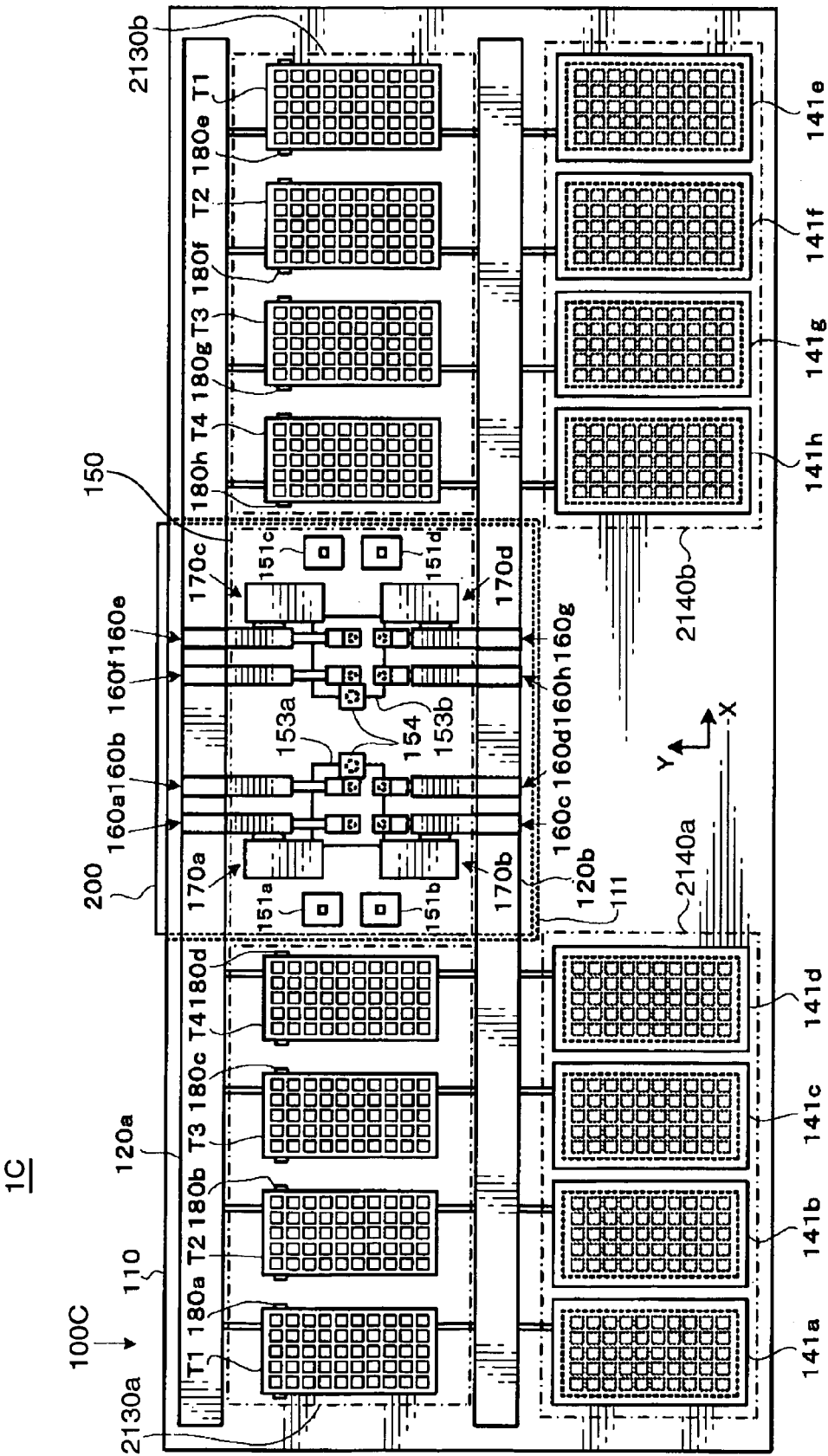
FIG. 26 is a top view of an electronic component inspection apparatus according to a third preferred embodiment of the present invention.

FIG. 26 is a top view of an electronic component inspection apparatus 1C according to a third preferred embodiment of the present invention. The electronic component inspection apparatus 1C shown in this figure preferably includes, as an electronic component transfer unit that transfers the electronic components D, such an electronic component transfer unit 100C as described below. The electronic component apparatus 1C is preferably configured by combining the electronic component transfer unit 100C and the electronic component inspection unit 200.

In the electronic component transfer unit 100C shown in this figure, the two tray disposition areas 2130a, 2130b are arranged such that the inspection area 150 is located between them in the X-axis direction. The two stocker disposition areas 2140a, 2140b are arranged corresponding to the tray disposition areas 2130a, 2130b. In this respect, its configuration is similar to that of the electronic component inspection apparatus 1B shown in FIG. 25. However, in the following points, it is different in configuration from the electronic component inspection apparatus 1B shown in FIG. 25.

Specifically, in the X-axis robots 120a, 120b on one side, there are placed four components transfer mechanisms 160a, 160b and 160e, 160f. Similarly, in the X-axis robots, 120a, 120b on the other side, there are placed four components transfer mechanisms 160c, 160d and 160g, 160h. Among the components transfer mechanisms 160a, 160b and 160e, 160f which are placed in the X-axis robot 120a on the one side, in the components transfer mechanisms 160a, 160e at both outside areas (i.e., at both outside areas in the positive and negative X-axis directions), X-direction tray transfer mechanisms 170a, 170c are disposed, respectively. On the other hand, among the components transfer mechanisms 160c, 160d and 160g, 160h which are placed in the X-axis robot 120b on the other side, in the components transfer mechanisms 160c, 160g at both outside areas, X-direction tray transfer mechanisms 170b, 170d are disposed, respectively. In addition, among the components transfer mechanisms 160a, 160b and 160e, 160f which are placed in the X-axis robot 120a on the one side, in each of the components transfer mechanisms 160b, 160f on the inside, the inspection-position confirmation camera 154 is disposed.

In each tray disposition area 2130a, 2130b, the trays T1 to T4 are disposed. In the stocker disposition areas 2140a, 2140b, the stockers 141a to 141d and stockers 141e to 141h are disposed, respectively.

In the inspection area 150, a pair of inspection plates 153a, 153b each of which includes the inspection sockets 152a, 152b are disposed adjacent to each other in the X-axis direction. Between the inspection plate 153a on one side and the tray disposition area 2130a on one side, the component position confirmation cameras 151a, 151b are disposed. Between the inspection plate 153b on the other side and the tray disposition area 2130b on the other side, component position confirmation cameras 151c, 151d are disposed.

In other words, in the electronic component inspection apparatus 1C, the electronic component D is inspected while the electronic component D is being transferred between the tray disposition area 2130a on the one side and the inspection socket 152 on the one side, using the components transfer mechanisms 160a, 160b and 160c, 160d. On the other hand, apart from this, the electronic component D is inspected while the electronic component D is being transferred between the tray disposition area 2130b on the other side and the inspection socket 152 on the other side, using the components transfer mechanisms 160e, 160f and 160g, 160h.

The electronic component inspection apparatus 1C includes double the configuration of the electronic component inspection apparatus 1A according to the first preferred embodiment. This makes it possible to inspect the electronic component D more efficiently.

Figure 27:
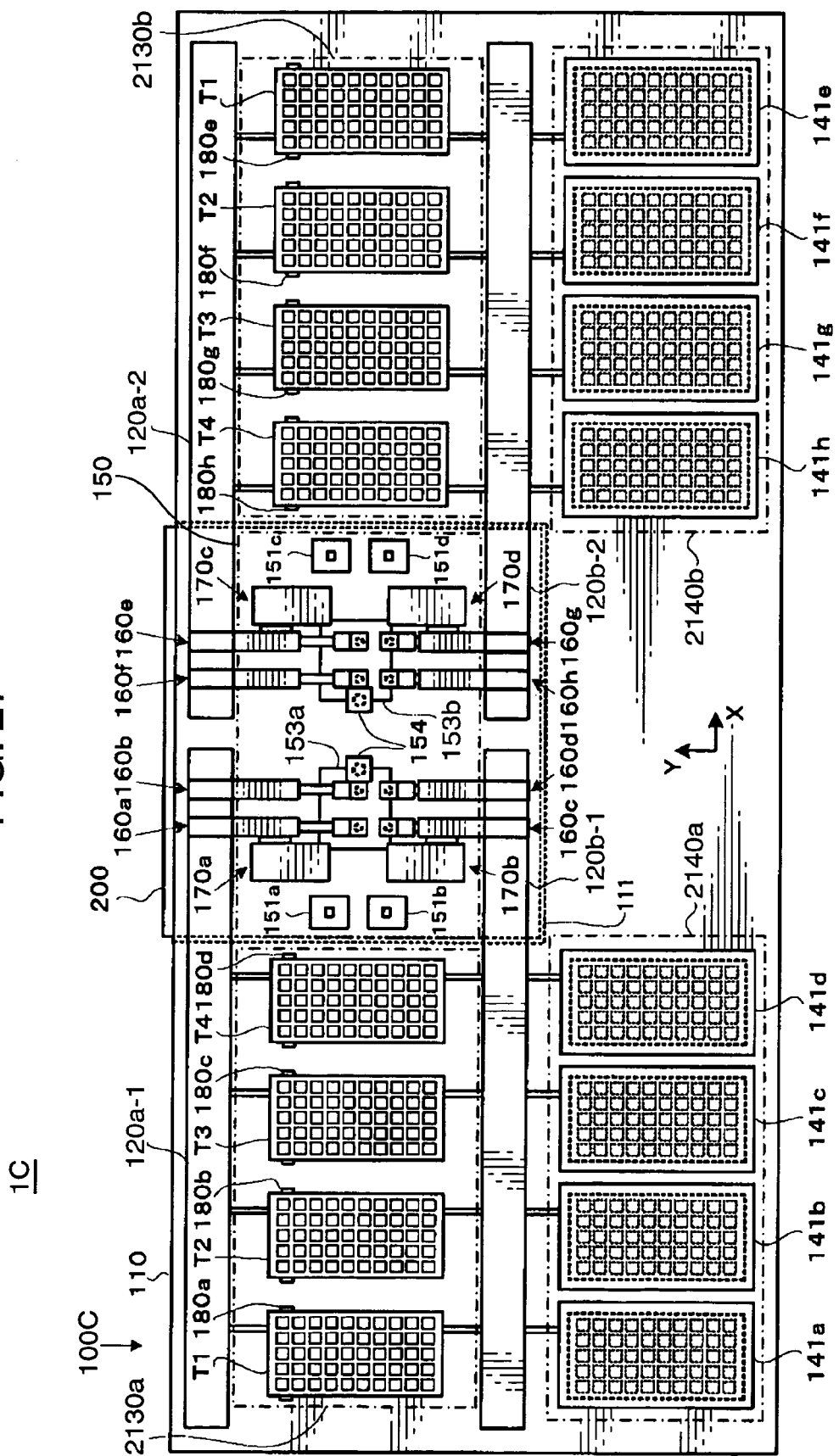
FIG. 27 is a top view of another electronic component inspection apparatus according to the third preferred embodiment of the present invention.

According to the configuration of the electronic component inspection apparatus 1C according to the third preferred embodiment, the components transfer mechanisms 160a, 160b and 160c, 160d are placed in the X-axis robot 120a on the one side, and the components transfer mechanisms 160e, 160f and 160g, 160h are placed in the X-axis robot 120b on the other side, respectively. However, for example, as shown in FIG. 27, the components transfer mechanisms 160a, 160b, the components transfer mechanisms 160c, 160d, the components transfer mechanisms 160e, 160f, and the components transfer mechanisms 160g, 160h, may also be placed in individual X-axis robots 120a-1, 120a-2, 120b-1, 120b-2, respectively.

Figure 28:
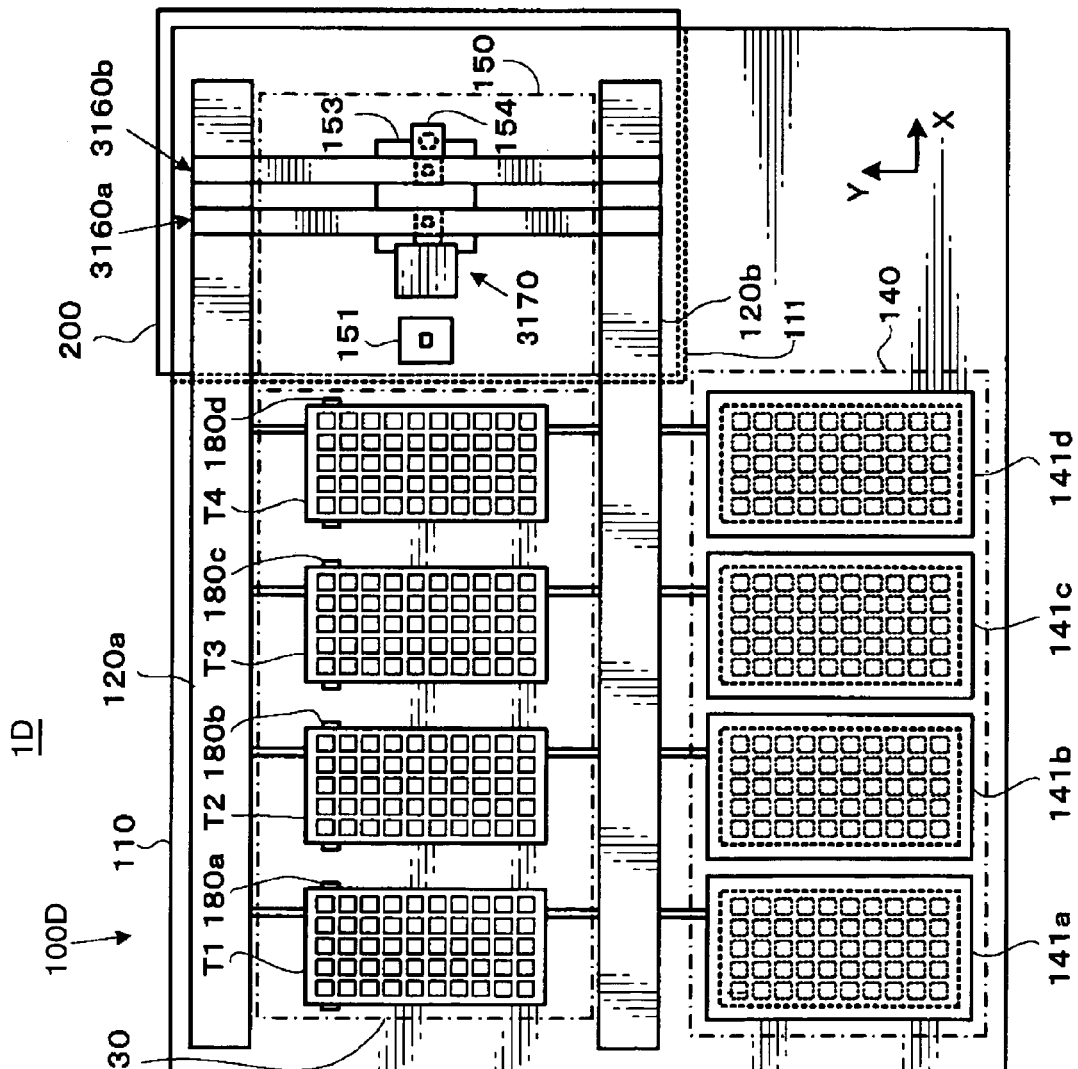
FIG. 28 is a top view of an electronic component inspection apparatus according to a fourth preferred embodiment of the present invention.

FIG. 28 is a top view of an electronic component inspection apparatus 1D according to a fourth preferred embodiment of the present invention. The electronic component inspection apparatus 1D shown in this figure includes, as an electronic component transfer unit that transfers the electronic components D, such an electronic component transfer unit 100D as described below. The electronic component inspection apparatus 1D is preferably configured by combining the electronic component transfer unit 100D and the electronic component inspection unit 200.

The electronic component transfer unit 100D preferably includes the base stand 110, the two X-axis robots 120a, 120b, the tray disposition area 130, the stocker disposition area 140, the inspection area 150, components transfer mechanisms 3160a, 3160b, an X-direction tray transfer mechanism 3170, the Y-direction tray transfer mechanism 180a to 180d, a control portion, and other elements.

Figure 29:
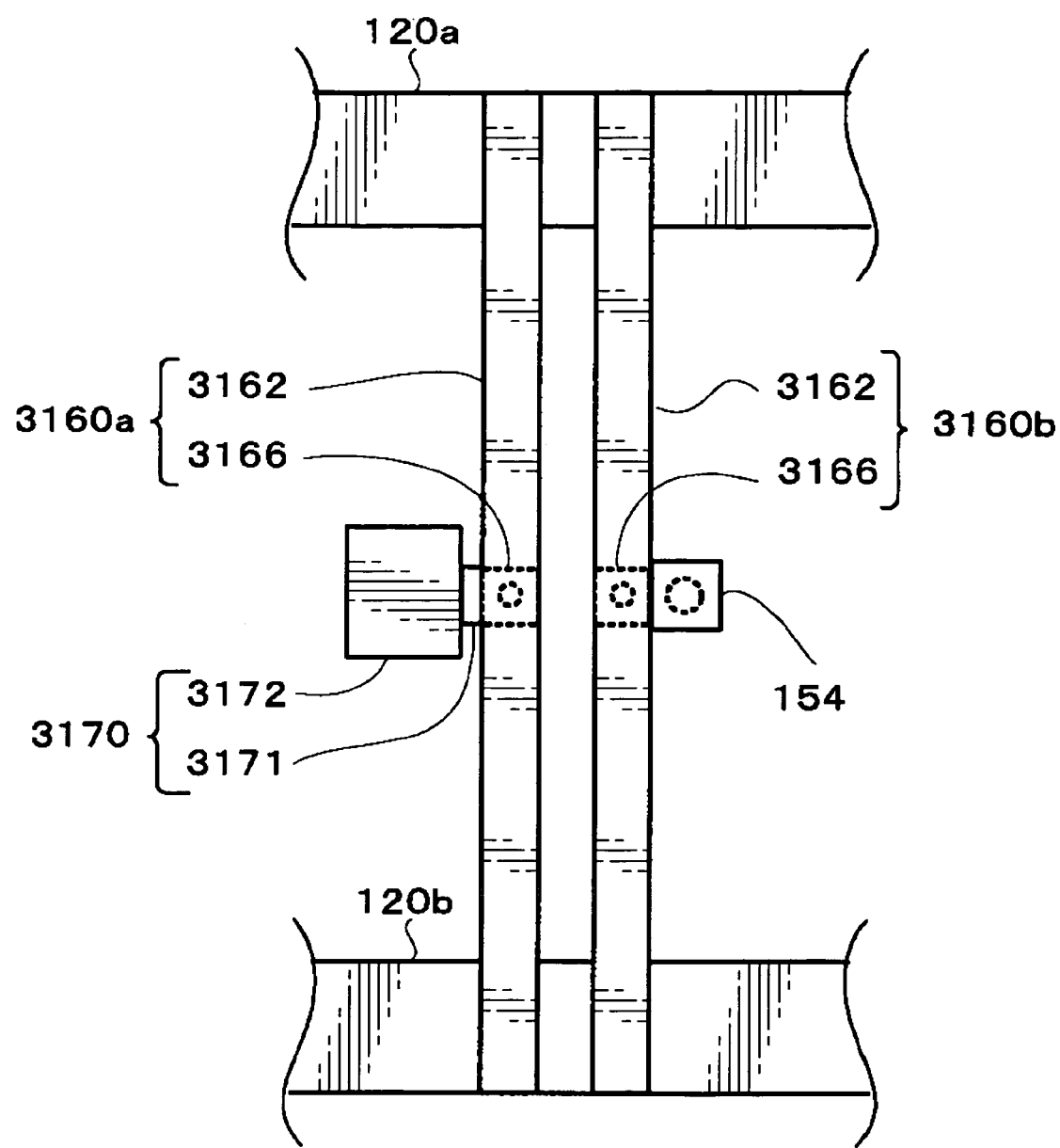
FIG. 29 is an enlarged top view of a components transfer mechanism in the electronic component inspection apparatus according to the fourth preferred embodiment of the present invention.
Figure 30:
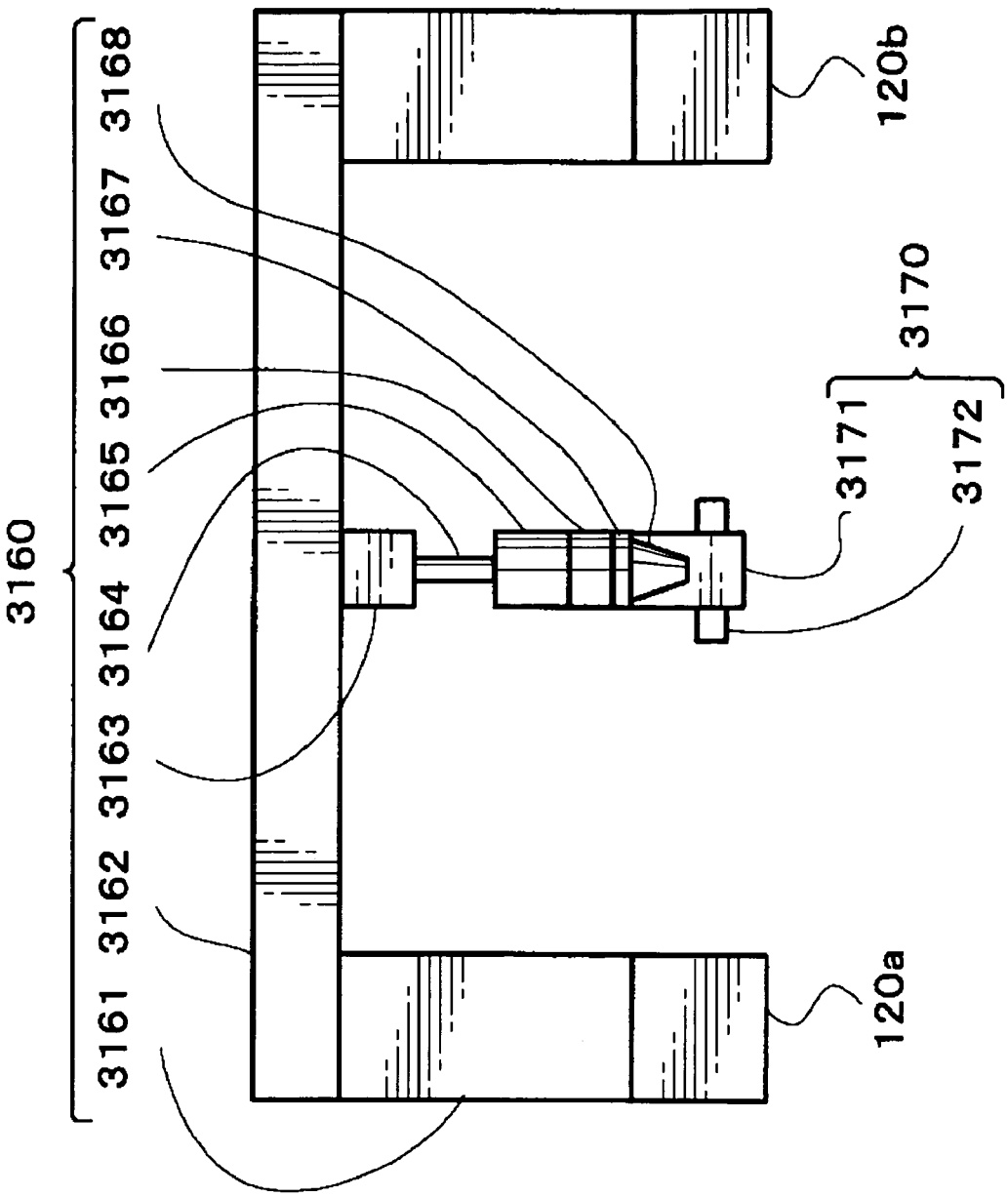
FIG. 30 is an enlarged side view of a components transfer mechanism in the electronic component inspection apparatus according to the fourth preferred embodiment of the present invention.

FIG. 29 and FIG. 30 are an enlarged top view and side view of the components transfer mechanism 3160 (3160a, 3160b).

As shown in the same figures, according to this preferred embodiment, the components transfer mechanisms 3160a, 3160b each includes, as its base, a Y-axis robot 3162 which extends between both X-axis robots 120a, 120b. More specifically, each of the components transfer mechanisms 3160a, 3160b preferably includes a pair of X-direction drive portions 3161 which are provided in each X-axis robot 120a, 120b, the Y-axis robot 3162 which is supported across these X-direction drive portions 3161, a Z-direction drive portion 3163 which is moved in the Y-axis direction by the Y-axis robot 3162, an R-direction drive portion 3165 which is connected to the Z-direction drive portion 3163, a suction head body 3166 which is connected to the R-direction drive portion 3165, a suction-nozzle support member 3167 which is connected to the suction head body 3166, a suction nozzle 3168, and other suitable elements.

Each X-direction drive portion operates to move the Y-axis robot 3162 in the Y-axis direction. On the other hand, the Y-axis robot 3162 operates to move the Z-direction drive portion 3163 and the like in the Y-axis direction. As a result, the suction nozzle 3168 is moved in the X-axis and Y-axis directions. Then, the Z-direction drive portion 3163 and the R-direction drive portion 3165 operate to move (i.e., lift) the suction nozzle 3168 in the Z-axis direction, and to rotate the suction nozzle 3168 about the R axis.

With respect to the components transfer mechanisms 3160a, 3160b, in the components transfer mechanism 3160a on one side, the X-direction tray transfer mechanism 3170 is provided and has the same configuration as the X-direction tray transfer mechanism 170 according to the first preferred embodiment. In the suction head body 3166 of the components transfer mechanism 3160b on the other side, the inspection-position confirmation camera 154 is provided.

The inspection plate 153 is disposed in the inspection area 150, which includes the inspection sockets 152a, 152b. But between the inspection plate 153 and the tray disposition area 130, as the component position confirmation camera 151, only one camera is preferably provided (see FIG. 13A).

As described above, the electronic component transfer unit 100D is provided with the components transfer mechanisms 3160a, 3160b, which include a combination of the X-axis robots 120a, 120b, the Y-axis robot 3162 and other suitable elements. By combining such an electronic component transfer unit 100D and the electronic component inspection unit 200, an electronic component inspection apparatus 1D can be configured.

Figure 31:
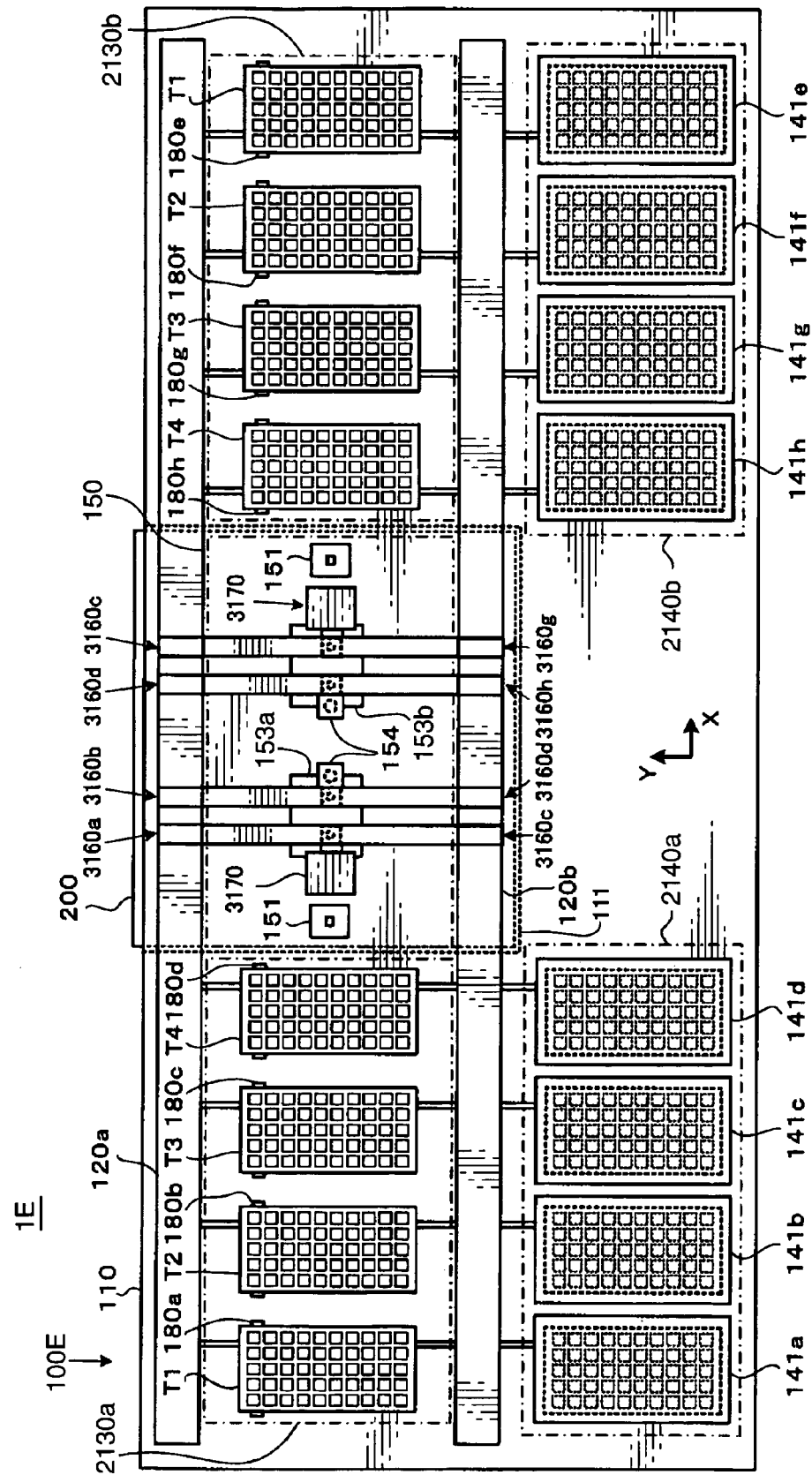
FIG. 31 is a top view of an electronic component inspection apparatus according to a fifth preferred embodiment of the present invention.

FIG. 31 is a top view of an electronic component inspection apparatus 1E according to a fifth preferred embodiment of the present invention. The electronic component inspection apparatus 1E shown in this figure includes, as an electronic component transfer unit that transfers the electronic components D, such an electronic component transfer unit 100E as described below. The electronic component inspection apparatus is preferably configured by combining the electronic component transfer unit 100E and the electronic component inspection unit 200.

In the electronic component transfer unit 100E shown in this figure, the two tray disposition areas 2130a, 2130b are arranged such that the inspection area 150 is located between the min the X-axis direction. The stocker disposition areas 2140a, 2140b are arranged so as to correspond to these tray disposition areas 2130a, 2130b.

Similar to the fourth preferred embodiment, four components transfer mechanisms 3160a to 3160d are arranged to extend between the X-axis robots 120a, 120b. Among these components transfer mechanisms 3160a to 3160d, in each of the components transfer mechanisms 3160a, 3160c disposed at both outer areas, the X-direction tray transfer mechanism 3170 is provided. On the other hand, in each of the components transfer mechanisms 3160b, 3160d at the inner areas, the inspection-position confirmation camera 154 is provided. The basic configuration of the X-direction tray transfer mechanism 3170 is preferably the same as that of the X-direction tray transfer mechanism 170 according to the first preferred embodiment.

The trays T1 to T4 are disposed in each tray disposition area 2130a, 2130b. In the stocker disposition areas 2140a, 2140b, stocker disposition areas 141a to 141d and 141e to 141h, are disposed, respectively.

In the inspection area 150, the pair of inspection plates 153a, 153b each of which includes the inspection sockets 152a, 152b are disposed adjacent to each other in the X-axis direction. Between each inspection plate 153a, 153b and the tray disposition areas 2130a, 2130b at the outer portions thereof (i.e., at the outer areas in the Y-axis direction) the component position confirmation camera 151 is disposed, respectively.

In other words, in the electronic component inspection apparatus 1E, as described above, including the components transfer mechanisms 3160a, 3160b extending between the X-axis robots 120a, 120b, the electronic component D is inspected while the electronic component D is being transferred between the inspection plate 153a on the one side and the tray disposition area 2130a.

On the other hand, apart from this, using the components transfer mechanisms 3160c, 3160d, the electronic component D is inspected while the electronic component D is being transferred between the inspection plate 153b on the other side and the tray disposition area 2130b.

The electronic component inspection apparatus 1E includes double the configuration of the electronic component inspection apparatus 1D according to the fourth preferred embodiment. This makes it possible to inspect the electronic component D more efficiently than in the electronic component inspection apparatus 1D according to the fourth preferred embodiment.

Figure 32:
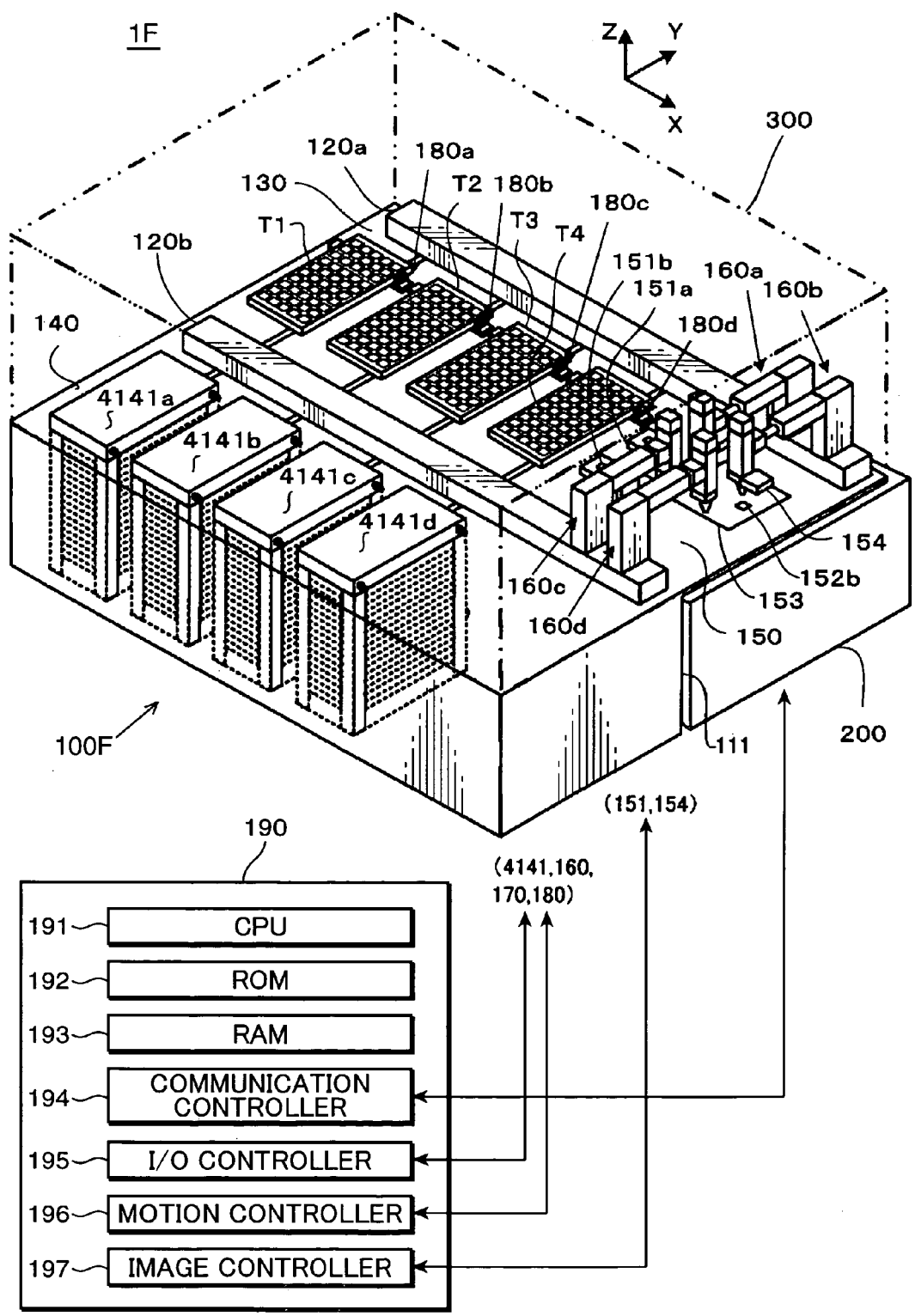
FIG. 32 is a perspective view of an electronic component inspection apparatus according to a sixth preferred embodiment of the present invention.

FIG. 32 is a perspective view of an electronic component inspection apparatus 1F according to a sixth preferred embodiment of the present invention. The electronic component inspection apparatus 1F shown in this figure includes, as an electronic component transfer unit that transfers the electronic components D, such an electronic component transfer unit 100F as described below. The electronic component inspection apparatus 1F is preferably configured by combining the electronic component transfer unit 100F and the electronic component inspection unit 200.

In the electronic component inspection apparatus 1F according to the sixth preferred embodiment, each stocker 4141 (or 4141a to 4141d) of the stocker disposition area 140 is disposed below the base stand 110. This helps lower the electronic component inspection apparatus 1F, and in this respect, it is different in configuration from the electronic component inspection apparatus 1A according to the first preferred embodiment. This will be described in detail below. The stockers 4141a to 4141d each preferably have the same configuration, and thus, in the following description, each stocker 4141a to 4141d is not distinguished and thus is explained with reference to the stocker 4141, unless they should especially be distinguished.

Figure 33:
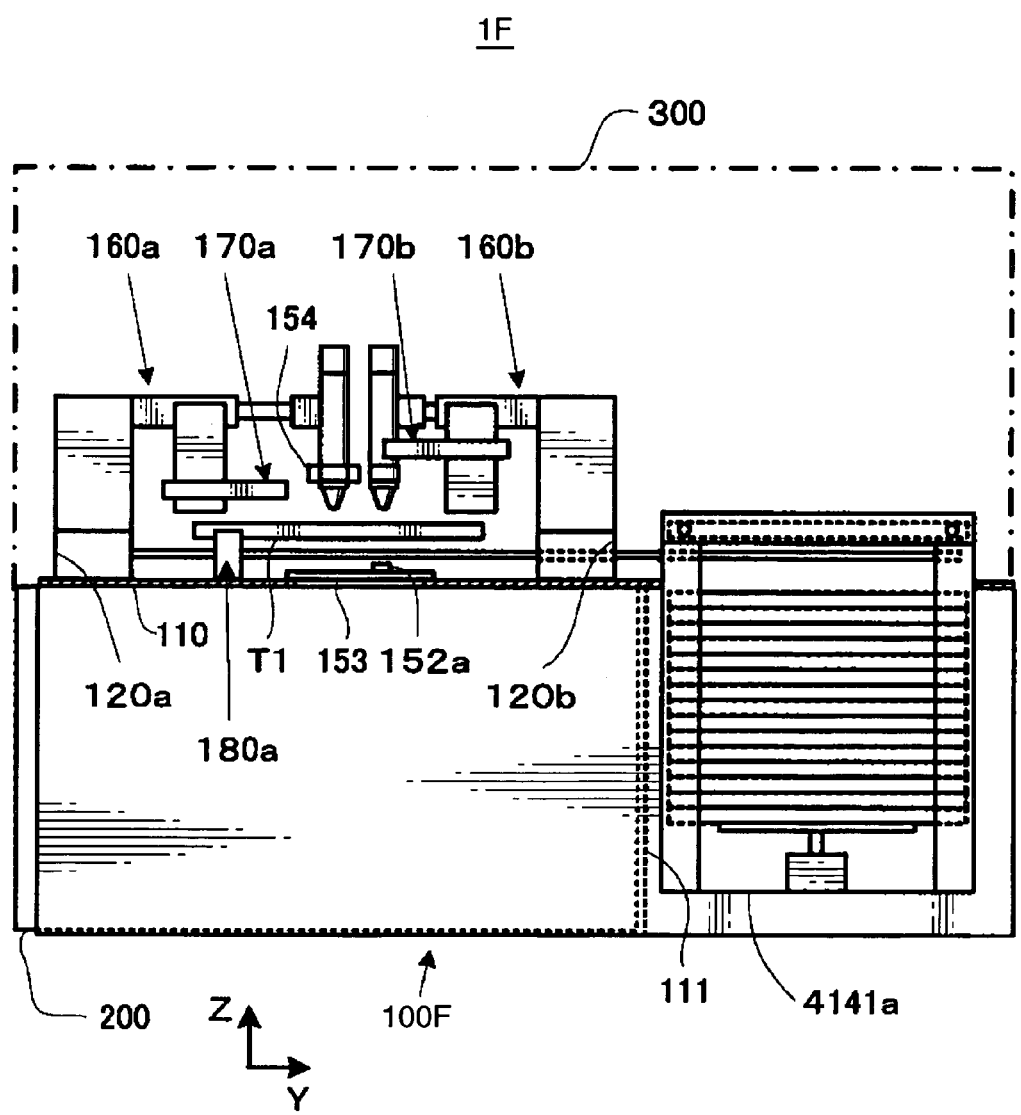
FIG. 33 is a side view of the electronic component inspection apparatus according to the sixth preferred embodiment, seen from the X-axis direction in FIG. 32.
Figure 34:
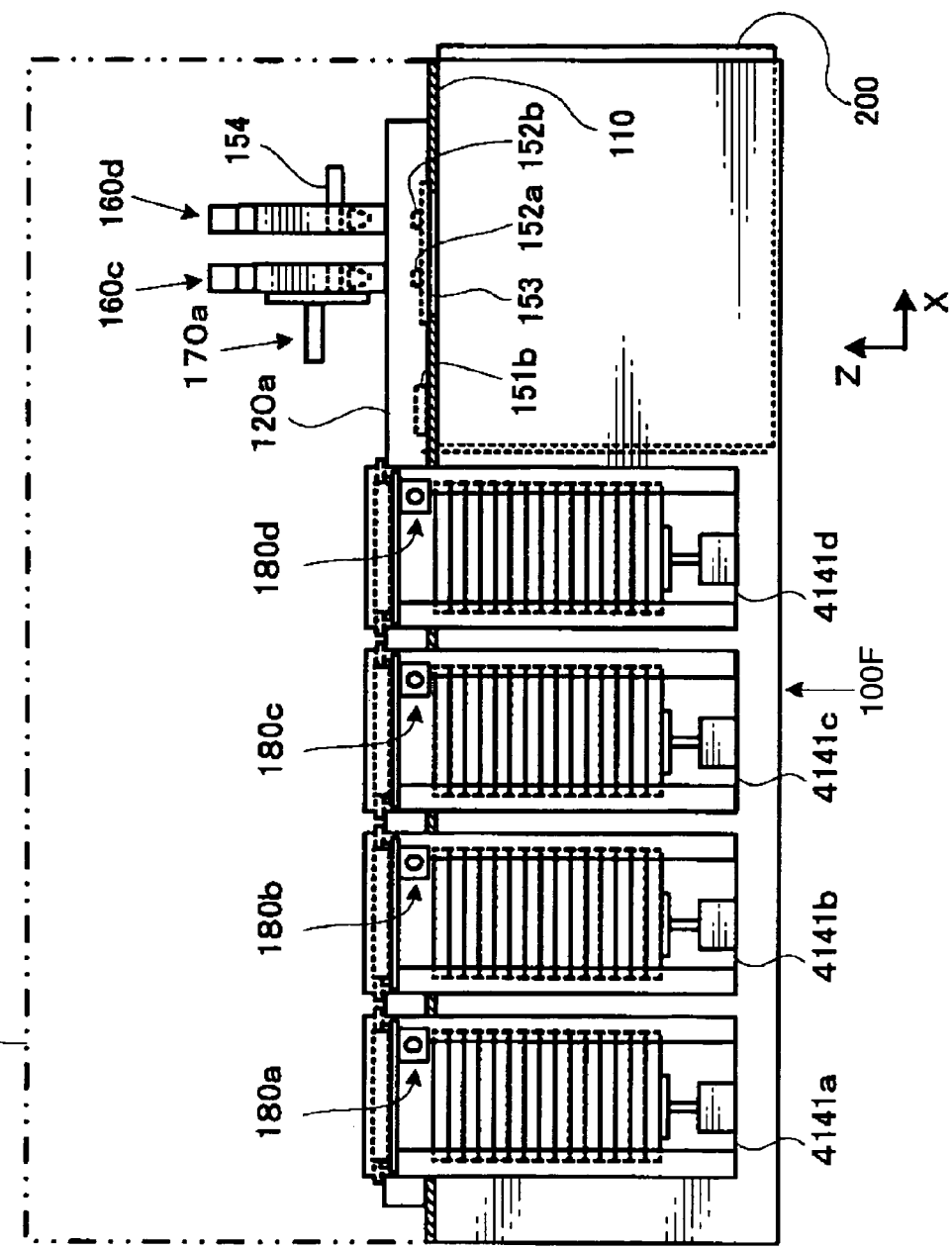
FIG. 34 is a front view of the electronic component inspection apparatus according to the sixth preferred embodiment, seen from the Y-axis direction in FIG. 32.
Figure 35:
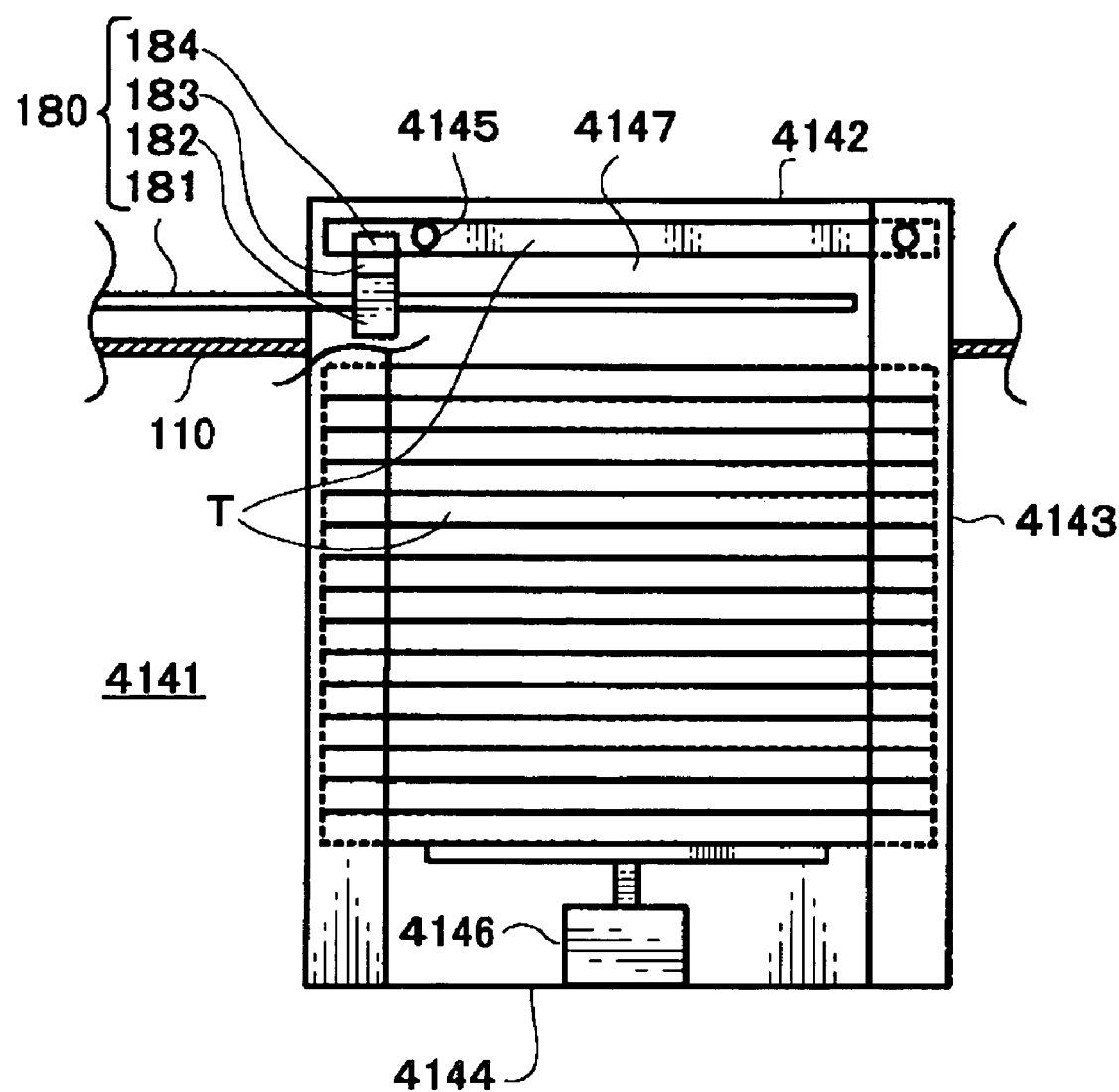
FIG. 35 is an enlarged side view of a stocker in the electronic component inspection apparatus according to the sixth preferred embodiment of the present invention.
Figure 36:
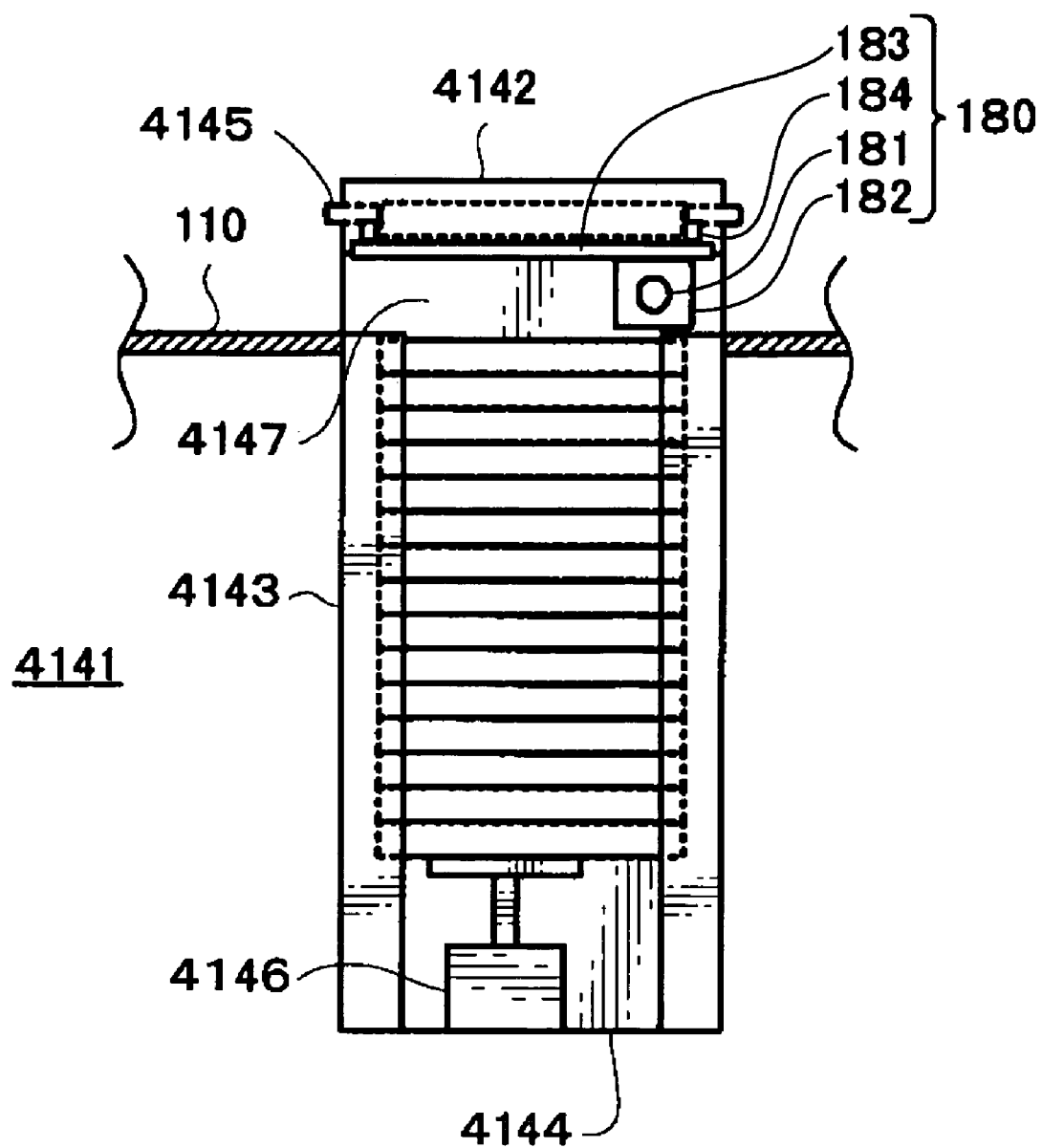
FIG. 36 is an enlarged front view of the stocker in the electronic component inspection apparatus according to the sixth preferred embodiment of the present invention.

FIG. 33 and FIG. 34 are a side view and a front view of the electronic component inspection apparatus 1F, seen from the X and Y-axis directions in FIG. 32, respectively. FIG. 35 and FIG. 36 are a side view and a front view of the configuration of the stocker 4141, respectively.

The stocker 4141 preferably includes a lid portion 4142, four struts 4143, a bottom portion 4144, four tray separation hooks 4145, and a tray lift mechanism 4146. Inside of the stocker 4141, a tray-transfer-mechanism entry region 4147 is formed and arranged such that the Y-direction tray transfer mechanism 180 can enter. The lid portion 4142, the upper portion of the struts 4143, the tray separation hooks 4145 and the tray-transfer-mechanism entry region 4147 are disposed above (or on the upper portion of) the upper surface of the base stand 110. The lower portion of the struts 4143, the bottom portion 4144 and the tray lift mechanism 4146 are disposed below (or on the lower portion of) the upper surface of the base stand 110.

The lid portion 4142 has an outside appearance of a substantially rectangular parallelepiped shape, and its lower portion is opened. The lid portion 4142 has the tray-transfer-mechanism entry region 4147 inside, and in its side plane on the side of the tray disposition area 130, it has an opening that leads to the tray-transfer-mechanism entry region 4147. In addition, the two pairs of tray separation hooks 4145 are connected to it.

The strut 4143 is connected to each of the four corners of the lid portion 4142. The strut 4143 preferably is a pillar which has a substantially L-shape section and corresponds to each of the four corners of the tray T and holds the tray T in the X-axis direction and the Y-axis direction.

The bottom portion 4144 is connected to the strut 4143, and preferably includes a bottom plate that preferably has a substantially rectangular shape, and four side plates. The side plates may also be excluded, and in that case, the struts 4143 are connected directly to the bottom plate which is the bottom portion 4144.

The tray separation hooks 4145 are disposed in the lid portion 4142 on the opposite sides to each other of the tray T, so as to hold the tray T inside of the tray-transfer-mechanism entry region 4147. The tray separation hook 4145 is inserted into the concave portion of the tray T, so that the tray T can be held. A drive mechanism (not shown) is connected to the tray separation hooks 4145, and the tray separation hooks 4145 are inserted into the concave portions on the sides of the tray T and are removed from them. By the insertion and removal, the tray T is fixed and removed.

The tray lift mechanism 4146 has a flat plate (or a tray placement plate) which the trays T that are piled are placed on, and that can be moved up and down. The flat plate is a mechanism that lifts and lowers the piled trays T inside of the stocker 4141.

The tray-transfer-mechanism entry region 4147 is a space that preferably has a substantially rectangular parallelepiped shape that is set inside of the lid portion 4142. The Y-direction tray transfer mechanism 180 moves into it and out of the tray-transfer-mechanism entry region 4147, from the positive Y-axis direction, through the opening on the side of the lid portion 4142.

Figure 37A:
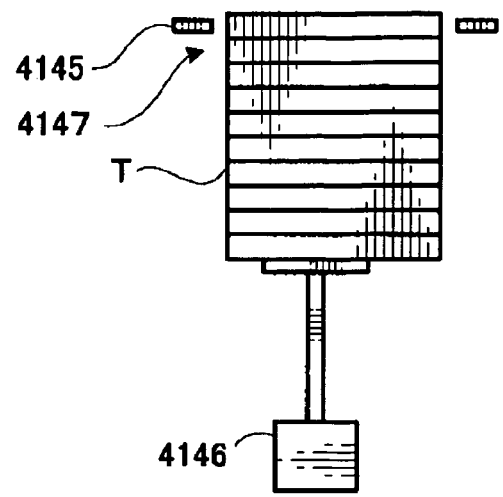
FIGS. 37A-37C are representations showing a movement of a tray T in the stocker of the electronic component inspection apparatus according to the sixth preferred embodiment of the present invention.
Figure 37B:
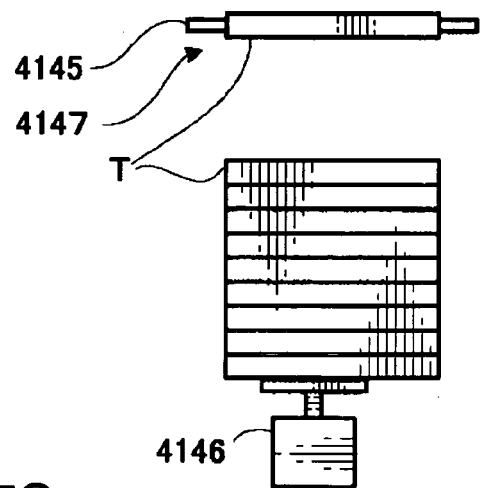
Figure 37C:
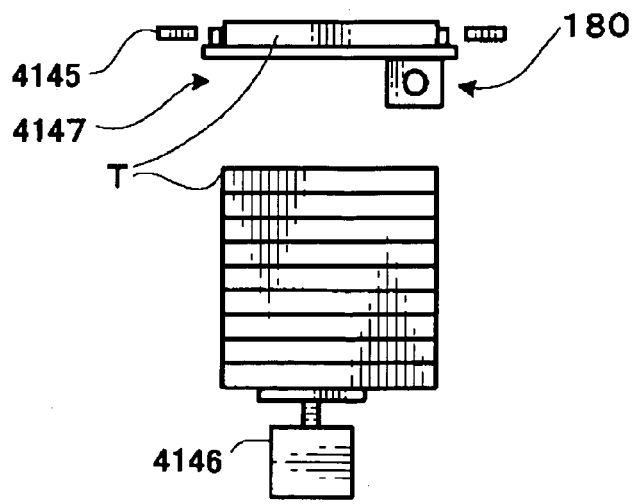

An operation for the movement of the tray T from the inside of the stocker 4141 to the tray disposition area 130 will be described using the illustrations in FIGS. 37A-37C.

(1) First, the tray lift mechanism 4146 operates to lift the tray placement plate. Then, within the tray-transfer-mechanism entry region 4147, the uppermost tray T is set to a height position that corresponds to the tray separation hooks 4145 (see FIG. 37A). The Y-direction tray transfer mechanism 180 is kept outside of the tray-transfer-mechanism entry region 4147.

(2) The tray lift mechanism 4146 operates to fix the uppermost tray T within the tray-transfer-mechanism entry region 4147.

(3) The tray lift mechanism 4146 operates to move the tray placement plated down. As a result, the piled trays descend together, and only the tray T that is fixed to the tray separation hooks 4145 is held within the tray-transfer-mechanism entry region 4147 (see FIG. 37B).

(3) The Y-direction tray transfer mechanism 180 moves into the tray-transfer-mechanism entry region 4147. Then, the tray separation hooks 4145 is removed, and the tray T is placed onto the Y-direction tray transfer mechanism 180 (see FIG. 37C).

In this way, the tray T that has been placed on the Y-direction tray transfer mechanism 180 is fixed to the tray placement portion 183. Then, the Y-direction tray transfer mechanism 180 retreats from the tray-transfer-mechanism entry region 4147. As a result, the tray T is transferred from the tray-transfer-mechanism entry region 4147, and is placed in the tray disposition area 130.

On the other hand, the movement and placement of the tray T from the tray disposition area 130 to the inside of the stocker 4141 is performed as described below.

(1) First, with the tray T kept in its place on the Y-direction tray transfer mechanism 180, the Y-direction tray transfer mechanism 180 moves into the tray-transfer-mechanism entry region 4147 from the tray disposition area 130. Thereby, the tray T is transferred to the inside of the stocker 4141 (see FIG. 37C).

(2) The state is removed in which the tray T is fixed by the tray fixing portions 184 of the Y-direction tray transfer mechanism 180. Then, the tray separation hooks 4145 operate to fix the tray T. Thereafter, the Y-direction tray transfer mechanism 180 comes out of the tray-transfer-mechanism entry region 4147 (see FIG. 37B).

(3) The tray lift mechanism 4146 operates to move the, tray placement plate up. Then, when the trays T that are piled on the tray placement plate come into contact with the bottom surface of the tray T, which is fixed by the tray separation hooks 4145, the tray separation hooks 4145 are removed. As a result, all the trays T inside of the stocker 4141 are placed on the tray placement plate of the tray lift mechanism 4146 (see FIG. 37A).

(4) The tray lift mechanism 4146 operates to move the tray placement plate down. As a result, the piled trays T move down all together inside of the stocker 4141.

In such a manner as described above, the tray T on the tray disposition area 130 is placed in the uppermost portion inside of the stocker 4141.

In such a manner as described above, in the electronic component inspection apparatus 1F according to the sixth preferred embodiment, the component which protrudes above the base stand 110 can be kept down. Thus, there is an advantage in that the electronic component inspection apparatus 1F can be made lower and more compact.

Figure 38:
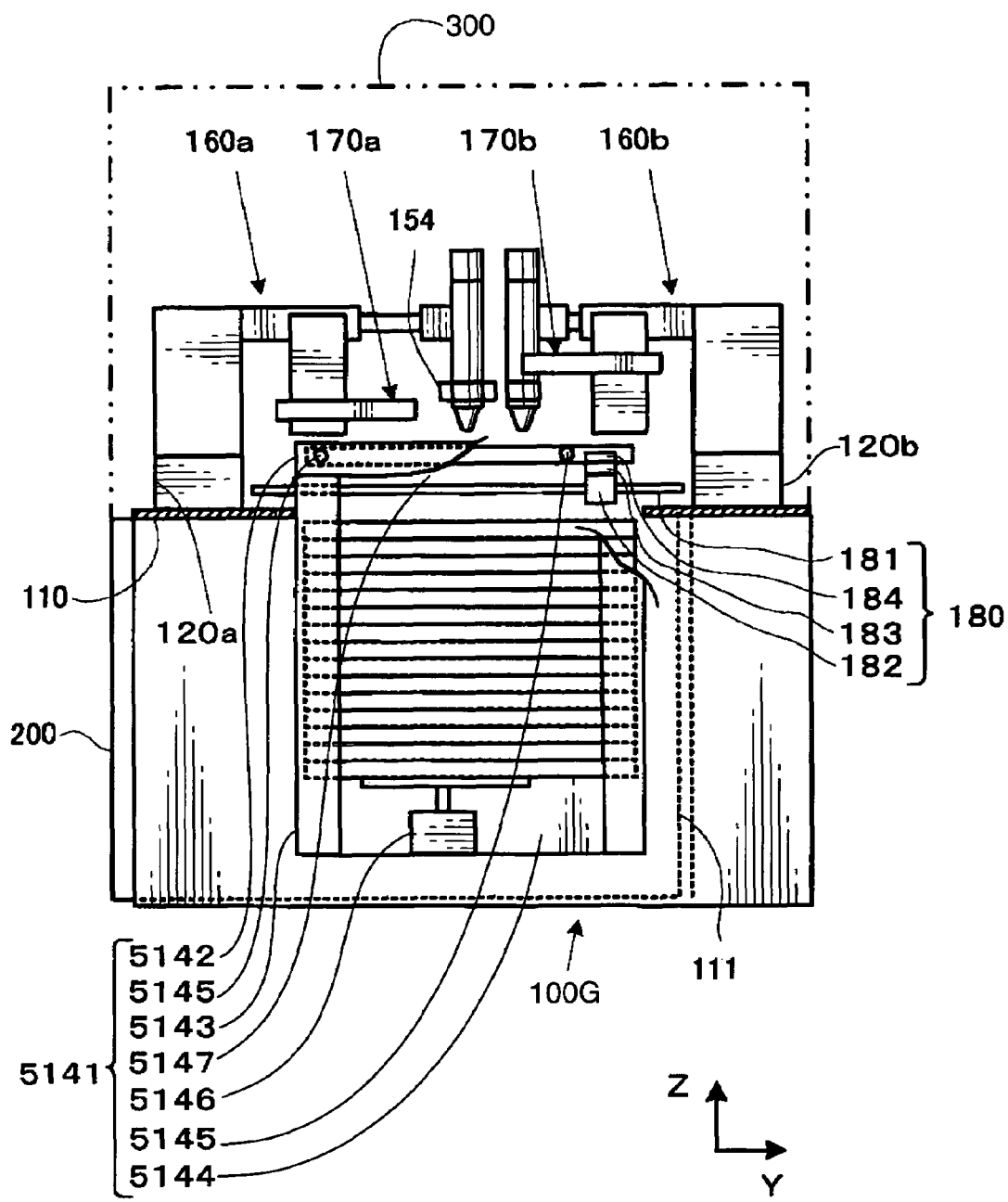
FIG. 38 is a side view of an electronic component inspection apparatus according to a seventh preferred embodiment of the present invention.

FIG. 38 is a perspective view of an electronic component inspection apparatus 1G according to a seventh preferred embodiment of the present invention. The electronic component inspection apparatus 1G shown in this figure includes, as an electronic component transfer unit that transfers the. electronic components D, such an electronic component transfer unit 100G as described below. The electronic component inspection apparatus 1G is preferably configured by combining the electronic component transfer unit 100G and the electronic component inspection unit 200.

In the electronic component inspection apparatus 1G according to the seventh preferred embodiment, a stocker 5141 is disposed in the tray disposition area 130 of the base stand 110. In other words, the tray disposition area 130 and the stocker disposition area 140 are used in common, thereby making such an apparatus smaller. In this respect, it is different in configuration from the electronic component inspection apparatus 1A according to the first preferred embodiment. This will be described in detail below. The stockers each preferably have the same configuration, for example, so as to correspond to the trays T1 to T4. Thus, in the following description, the stockers are each described with reference to a stocker 5141, without distinguishing them especially.

The stocker 5141 preferably includes a lid portion 5142 (a portion of which is cut off in FIG. 38), four struts 5143, a bottom portion 5144, four tray separation hooks 5145, a tray lift mechanism 5146, and other suitable elements. Inside of the stocker 5141, a tray-transfer-mechanism entry region 5147 is provided and arranged to allow the Y-direction tray transfer mechanism 180 to enter. The lid portion 5142, the upper portion of the struts 5143, the tray separation hooks 5145 and the tray-transfer-mechanism entry region 5147 are disposed above (or on the upper portion of) the upper surface of the base stand 110. The lower portion of the struts 5143, the bottom portion 5144 and the tray lift mechanism 5146 are disposed below (or on the lower portion of) the upper surface of the base stand 110.

According to this preferred embodiment, the lid portion 5142 is preferably defined mainly by two side plates. Both its upper and lower portions, and both sides in the Y-axis direction, are opened. The lid portion 5142 has a tray-transfer-mechanism entry region 5147 inside. In addition, two pairs of tray separation hooks 5145 are provided.

The lid portion 5142 is opened upward so that the components transfer mechanisms 160 can pick up and release the electronic component D from and to the tray T inside from the lid portion 5141 (i.e., within the tray-transfer-mechanism entry region 5147). The tray T is fixed by either the Y-direction tray transfer mechanisms 180 or the tray separation hooks 5145. In this state, the electronic components D are suctioned/picked up and released.

The tray T can be transferred in the X-axis direction by the X-direction tray transfer mechanism 170. This is the same as in the first to sixth preferred embodiments.

According to this preferred embodiment, the suction head 166 has access to an area above the uppermost tray T (because the lid portion 5142 is opened upward). Therefore, the trays T that are kept stored and piled in the stocker 5141 can be used in that state, and the electronic components D can be inspected.

In the electronic component inspection apparatus 1G according to the seventh preferred embodiment, as described above, the stocker disposition area 140 can be used in common with the tray disposition area 130. This presents an advantage in that the electronic component inspection apparatus 1G becomes more compact.

According to the present preferred embodiment, the stocker 5141 is preferably disposed below the base stand 110. However, a stocker may also be disposed above the base stand 110. In that case, the lowermost tray T is moved down and placed over the tray disposition area 130.

Figure 39:
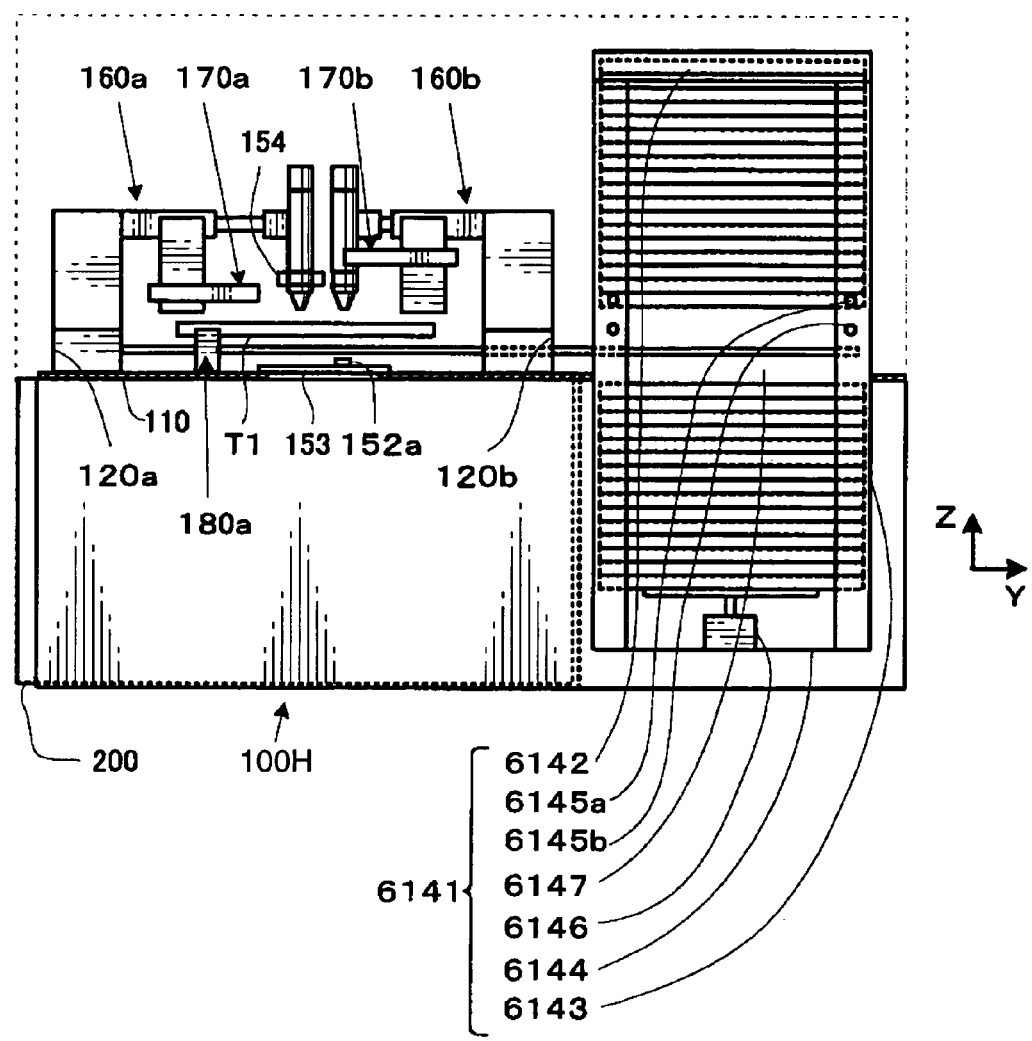
FIG. 39 is a side view of an electronic component inspection apparatus according to an eighth preferred embodiment of the present invention.

FIG. 39 is a perspective view of an electronic component inspection apparatus 1H according to an eighth preferred embodiment of the present invention. The electronic component inspection apparatus 1H shown in this figure includes, as an electronic component transfer unit that transfers the electronic component D, such an electronic component transfer unit 100H as described below. The electronic component inspection apparatus 1H is preferably configured by combining the electronic component transfer unit 11 0H and the electronic component inspection unit 200.

In the electronic component inspection apparatus 1H according to the eighth preferred embodiment, a stocker 6141 stores the trays T at each of its upper and lower portions. Thereby, the trays T can be stored efficiently. In this respect, it is different in configuration from the electronic component inspection apparatus 1A according to the first preferred embodiment. This will be described in detail below. Four stockers are disposed in the stocker disposition area 140. However, in the following description, each stocker is described with reference to the stocker 6141, without distinguishing them especially.

The stocker 6141 preferably includes a lid portion 6142, four struts 6143, a bottom portion 6144, two pairs of tray separation hooks 6145a, 6145b, and a tray lift mechanism 6146. Inside of the stocker 6141, a tray-transfer-mechanism entry region 6147 is provided and arranged such that the Y-direction tray transfer mechanism 180 can enter. The lid portion 6142, the upper portions of the struts 6143, the tray separation hooks 6145a, 6145b and the tray-transfer-mechanism entry region 6147 are disposed above (or on the upper portion of) the upper surface of the base stand 110. The lower portions of the struts 6143, the bottom portion 6144 and the tray lift mechanism 6146 are disposed below (or on the lower portion of) the upper surface of the base stand 110.

The trays T are stored in the upper and lower portions of the stocker 6141. The trays T that are stored in the upper portion are fixed by the tray separation hooks 6145a. The trays T that are stored in the lower portion are placed on a tray placement plate of the tray lift mechanism 6146.

The lid portion 6142 has an external shape of a substantially rectangular parallelepiped, and it is opened downward. The lid portion 6142 may also be shaped like a flat plate.

The strut 6143 is connected to each of the four corners of the lid portion 6142. The strut is preferably a pillar that has a substantially L-shape section and corresponds to each of the four corners of the tray T and holds the tray T in the X-axis direction and the Y-axis.

The bottom portion 6144 is connected to the strut 6143, and preferably includes a bottom plate that has a substantially rectangular shape, and four side plates. These side plates may also be excluded, and in that case, the struts 6143 are connected directly to the bottom plate, which is the bottom portion 6144.

The two pairs of tray separation hooks 6145a, 6145b are disposed up and down in the struts 6143. In each of the four struts 6143, the tray separation hooks 6145a, 6145b are disposed, and thus, the eight tray separation hooks 6145 are provided altogether in the struts 6143.

The tray separation hooks 6145a are disposed so as to fix the lowermost tray T on the upside in the stocker 6141. The tray separation hooks 6145a are also disposed to fix the tray T within the tray-transfer-mechanism entry region 6147.

The tray separation hooks 6145a, 6145b are each disposed so as to correspond to the sides opposite to each other of the tray T. The tray separation hooks 6145a, 6145b are inserted into the concave portion of the tray T, so that the tray T can be prevented from falling. A drive mechanism (not shown) is connected to the tray separation hooks 6145a, 6145b, and the tray separation hooks 6145a, 6145b are inserted into the concave portions on the sides of the tray T and are removed from them. Through the insertion and removal, the tray T is fixed and removed in the Z direction.

The tray lift mechanism 6146 has a flat plate (or a tray placement plate) which the trays T that are piled are placed on, and that can be moved up and down. The tray lift mechanism 6146 is a mechanism that lifts and lowers the piled trays T inside of the stocker 6141.

The tray-transfer-mechanism entry region 6147 is a space which has a substantially rectangular parallelepiped shape that is set between the trays T on the upside and downside. The Y-direction tray transfer mechanism 180 is arranged to enter and exit the tray-transfer-mechanism entry region 6147, from the positive Y-axis direction.

An operation for the movement of the tray T from the upper portion of the stocker 6141 to the tray disposition area 130 will be described using the illustrations in FIGS. 40A-40D.

(1) First, the tray lift mechanism 6146 operates to. lift the tray placement plate. Then, the uppermost tray T that is placed over the tray placement plate comes into contact with the bottom surface of a tray T0 (i.e., the lowermost tray T on the upside, the tray T0 to be moved), which is fixed by the tray separation hooks 6145a (see FIG. 40A).

(2) The tray separation hooks 6145a are removed, and the tray lift mechanism 6146 operates to move the trays T down by the height of one tray (i.e., move down the tray placement plate). Thereby, the tray T that is immediately above the tray T0 comes to the height position that corresponds to the tray separation hooks 6145a.

Figure 40C:
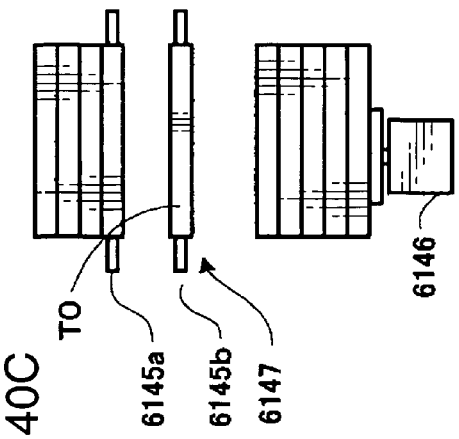
FIGS. 40A-40D are representations showing a movement of a tray T in the stocker of the electronic component inspection apparatus according to the eighth preferred embodiment of the present invention.
Figure 40D:
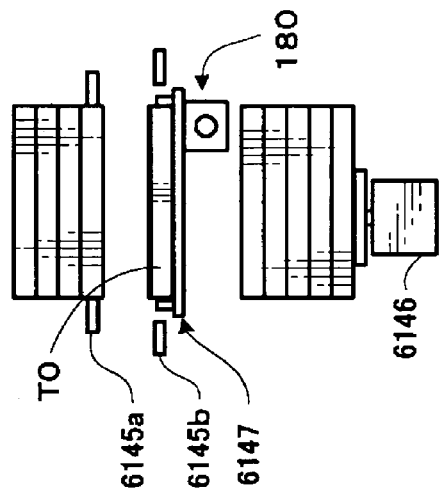
Figure 40A:
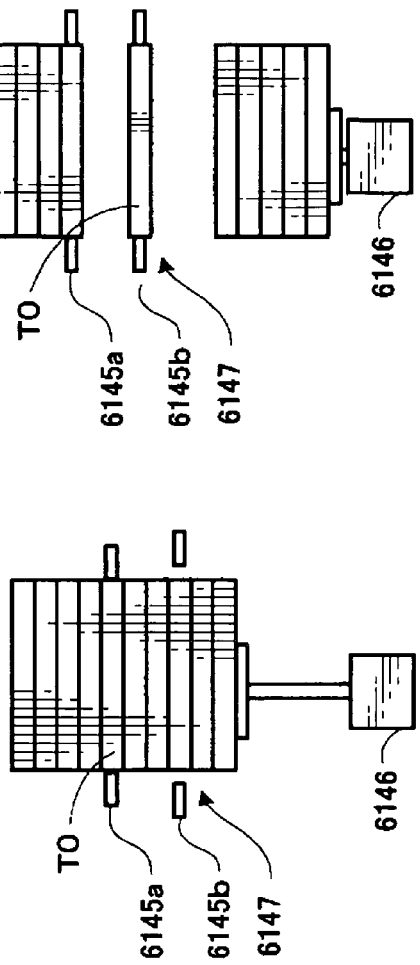
Figure 40B:
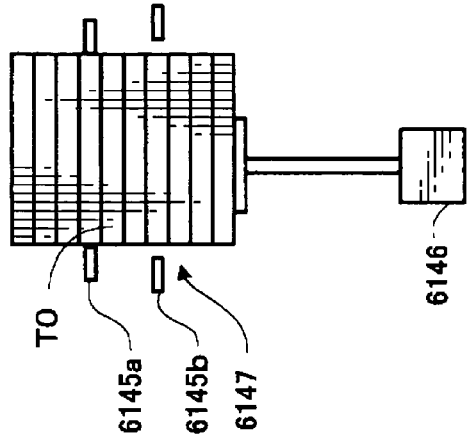

(3) The tray separation hooks 6145a operate to fix the tray T immediately above the tray T0 (i.e., the tray separation hooks 6145a are inserted into the concave portions on the sides of the tray T immediately above the tray T0) (see FIG. 40B).

(4) The tray lift mechanism 6146 operates to move the tray T0 down. At this time, the tray T immediately above the tray T0 is fixed by the tray separation hooks 6145a.

Thereafter, the tray lift mechanism 6146 operates to move the tray T0 to the height position that corresponds to the tray separation hooks 6145b, or into the tray-transfer-mechanism entry region 6147.

(5) The tray separation hooks 6145b operate to fix the tray T0. Thereafter, the tray lift mechanism 6146 operates to move the tray placement plate down. As a result, only the tray T0 is fixed by the tray separation hooks 6145b, and the other trays are separated from the tray T0. In this state, the other trays are located both on an upside and downside of the stocker 6141, with both kept piled (see FIG. 40C).

(6) The Y-direction tray transfer mechanism 180 moves into the tray-transfer-mechanism entry region 6147. Then, the tray separation hooks 6145b are removed. As a result, the tray T0 is placed on the Y-direction tray transfer mechanism 180 (see FIG. 40D). Then, the Y-direction tray transfer mechanism 180 retreats from the tray-transfer-mechanism entry region 6147. As a result, the tray T0 is carried out from the inside of the stocker 6141, and is placed in the tray disposition area 130.

On the other hand, the movement and placement of the tray T from the tray disposition area 130 to the upper portion of the stocker 6141 are performed as described below.

(1) First, the tray T0 to be moved is placed on the Y-direction tray transfer mechanism 180. In this state, the Y-direction tray transfer mechanism 180 moves into the tray-transfer-mechanism entry region 6147 from the tray disposition area 130. Thereby, the tray T0 is transferred into the stocker 6141 (see FIG. 40D).

(2) The fixing of the tray T0 by the Y-direction tray transfer mechanism 180 is removed. On the other hand, the tray T0 is fixed by the tray separation hooks 6145b. Thereafter, the Y-direction tray transfer mechanism 180 retreats from the tray-transfer-mechanism entry region 6147 (see FIG. 40C).

(3) The tray lift mechanism 6146 operates to lift the tray placement plate. Then, the uppermost tray T is brought to the height position in which it comes into contact with the bottom surface of a tray T0. As a result, all the trays T are held by the tray lift mechanism 6146. In this state, the tray separation hooks 6145b are removed (see FIG. 40B).

(4) The tray lift mechanism 6146 operates to move the trays T up by the height of one tray. As a result, the tray T0 comes to the height position that corresponds to the tray separation hooks 6145a.

(5) The tray separation hooks 6145a operate to fix the tray T that is placed over the tray lift mechanism 6146 (see FIG. 40A). In this way, the tray T0 in the tray disposition area 130 is stored and fixed in the lowermost portion on the upside of the stocker 6141.

(6) The tray lift mechanism 6146 operates to move the tray placement plate down. At this time, the tray T0 is fixed by the tray separation hooks 6145a. As a result, it is held as it is, even though the tray placement plate descends.

In such a manner as described above, the tray T in the tray disposition area 130 is stored and fixed in the lowermost portion on the upside of the stocker 6141.

The tray T is stored in and removed from the lower portion of the stocker 6141, in the same way as according to the sixth preferred embodiment.

In the electronic component inspection apparatus 1H according to the eighth preferred embodiment, the tray T can be inserted into and removed from both portions above and below the tray-transfer-mechanism entry region 6147 in the stocker 6141. Hence, there is an advantage in that such a space can be used more efficiently.

Figure 41:
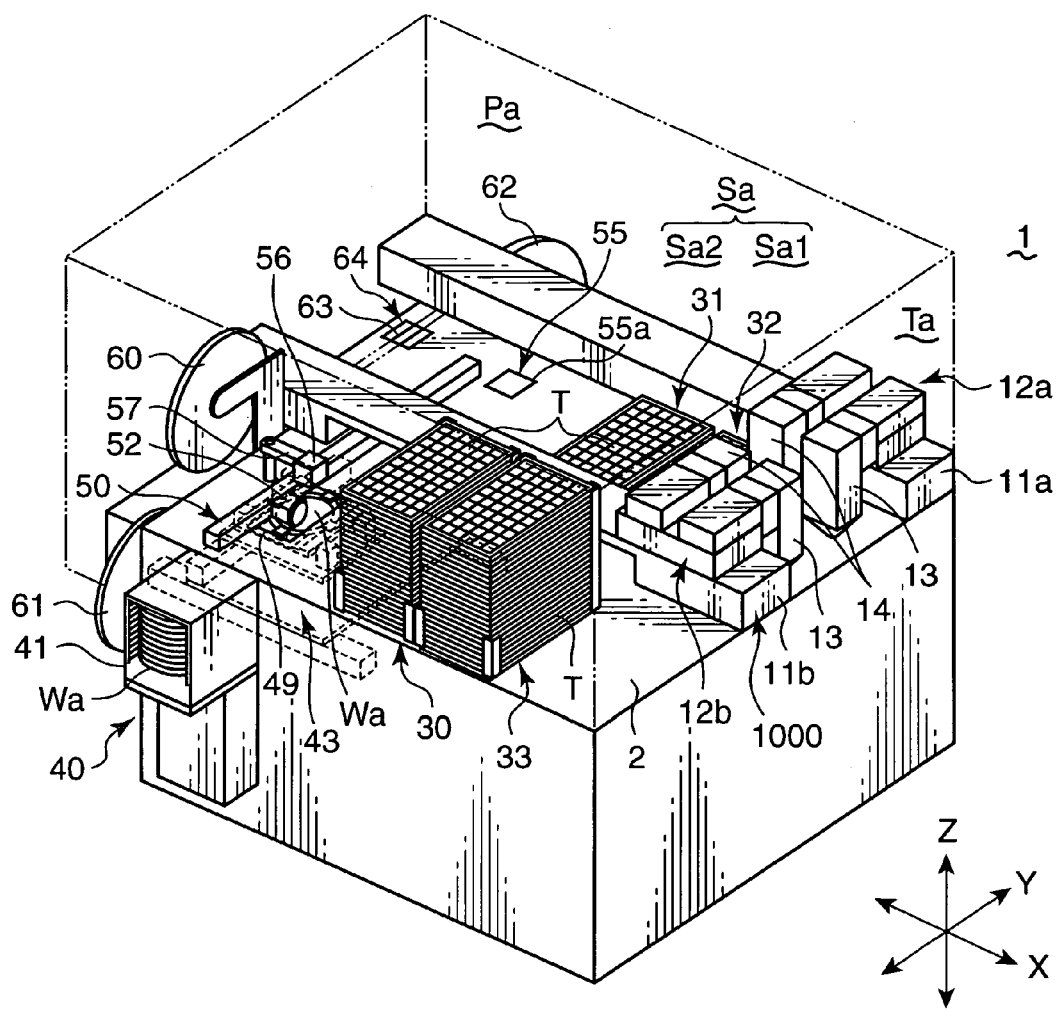
FIG. 41 is a perspective view of an electronic component inspection apparatus according to a ninth preferred embodiment of the present invention.
Figure 42:
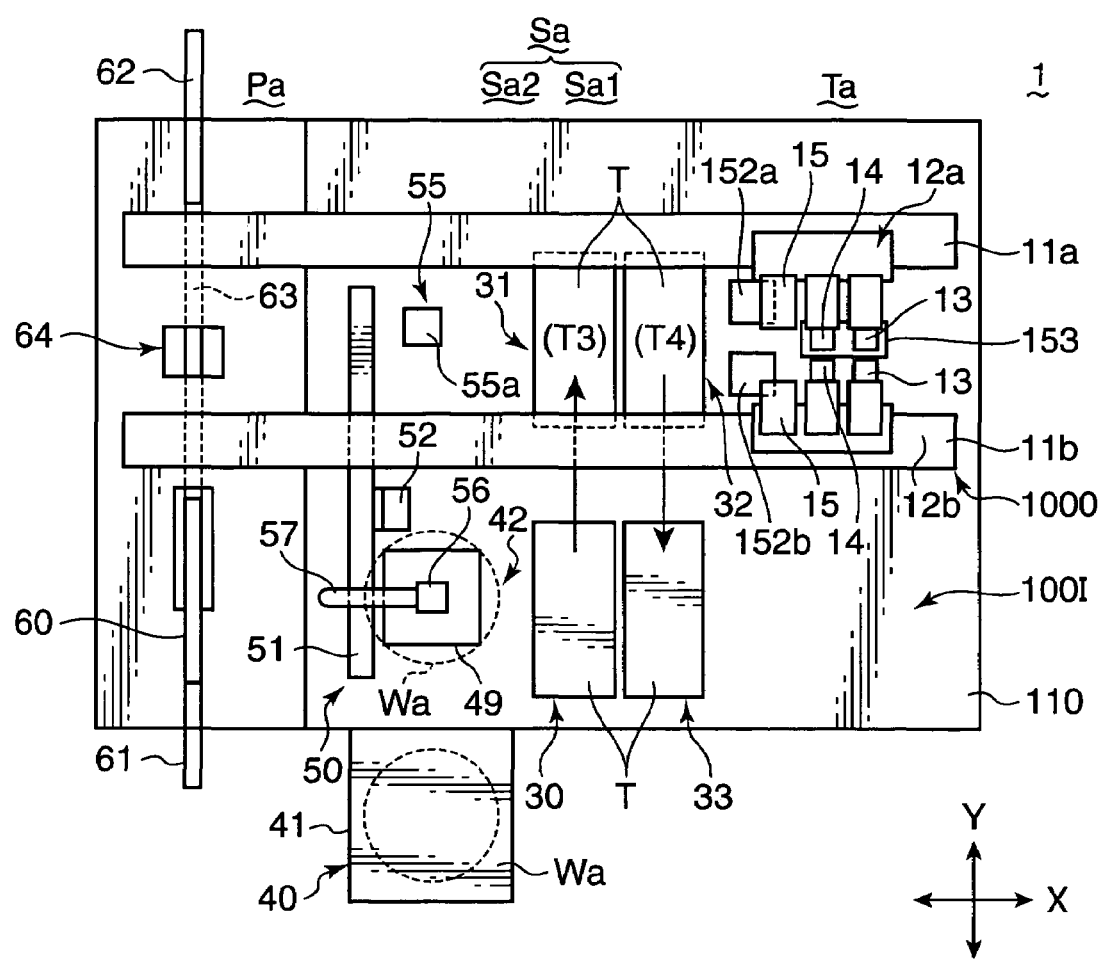
FIG. 42 is a top view of the electronic component inspection apparatus according to the ninth preferred embodiment of the present invention.

FIG. 41 and FIG. 42 are schematic views of an electronic component inspection apparatus 1I according to a ninth preferred embodiment of the present invention. FIG. 41 is a perspective view and FIG. 42 is a plan view, and each of them shows the electronic component inspection apparatus 1I.

The electronic component inspection apparatus 1I shown in this figure includes, as an electronic component transfer unit that transfers the electronic component D, such an electronic component transfer unit 100I as described below. The electronic component inspection apparatus 1I is configured preferably by combining the electronic component transfer unit 100I and the electronic component inspection unit 200 (not shown). Although the basic configuration according to the ninth preferred embodiment is similar to the electronic component inspection apparatus 1A according to the first preferred embodiment, there are a large number of differences in the specific configurations. Thus, the reference characters and numerals in the figures are not necessarily common to those according to the first preferred embodiment. Some of the components that are common to those according to the first preferred embodiment are described again here.

As shown in these figures, there are three areas on the base stand 110 of the electronic component transfer unit 100I. Specifically, there are an inspection area Ta in which electronic components are inspected, a components supply-and-discharge area Sa in which components before they are inspected are supplied and components after they have already been inspected (or components that do meet a predetermined standard) are discharged, and a tape component area Pa (hereinafter, referred to simply as the component area Pa) in which already-inspected components (or components that meet the predetermined standard) are stored in a tape for a tape feeder. As shown in the same figures, these areas Ta, Sa, Pa are arranged in line in the X-axis direction (i.e., in the example shown in the figures, in the order of the areas Ta, Sa, Pa in line from the right-hand side of the apparatus). On the base stand 110, a component transferring device 1000 is further disposed which transfers the components over the areas Ta, Sa, Pa.

The component transferring device 1000 preferably includes a pair of rail members 11a, 11b which are parallel to each other and spaced from each other by a certain distance in the Y-axis direction, and that extends over the areas Ta, Sa, Pa in the X-axis direction, and a pair of head units 12a, 12b (hereinafter, referred to as the first head unit 12a, the second head unit 12b) attached to the rail members 11a, 11b, respectively, and that can move in the Y-axis direction.

The head units 12a, 12b, preferably include a pair of heads 13, 14 each of which includes a nozzle for suctioning and picking up components (or the suction nozzle 16 as in FIG. 43), and a head 15 used for a tray which includes a nozzle for suctioning a tray (not shown), respectively. The tray head 15 is a member that corresponds to the X-direction tray transfer mechanism 170 according to the first preferred embodiment.

The heads 13 to 15 of each head unit 12a, 12b face each other and are arranged in line in the X-axis direction inside of the rail members 11a, 11b. Each head 13 to 15 can move in the Y-axis direction, relative to the body component of the head units 12a, 12b. The other heads 14, 15 can move in the X-axis direction relative to the one head 13. According to this configuration, each head 13 to 15 can move in the X-axis and Y-axis directions, relatively in the head units 12a, 12b. The suction nozzle 16 can move up (i.e., move in the Z-axis direction) and rotate (i.e., turn around the Z axis) with respect to each of the heads 13, 14.

In the inspection area Ta, there are disposed the inspection plate 153 which includes a pair of sockets (not shown), and the component position confirmation cameras 151a, 151b which capture the image of a state where a component is suctioned by the suction nozzle 16 of each of the heads 13, 14.

The components supply-and-discharge area Sa preferably includes two areas. More specifically, a tray area Sa1 is provided on the side (i.e., on the right-hand side in FIG. 42) of the inspection area Ta, and a wafer area Sa2 is provided on the side of the component area Pa.

The tray area Sa1 includes an empty-tray stand by portion 31 in which the tray T (i.e., the empty tray T3) for storing components stands by, a stocker 30 in which the empty trays T3 that are supplied to the empty-tray standby portion 31 are placed while being piled, a component storage portion 32 in which the tray T (i.e., the tray T2) that stores components that have been judged not to meet a predetermined standard, is placed, and a stocker 33 in which the trays T2 that store components that have been judged not to meet the predetermined standard are placed in a pile so that they can be discharged.

The empty-tray standby portion 31 and the component storage portion 32 are disposed adjacent to each other in the X-axis direction on the inside of both rail members 11a, 11b. In contrast, the stockers 30, 33 are disposed, with respect to the rail member 11b on one side (i.e., on the downside in FIG. 42), on the opposite side to the empty-tray standby portion 31 and the component storage portion 32 (i.e., on the outside of the rail member 11b), respectively. In other words, according to this preferred embodiment, the empty-tray standby portion 31 of the tray area Sa1 corresponds to the tray disposition area 130c according to the first preferred embodiment, the area of the component storage portion 32 corresponds to the tray disposition area 130d according to the first preferred embodiment, the area in which the stocker 30 is disposed corresponds to the stocker disposition area 140c according to the first preferred embodiment, and the area in which the stocker 33 is disposed corresponds to the stocker disposition area 140c according to the first preferred embodiment.

The tray area Sa1 also includes a tray movement mechanism which moves the tray T3 which is placed in the stocker 30 to the empty-tray standby portion 31, and a tray movement mechanism which moves, to the stocker 33, the tray T2 that has stored components (i.e., components that have been determined not to meet the predetermined standard) that has been placed in the component storage portion 32.

These tray movement mechanisms (i.e., the container moving device according to various preferred embodiments of the present invention) preferably have a common configuration. Such a configuration will be described below, using an example of the tray movement mechanism that moves the tray T between the empty-tray standby portion 31 and the stocker 30. In the following description, the tray T2 is not distinguished from the tray T3, and thus, the trays are described as the tray T, unless they especially need to be distinguished.

Figure 43:
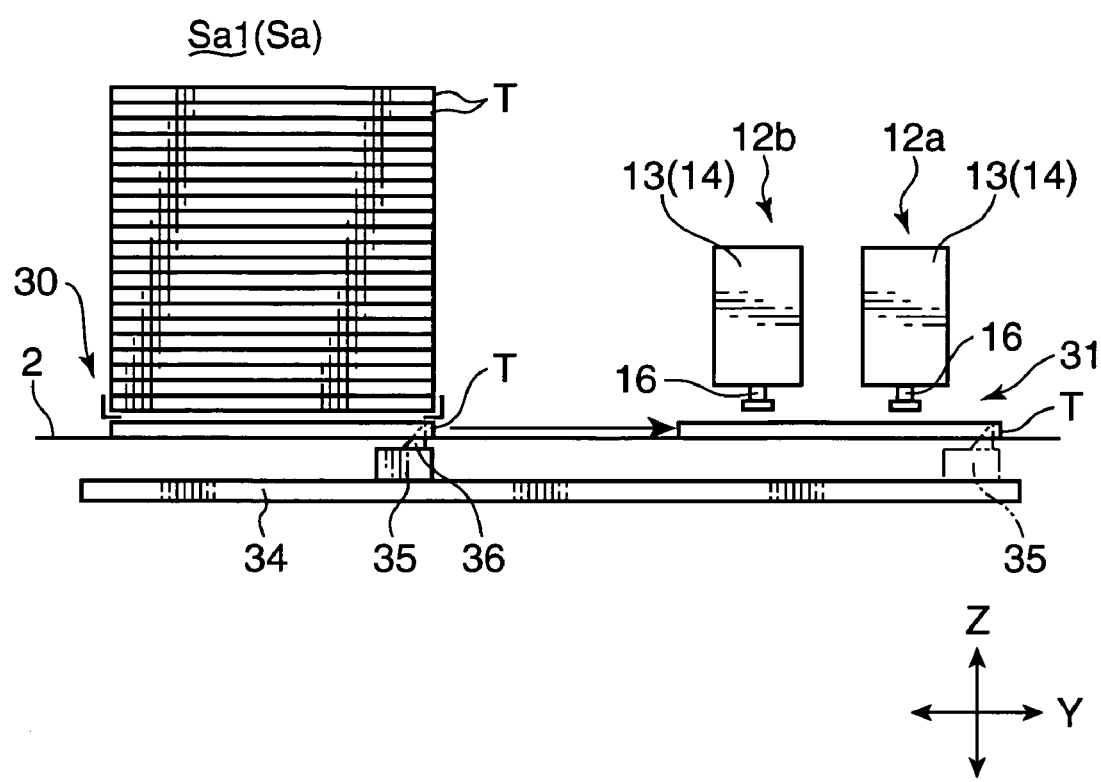
FIG. 43 is a side view of a tray movement mechanism, showing its configuration.

As schematically shown in FIG. 43, the tray movement mechanism preferably includes a rail member 34 which is disposed below the base stand 110 and extends in the Y-axis direction, a movement member 35 which is attached to the rail member 34 so as to move, and a lift-up unit (not shown)

which lifts up, from among the trays T piled on the stocker 30, the ones other than the lowermost tray T, so that the lowermost tray T can be separated from the other trays.

In the movement member 35, a hook 36 is provided which can hook the tray T from below and that can fall down. The hook 36 protrudes upward from the base stand, through an opening that is formed in the base stand 110 and is shaped like a long and narrow slit in the Y-axis direction. In this protrusion state, it can hook the tray T from below.

Specifically, as shown in the same figure, the lift-up unit operates to lift up, from among the trays T piled on the stocker 30, the trays other than the lowermost tray T. Then, the hook 36 protrudes upward from the base stand, and in this state, the movement member 35 is moved along the rail member 34. As the movement member 35 moves, the hook 36 hooks the lowermost tray T that is placed in the empty-tray placement portion 30. Then, the tray T is pulled out from the empty-tray placement portion 30, and is moved to the empty-tray standby portion 31. After it has been moved, the hook 36 is switched into a falling posture (i.e., retreats downward from the base stand). In this state, the movement member 35 is reset to the empty-tray placement portion 30, and thereby, the tray T is left at the empty-tray standby portion 31.

A tray movement mechanism between the component storage portion 32 and a tray discharge portion 33 is omitted and is not shown in any figure. However, the tray movement mechanism has practically the same configuration as described above. The tray T that lies in the component storage portion 32 is moved to the tray discharge portion 33, and then, it is inserted into the lowermost portion of the trays T that have already been piled in the tray discharge portion 33.

The wafer area Sa2 includes a component standby portion 55 in which a bare chip (or a chip component) as a component stands by, a cassette setting portion 40 which sets a cassette 41 that has stored a wafer Wa, a wafer placement portion 42 which holds the wafer Wa so that it can be moved, and a bare-chip taking-out unit 50 (i.e., the chip-components taking-out device) which takes out and moves a bare chip to the component standby portion 55 from the wafer Wa that is placed in the wafer placement portion 42.

The component standby portion 55 is placed between the rail members 11a, 11b. The component standby portion 55 is provided with a table 55a, and a bare chip that is removed from the wafer Wa is placed on the table 55a in a state where it can be suctioned by the head units 12a, 12b.

The cassette setting portion 40 is arranged to jut out sideward (or, downward in FIG. 42) from the base stand 110. The cassette 41 which has stored the wafers WA (i.e., the wafers on which bare chips are kept diced) is designed to be set to the cassette setting portion 40 so that it can be attached and detached. In the cassette setting portion 40, a wafer inserting and taking-out mechanism is provided which inserts and removes wafers into and from the cassette 41, though it is not shown in any figures. Using this mechanism, the wafers WA inside of the cassette 41 are removed, and then, they are moved and placed on a stage 48 (described later) of the wafer placement portion 42.

Figure 44:
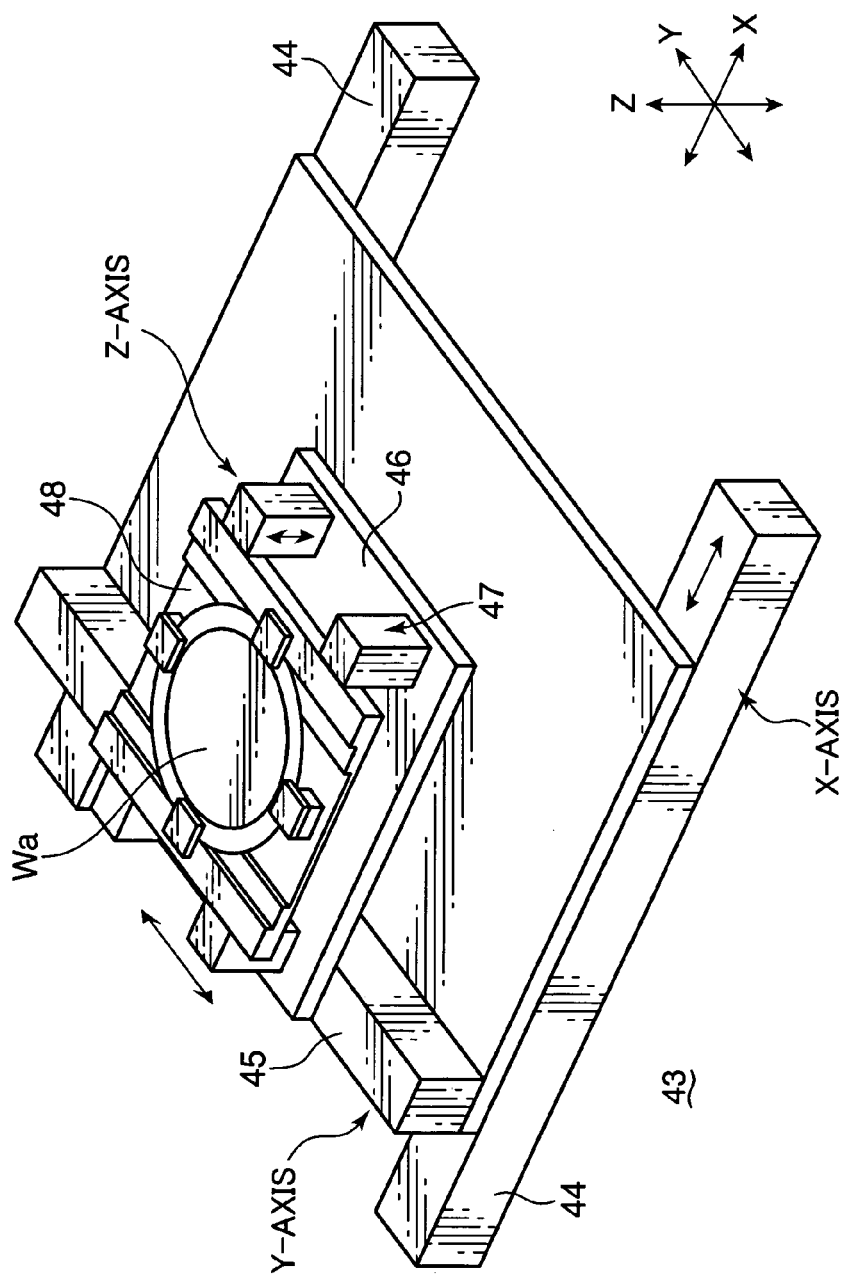
FIG. 44 is a perspective view of a wafer movement unit, showing its configuration.

The wafer placement portion 42 is located between the rail member 11b on one side and the cassette setting portion 40. In the wafer placement portion 42, as shown in FIG. 44, there is provided a wafer movement unit 43.

The wafer movement unit 43 is placed below the base stand 110, and includes a movable member 45 which can move along a pair of rail members that extends in the X-axis direction, a base member 46 which can move in the Y-axis direction with respect to the movable member 45, and a wafer placement table 48 which is held above the base member 46 by an up-and-down movement axis 47, so that it can be moved up and down (i.e., in the Z-axis direction). Then, the wafer Wa is supported on the table 48, and in this state, the movable member 45 moves in the X-axis direction and the base member 46 moves in the Y-axis direction. As a result, the wafer Wa is moved along the X-Y plane (i.e., two-dimensionally).

The bare-chip taking-out unit 50 preferably includes an elevated rail member 51 which extends from the wafer placement portion 42 to the component standby portion 55 in the Y-axis direction, and a movable unit 52 which can move along the rail member 51. In the movable unit 52, an up-and-down moving frame 54 is provided which can move up and down relative to its body. A suction head 53 that includes a nozzle for suctioning components (or a suction nozzle 53a) is disposed in the up-and-down moving frame 54, and is held so that it can rotate around the horizontal axis with respect to the up-and-down moving frame 54.

In brief, in the wafer area Sa2, the wafer Wa is removed from the cassette 41 that is set at the cassette setting portion 40. Then, it is moved and placed onto the wafer placement table 48 of the wafer placement portion 42. Next, using the bare-chip taking-out unit 50, bare chips are removed one by one to the component standby portion 55 from the wafer Wa on the wafer placement table 48.

Using the bare-chip taking-out unit 50, bare chips are removed as described below. More specifically, as shown on the left side in FIG. 45, the suction nozzle 53a is directed downward. In this state, the movable unit 52 is put in a predetermined chip-suction position above the wafer placement portion 42. Thereafter, the up-and-down moving frame 54 moves up and down with respect to the movable unit 52. As it moves up and down, through an opening portion 49 of the base stand 110, a bare chip is picked up from the wafer Wa, while being suctioned by the suction nozzle 53a. At this time, the above-described wafer movement unit 43 operates to move the wafer Wa. Thereby, the bare chip to be removed is put in the position opposite to the suction nozzle 53a, and in the height position where it is removed. Then, the bare chip is picked up, and thereafter, the movable unit 52 is located at the component standby portion 55. As shown on the left side (or by the broken line) in the same figure, the bare chip is placed on the table 55a, face up, in other words, in the posture where the bare chip is suctioned by the suction nozzle 16 and picked up from the wafer Wa and held in that state. Alternatively, as shown by the solid line, the suctioned bare chip is held above the table 55a, face down, in other words, in the posture where the bare chip is held by the suction, and the bare chip is turned over up and down by the rotation of the suction head 53.

In FIG. 41 and FIG. 42, reference numeral 56 denotes a chip recognition camera that is placed above the wafer placement portion 42. The camera 56 is fixed to the base stand 110 by a support arm 57. The chip recognition camera 56 preferably includes an image capture device such as a CCD area sensor. In order to recognize whether or not there is a mark (or a bad mark which is described later) that is written on the bare chip, it obtains and captures the image of each bare chip of the wafer Wa through the opening portion 49 of the base stand 110.

The component area Pa is an area where a tape for a tape feeder used in an apparatus that mounts electronic components is provided. More specifically, it is an area where an operation is performed for storing already-inspected bare chips (i.e., up-to-standard chips) in a special-purpose tape. It is preferably configured as described below.

In the component area Pa, on one side (i.e., on the upside in FIG. 42) with respect to the rail members 11a, 11b, there is supported a reel 62 around which a base tape 63 is rolled. The base tape 63 is preferably provided with a large number of concave portions in line that are used to store components. On the other side opposite to the reel 62 with respect to the rail members 11a, 11b, there is supported a reel 61 around which a reel 60 and a product tape 61 are rolled. A cover tape is wound around the reel 60. Between both rail members 11a, 11b, there is provided a component storage portion 64. The base tape 63 that is introduced from the reel 62 passes through the component storage portion 64. Then, it is led to the reel 61 and is wound up around the reel 61. Immediately before that, the cover tape is stuck on the base tape 63, so that the openings of the concave portions are covered. In other words, in the concave portions of the base tape 63 that passes through the component storage portion 64, the already-inspected bare chips (i.e., the chips that have met the predetermined standard) are stored one after another. Then, the cover tape is attached, so that the concave portions are closed.

Figure 46:
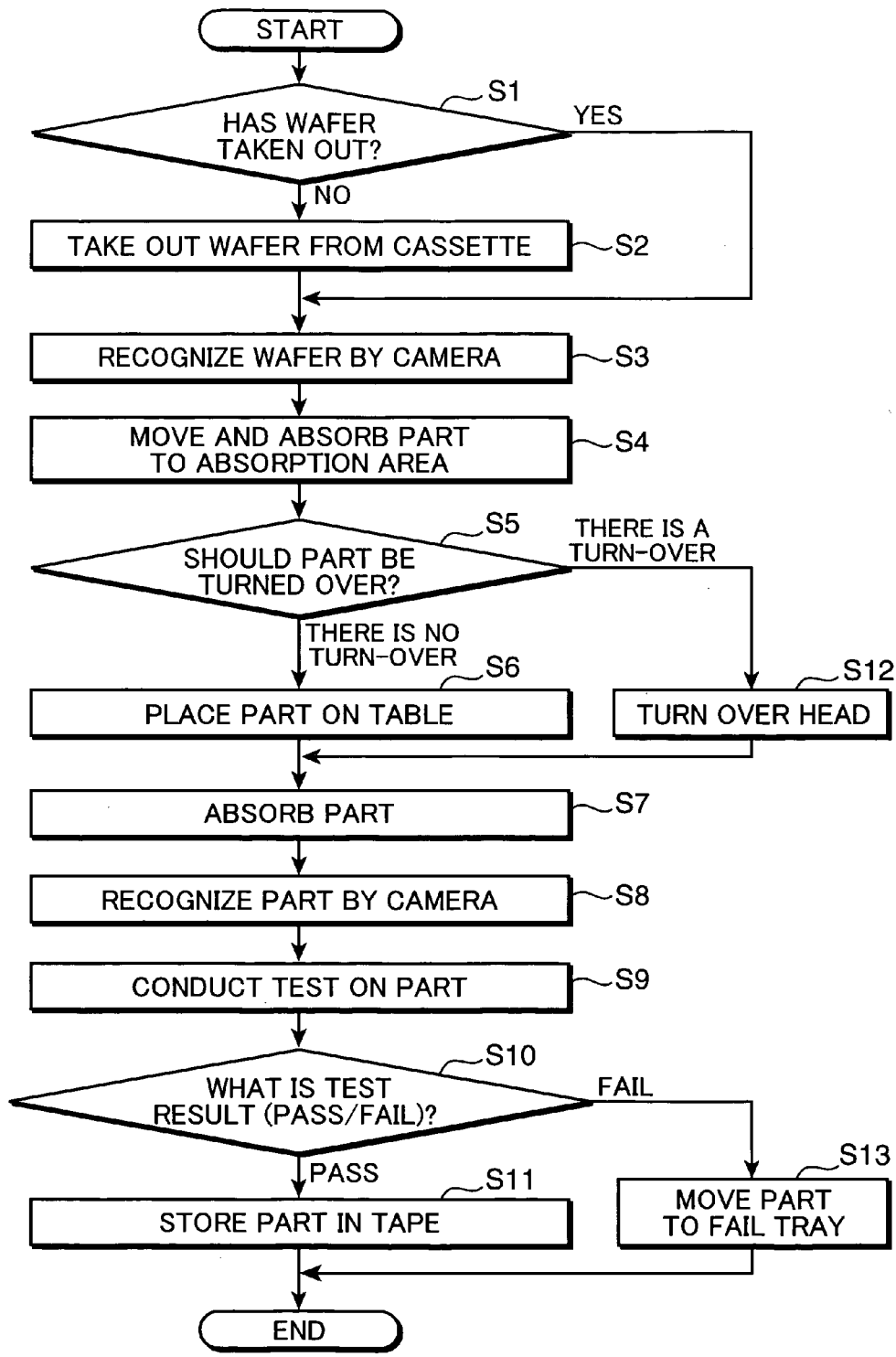
FIG. 46 is a flow chart, showing an inspection operation in the electronic component inspection apparatus according to the ninth preferred embodiment of the present invention.

Though it is not shown in any figure, the electronic component inspection apparatus 10I also preferably includes the control portion 190, in the same way as in the electronic component inspection apparatus 1A according to the first preferred embodiment. All the operations of the above-described head units 12a, 12b and other suitable elements are systematically controlled by the control portion 190. Hereinafter, an example of the operation of the electronic component inspection apparatus 10I by the control portion will be described, using the flow chart in FIG. 46.

If an operation starts for an inspection, first, a decision is made whether or not the wafer Wa has been removed from the wafer placement portion 42 (in a step S1). If the decision is made that the wafer Wa has not been removed, the wafer Wa is removed from the cassette 41 that is set at the cassette setting portion 40. Then, it is moved and placed onto the table 48 of the wafer movement unit 43 (in a step S2).

Next, an image of the wafer Wa that has been placed onto the table 48 is recognized (in a step S3). More specifically, among the bare chips that have been diced, the ones that are already defective in shape due to the manufacturing process are each given a bad mark in the pre-process. in a step S4, the wafer movement unit 43 operates to move the wafer Wa relative to the chip recognition camera 56, and an image of each bare chip is captured. As a result, among the bare chips in the wafer Wa, the position (or coordinates) of a bare chip with a bad mark is recognized using its image.

When the image recognition of such a bare chip is completed, the movable unit 52 is put in a predetermined chips taking-out position. The wafer movement unit 43 operates to move the wafer Wa relatively to the movable unit 52, so that a bare chip to be removed faces the suction head 53. Then, the bare chip is removed (in the step S4).

After the bare chip has been removed by the suction head 53, a decision is made whether or not it should be turned over (in a step S5). If the decision is made that it should not be turned over (i.e., there is no turn-over), the movable unit 52 moves to the component standby portion 55. Then, the bare chip is placed face up onto the table 55a (in a step S6). On the other hand, if the decision is made that it should be turned over (i.e., there is a turn-over), after the movable unit 52 moves to the component standby portion 55, the suction head 53 rotates to place the bare chip face down above the table 55a (in a step S12).

Next, the first head unit 12a (or the second head unit 12b) is moved above the component standby portion 55. Thereafter, the heads 13, 14 operate to allow the first head unit 12a (or the second head unit 12b) to suction/pick-up the bare chip on the table 55a, or the bare chip that is suctioned and held by the suction head 53 (in a step S7).

When a component (i.e., the bare chip) is suctioned by the first head unit 12a (or the second head unit 12b), the first head unit 12a (or the second head unit 12b) is moved, and thereby, the bare chip is located above the component position confirmation camera 151a (or 151b). Then, the state in which the bare chip is suctioned is recognized (in a step S8).

Thereafter, the first head unit 12a (or the second head unit 12b) is placed above the inspection plate 153. Then, the heads 13, 14 descend, and thus, the bare chip is inserted into the socket of the inspection plate 153. Then, the bare chip is inspected (in a step S9). At this time, in response to the recognition result in the step S8, the operation of the first head unit 12a (or the second head unit 12b) is controlled. As a result, the bare chip is properly inserted into the socket. During the inspection, the bare chip is continued to be suctioned and held by the head 13. Thus, the inspection is conducted with the bare chip pressed downward by the head 13 or other suitable mechanism.

In this way, the inspection is completed, and then, a decision is made whether or not the inspection result is a pass (in a step S10). In response to the result, sorting is conducted. More specifically, if the inspection result is not a pass, the first head unit 12a (or the second head unit 12b) operates to store the bare chip as it is in the tray T of the component storage portion 32 (in a step S13). On the other hand, if the inspection result is a pass, the first head unit 12a (or the second head unit 12b) operates to carry the bare chip as it is to the component area Pa and to store it in the tape (i.e., the base tape 63). In this way, a series of operations for inspecting the bare chip is completed.

Herein, during the above-described inspection operations, the tray T2 for below-standard components that has been placed in the component storage portion 32 is fully loaded. At that time, the tray T2 is sent out to the stocker 33. Then, the new empty tray T3 is carried in, and thus, the tray T is replaced, as described below. First, the tray movement mechanism operates to send out the tray T2 that is now used in the component storage portion 32 from the component storage portion 32 to the stocker 33. Next, the first head unit 12a (or the second head unit 12b) moves to above the empty-tray standby portion 31. After the tray suction head 15 has suctioned the empty tray T3, the head unit 12a moves to the component storage portion 32. As a result, the empty tray T3 is moved and replaced in the component storage portion 32. Thus, the empty tray T3 is used as the tray T for storing components that have been determined not to meet the predetermined standard. After this replacement has been completed, the tray movement mechanism operates to pull out the next empty tray T3, which is placed in the stocker 30 to the empty-tray standby portion 31.

Figure 47:
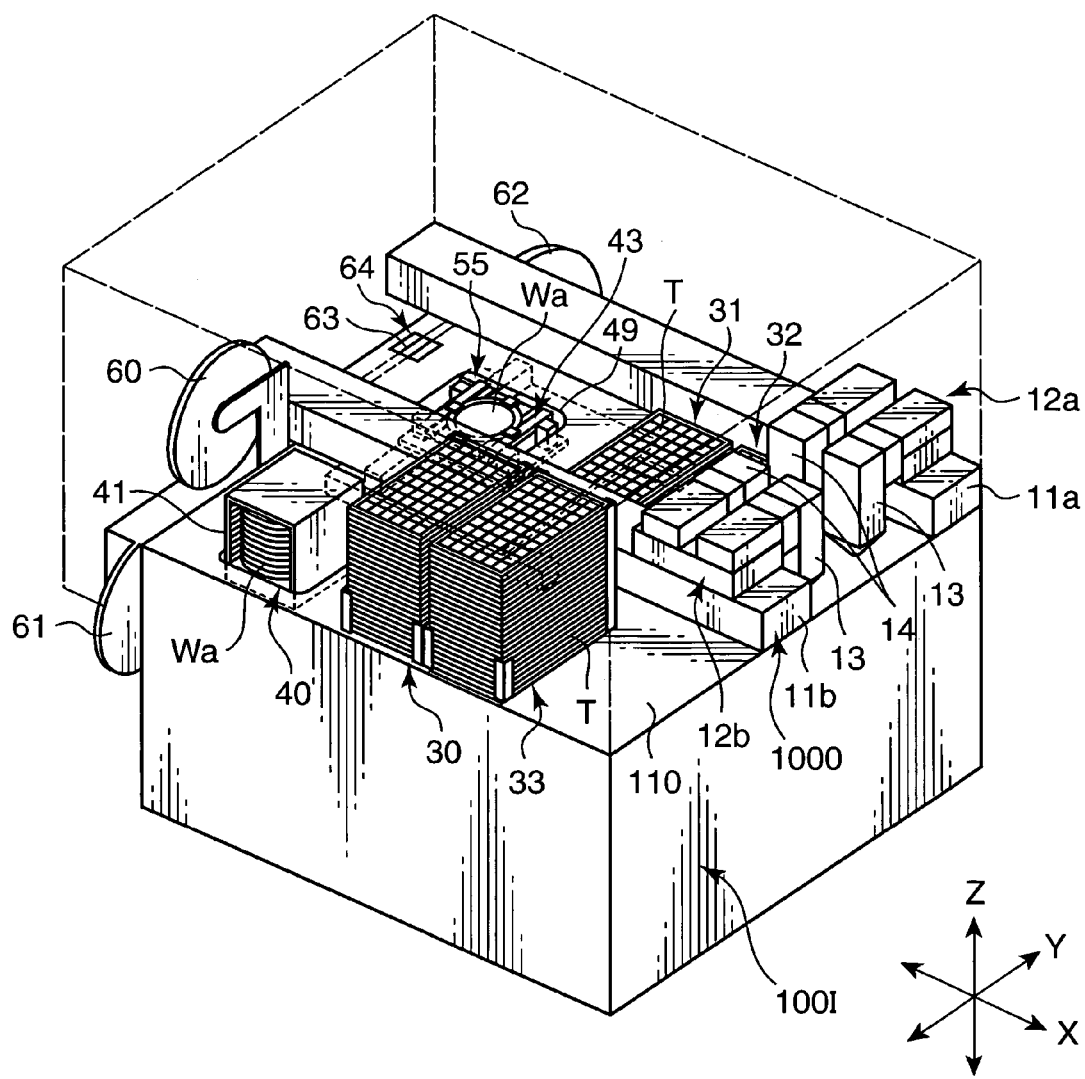
FIG. 47 is a perspective view of another electronic component inspection apparatus according to the ninth preferred embodiment of the present invention.

In the above-described electronic component inspection apparatus 10I according to the ninth preferred embodiment, in the case where a bare chip which has been removed from the wafer Wa is inspected face up, the bare-chip taking-out unit 50 may also be omitted. In this case, for example, as shown in FIG. 47, instead of the above-described table 55a, the configuration of the wafer placement portion 42 is provided in the component standby portion 55. More specifically, the opening portion 49 through which a bare chip is removed is formed in the base stand 110, and below it, the wafer movement unit 43 is provided. Using the head units 12a, 12b (or the heads 13, 14), a bare chip is suctioned and picked up directly from the wafer Wa which is held on the table 48, and then, it is removed.

According to this configuration, after a bare chip has once been suctioned and picked up by the head units 12a, 12b, the bare chip is not received and carried out at all, before an inspection is completed and the bare chip is stored in the tape (i.e., the base tape 63) or other suitable member. Hence, there is an advantage in that a bare chip can be inspected more accurately and reliably.

Figure 45:
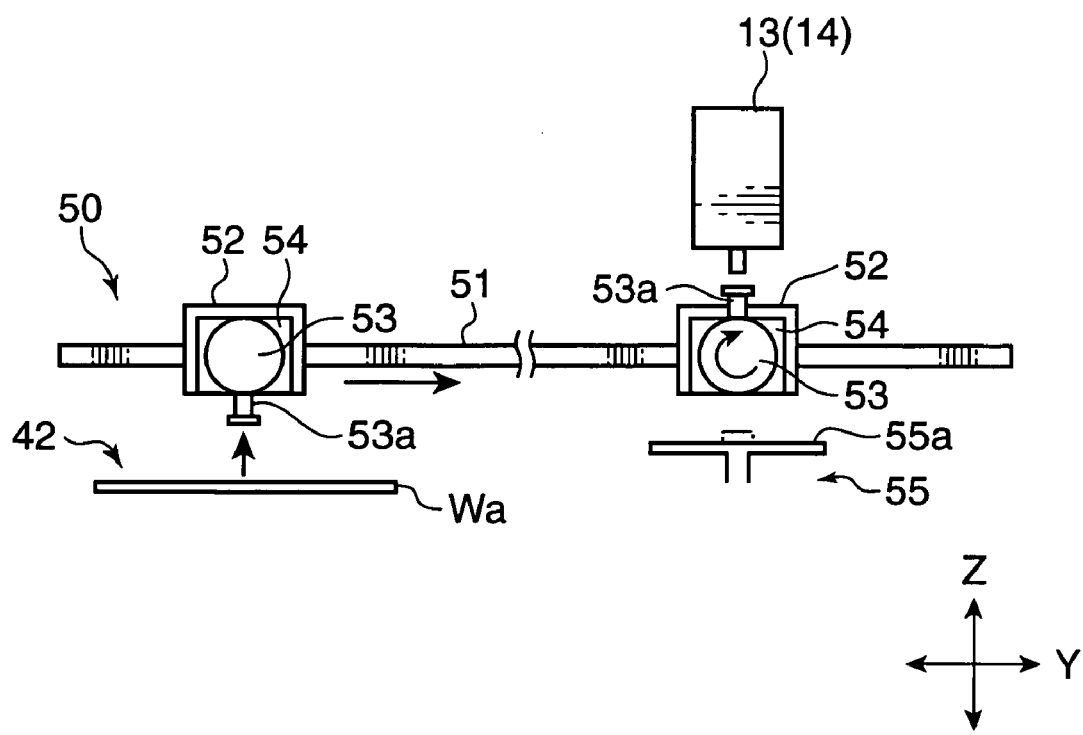
FIG. 45 is a perspective view of a chip components removal device, showing its configuration.

In this case, in FIG. 45, the cassette setting portion 40 may also be provided in the portion where the wafer movement unit 43 is disposed. According to such a configuration, the cassette setting portion 40 is prevented from jutting out sideward from the base stand 110. Hence, there is an advantage in that the space that is occupied by the apparatus becomes smaller.

In such an electronic component inspection apparatus 10I according to the ninth preferred embodiment, the inspection plate 153, the component standby portion 55 and the component storage portions 32, 64 are arranged in line, and thus, as the component transferring device 1000, it is sufficient that the head units 12a, 12b are simply arranged to move straight. Thus, there is an advantage in that the configuration of the apparatus can be simplified. Also, in this apparatus, as described above, the head 15 for a tray is placed in the head units 12a, 12b. The head units 12a, 12b for transferring components are also used to move and replace (or transfer) the empty tray T3 from the empty-tray standby portion 31 to the component storage portion 32. In other words, an economical and efficient configuration is realized. Therefore, the configuration of the apparatus is much simpler than in the case where a means for transferring only a tray is provided. In addition, this simpler configuration helps decrease the price of the apparatus.

Furthermore, according to this configuration, the electronic component inspection apparatus 1I includes the function (i.e., the component area Pa) of producing a tape for a tape feeder that is used in the apparatus that is practically installed. Hence, there is an advantage in that the performance of a bare chip that is stored in the tape becomes more reliable. In other words, in the electronic component inspection apparatus 1I, after being inspected, a bare chip that is held by the head units 12a, 12b is stored as it is in the base tape 63, and it becomes a product. Therefore, in a process where it becomes a tape product, there is no need to transfer a bare chip between transfer mechanisms. This prevents it from receiving an adverse effect, such as an impact or static electricity. Thus, the bare chip that is stored in the tape can be properly protected from physical destruction or other damage, and the performance of a bare chip that is stored in the tape becomes more reliable.

In the electronic component inspection apparatus 1I according to the ninth preferred embodiment, such a configuration as described below can be used.

For example, in the case where a bare chip that is removed from the wafer Wa is constantly inspected face up, the bare-chip taking-out unit 50 may also be omitted. In that case, for example, as shown in FIG. 47, instead of the table 55a, the configuration of the wafer placement portion 42 is provided in the component standby portion 55. More specifically, the opening portion 49 through which a bare chip is removed is formed in the base stand 110, and below it, the wafer movement unit 43 is provided. Using the head units 12a, 12b (or the heads 13, 14), a bare chip is suctioned and picked up directly from the wafer Wa which is held on the table 48, and then, it is removed.

According to this configuration, after a bare chip has been picked up once by the head units 12a, 12b, the bare chip is not received, transferred or handled again, before an inspection is completed and the bare chip is stored in the tape (i.e., the base tape 63) or other suitable member. Hence, there is an advantage in that a bare chip can be inspected more accurately and reliably.

In this case, in FIG. 45, the cassette setting portion 40 may also be provided in the portion where the wafer movement unit 43 is disposed. According to such a configuration, the cassette setting portion 40 is prevented from jutting out sideward from the base stand 110. Hence, there is an advantage in that the space that is occupied by the apparatus becomes smaller.

The present invention is not limited to the above-described preferred embodiments, and thus, it can be expanded and varied. Any expanded and varied embodiments are also within the scope of the present invention.

(1) According to the first preferred embodiment, in order to connect the electronic component D to the inspection socket 152 more reliably, based on the recognition of its image, a shift in the suction of the electronic component D is corrected using software. However, for example, a component position adjustment mechanism may also be provided which mechanically adjusts the position of the electronic component D.

Figure 48A:
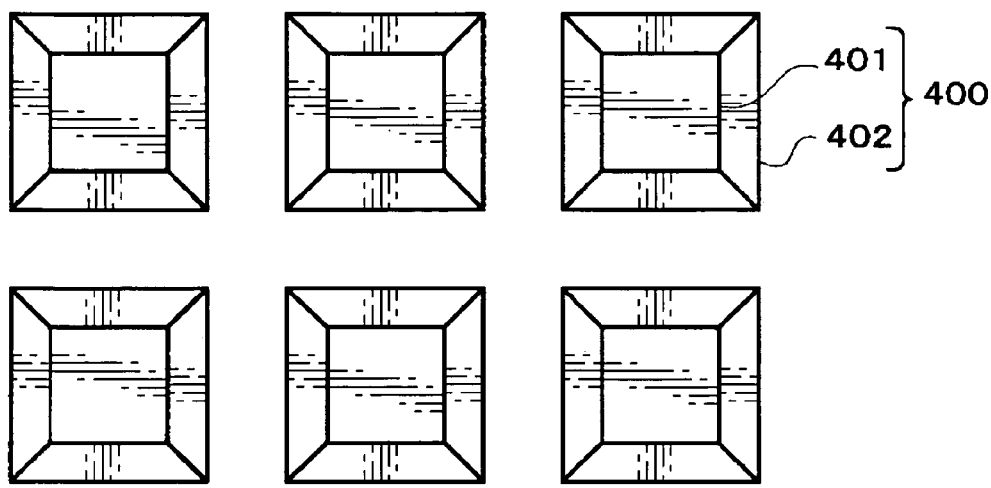
FIGS. 48A and 48B are an enlarged top view and a sectional view of an example of a component position adjustment mechanism.

FIGS. 48A,B are an enlarged top view and sectional view of an example of a component position adjustment mechanism 400. The component position adjustment mechanism 400 can be placed in any position on a base stand of an electronic component transfer unit.

Using the component position adjustment mechanism 400, the position of the electronic component D can be adjusted. This makes it possible to omit a component position confirming member such as a component position confirmation camera.

Figure 48B:
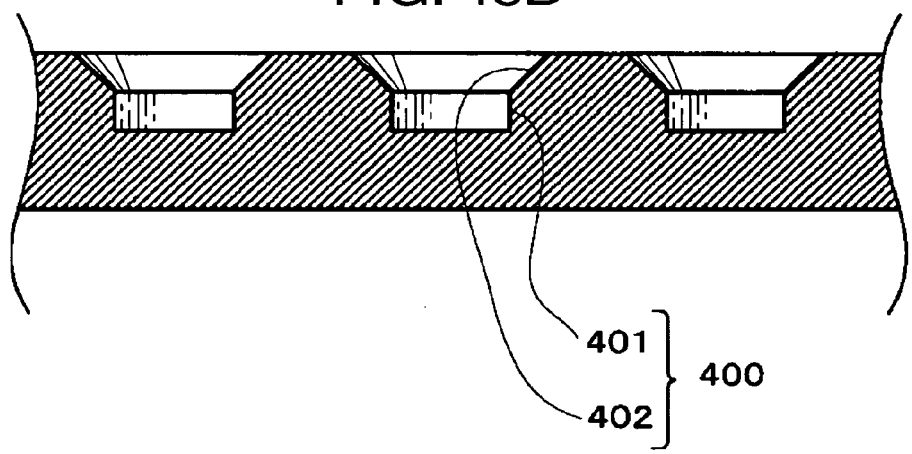

The component position adjustment mechanism 400 shown in FIGS. 48A-48B preferably includes a positional-reference portion 401, and a guide portion 402.

The positional-reference portion 401 is positioned to predetermined coordinates (X, Y, R) in the electronic component inspection apparatus 1A. In addition, the positional-reference portion 401 includes a concave portion that is formed so as to correspond to the external shape of the electronic component D. In this example, the external shape of the electronic component D is regarded as a substantially rectangular flat plate, and thus, the positional-reference portion 401 preferably has a concave portion that is shaped like a substantially rectangular parallelepiped and having a bottom that has a substantially rectangular shape.

The guide portion 402 has the function of a guide that leads the electronic component D to the positional-reference portion 401. The guide portion 402 is formed by a concave portion which is slightly larger than the external shape of the electronic component D. In this example, the guide portion 402 is formed by the concave portion that is preferably shaped like a substantially trapezoidal regular-pyramid that has sides that extend to the four apexes of the bottom surface of the positional-reference portion 401.

Figure 49A:
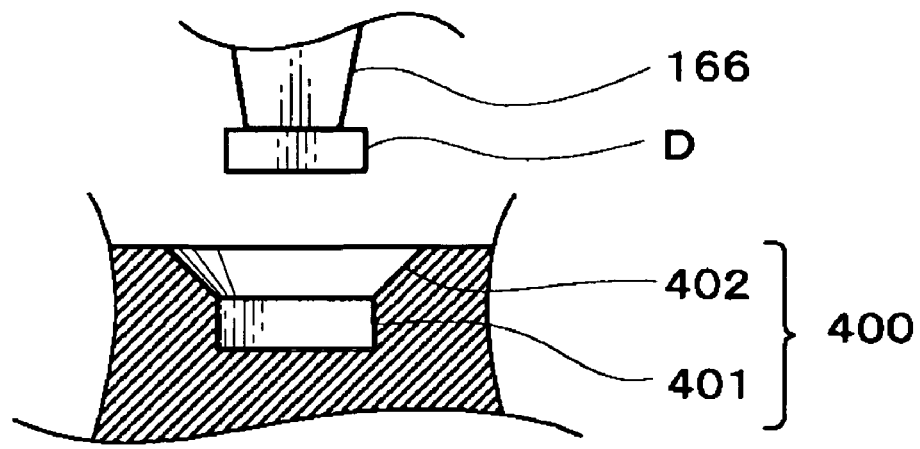
FIGS. 49A-49C are representations showing the mechanism of a positional adjustment by the component position adjustment mechanism shown in FIGS. 48A and 48B.
Figure 49B:
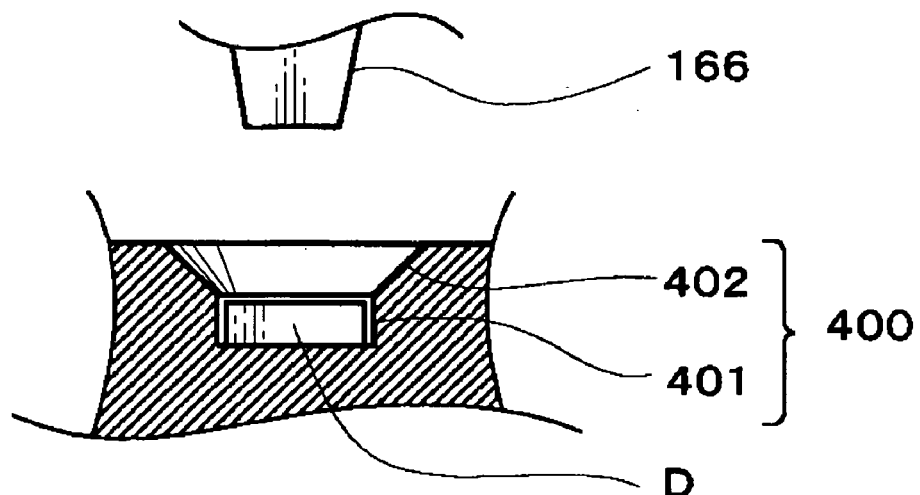
Figure 49C:
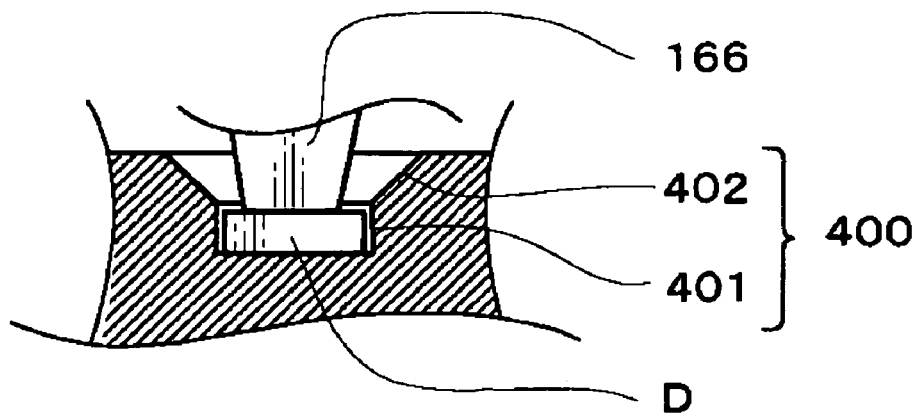

FIGS. 49A-49C show the mechanism of a positional adjustment by the component position adjustment mechanism 400. As shown in this figure, in the case where a positional adjustment is made by the component position adjustment mechanism 400, for example, the electronic component D is suctioned and picked up by the suction nozzle 166 (or the suction nozzle 16 of the head units 12a, 12b according to the ninth preferred embodiment) of the components transfer mechanism 160. Then, it is transferred up to above the component position adjustment mechanism 400 (see FIG. 49A). Then, the suction nozzle 166 is moved down and releases the electronic component D, so that it is placed (or falls) into the guide portion 402 of the component position adjustment mechanism 400. Thus, the electronic component D that has been placed on the component position adjustment mechanism 400 is led, by its own weight (i.e., gravitation), along the guide portion 402 to the positional-reference portion 401. Then, the component reaches a reference position, and its position is adjusted (see FIG. 49B).

Thereafter, the electronic component D is suctioned by the components transfer mechanism 160, so that the position of the electronic component D is corrected with respect to the components transfer mechanism 160 (see FIG. 49C). As a result, the electronic component D is precisely attached to a socket for an inspection, or such an operation is accurately conducted.

Figure 50:
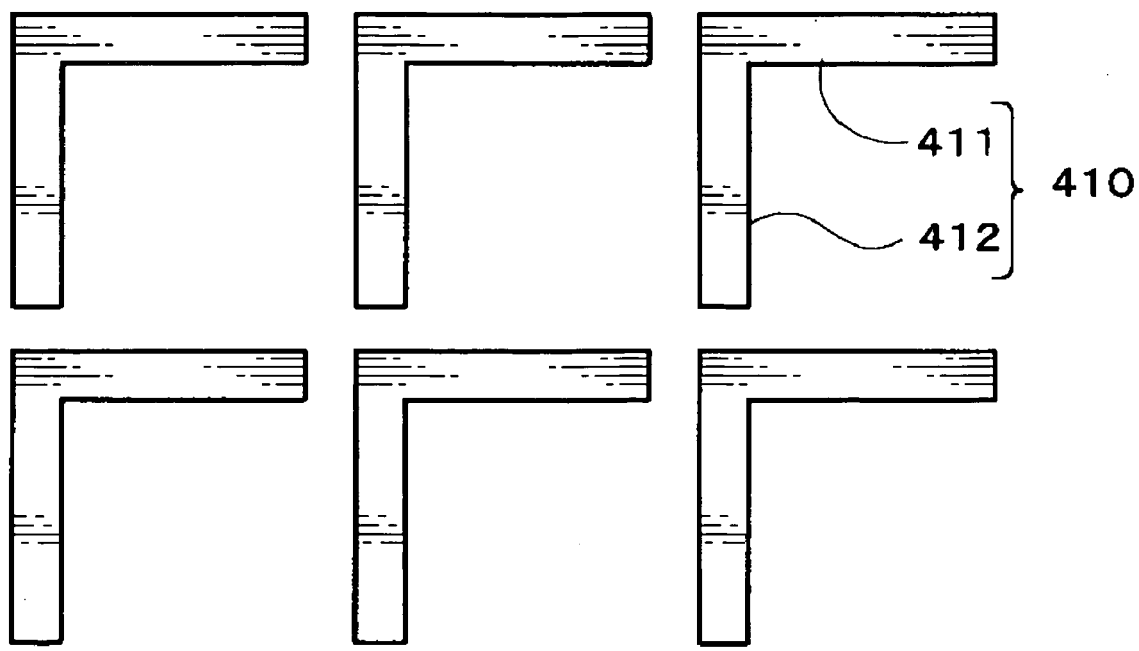
FIG. 50 is an enlarged top view and sectional view of another example of the component position adjustment mechanism.

FIG. 50 is a top view of another example of the component position adjustment mechanism (i.e., a component position adjustment mechanism 410). This component position adjustment mechanism 410 preferably includes two positional-reference walls 411, 412.

Each positional-reference wall 411, 412 is positioned at predetermined coordinates (X, Y, R) in an electronic component inspection apparatus. In addition, each wall 411, 412 has a concave portion that is formed so as to correspond to the external shape of the electronic component D. In this example, the external shape of the electronic component D is regarded as a substantially rectangular flat plate, and thus, the positional-reference walls 411, 412 have reference surfaces that correspond to the two sides.

Figure 51A:
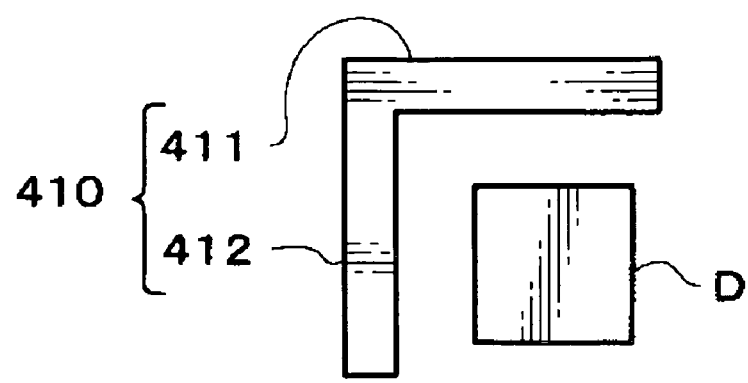
FIGS. 51A-51C are representations showing the mechanism of a positional adjustment by the component position adjustment mechanism shown in FIG. 50.
Figure 51B:
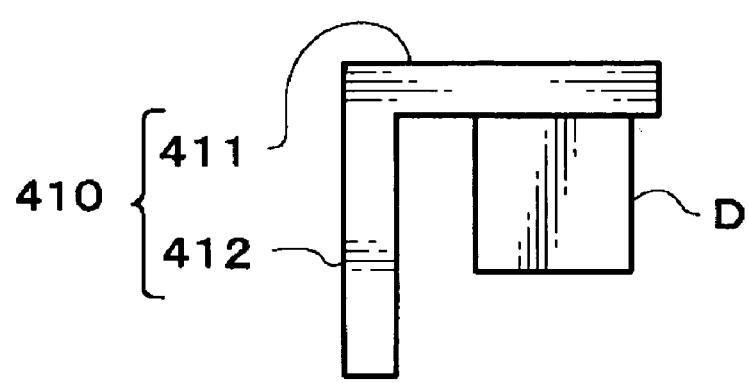
Figure 51C:
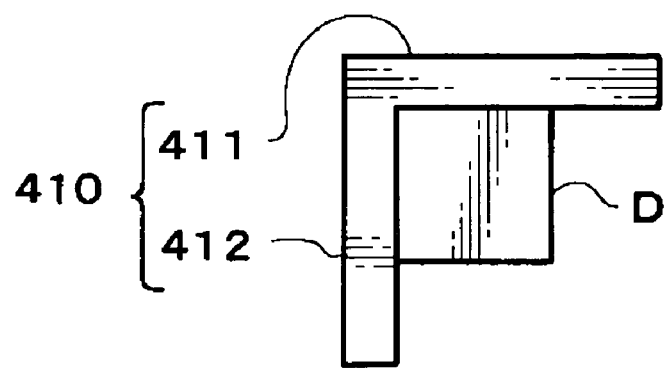

FIGS. 51A-51C show the mechanism of a positional adjustment by the component position adjustment mechanism shown 410. As shown in these figures, in the case where a positional adjustment is made by the component position adjustment mechanism 410, for example, the electronic component D is suctioned and moved by the suction nozzle 166 (or the suction nozzle 16 of the head units 12a, 12b according to the ninth preferred embodiment) of the components transfer mechanism 160. Then, it is transferred up to above the component position adjustment mechanism 410. Thereafter, the electronic component D is placed near the corner of the positional-reference walls 411, 412 of the component position adjustment mechanism 410 (see FIG. 51A).

Then, the position of the electronic component D is adjusted so that one side of the electronic component D is pressed against the reference surface of the positional-reference wall 411 (see FIG. 51B) Next, the one side of the electronic component D is kept pressed on the reference surface of the positional-reference wall 411. In this state, the electronic component D is moved to the position in which another side of the electronic component D is pressed against the reference surface of the positional-reference wall 412. In this way, the electronic component D is pressed on both reference surfaces of the positional-reference walls 411, 412. As a result, the position of the electronic component D is adjusted.

Thereafter, the electronic component D is suctioned and held by the components transfer mechanism 160, so that the position of the electronic component D is corrected with respect to the components transfer mechanism 160 (see FIG. 51C). As a result, the electronic component D is precisely attached to a socket for an inspection, or such an operation is accurately conducted.

(2) According to the first preferred embodiment, even in any of the apparatuses, the pair of X-axis robots 120 (or the rail members 11a, 11b according to the ninth preferred embodiment) are preferably provided on both sides (i.e., both sides in the Y-axis direction) with respect to the tray disposition area 130, and the suction nozzle 166 or other suitable element moves on both sides of the tray disposition area 130. However, of course, a single X-axis robot 120 or other suitable element may also be provided. In that case, the suction nozzle 166 or other suitable element is moved on only one side of the tray disposition area 130. According to such a configuration, the area in which the apparatus is installed in the Y-axis direction becomes smaller.

(3) According to the first preferred embodiment, the two components transfer mechanisms 160 are provided on the track of one X-axis robot 120. However, one components transfer mechanism, or three or more, may also be provided on the track of one X-axis robot 120.

Furthermore, the configuration and elements located on the X-axis rail, which is the track of the X-axis robot 120, can be suitably changed and designed. For example, FIGS. 52A-52D are representations showing an example of the relationship between an X-axis rail and a components transfer mechanism.

Figure 52A:
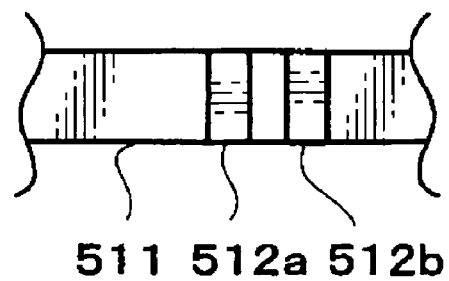
FIGS. 52A-52D are representations showing the relation between an X-axis rail and a component transfer mechanism.

In FIG. 52A, an X-axis robot preferably includes two components transfer mechanisms 512a, 512b on an X-axis rail 511. This is a configuration that corresponds to that according to the first preferred embodiment. For example, it can be realized using a linear motor.

Figure 52B:
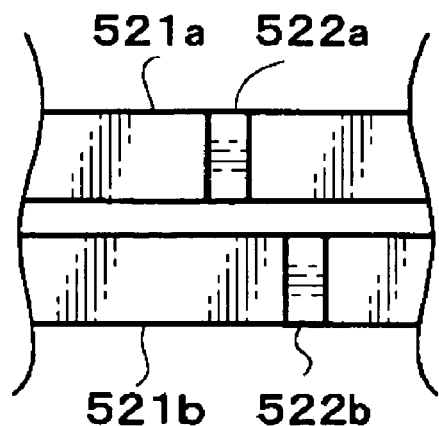

In FIG. 52B, an X-axis robot preferably includes components transfer mechanisms 522a, 522b on X-axis rails 521a, 521b, respectively. For example, it can be realized using a linear motor.

Figure 52C:
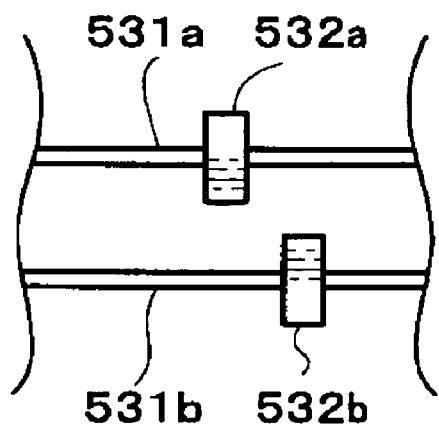

In FIG. 52C, components transfer mechanisms 532a, 532b are provided on X-axis rails 531a, 531b, respectively. The X-axis robots 531a, 531b are each configured, using a ball screw. These ball screws are rotated, and thereby, the components transfer mechanisms 532a, 532b are moved on the X-axis rails 531a, 531b as the ball screws, respectively.

Figure 52D:
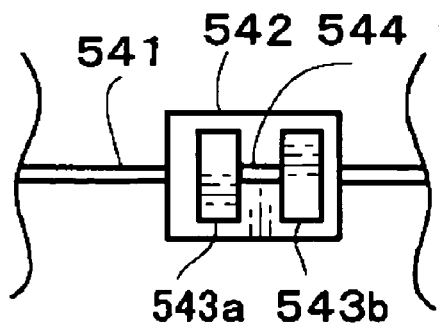

In FIG. 52D, a base body 542 is provided on an X-axis rail 541. On the base body 542, there are provided components transfer mechanisms 543a, 543b. Using a relatively-moving, device 544, the relative position between the components transfer mechanisms 543a, 543b in the X-axis direction can be changed on the base body 542. This is a configuration similar to that according to the ninth preferred embodiment.

The X-axis rail 541 and the relatively-moving device 544 can each be configured, for example, by a ball screw. These ball screws are rotated, and thereby, the base body 542 is moved along the X-axis rail 541, and the relative position between the components transfer mechanisms 543a, 543b is changed. These movements can be made independently. The X-axis rail 541 and the relatively-moving device 544 may each also be configured by a linear motor.

(4) For example, according to the first preferred embodiment, a Y-direction drive portion 162 is provided in the components transfer mechanism 160. Thus, the suction nozzle 166 can be moved in the Y-axis direction. However, for example, a Y-axis robot may also be provided on the base stand 110, so that the Y-axis robot can move the X-axis robot 120 in the Y-axis direction. As a result, the suction nozzle 166 is moved in the Y-axis direction. In this case, as the X-axis robot 120, one or two robots can be used.

(5) According to the first preferred embodiment, the empty tray T3 is provided in the tray disposition area 130 which is provided on the base stand 110 and between both X-axis robots 120a, 120b. However, the empty tray T3 may also be provided outside of this area.

In this case, a stocker that stores the empty tray T3 can be separately provided. Hence, using a tray transfer mechanism that is exclusively used, the empty tray T3 is transferred between the tray disposition areas 130a, 130b, 130c.

(6) According to the first preferred embodiment, the single suction nozzle 166 is preferably provided in the suction head 165. However, two or more suction nozzles 166 may also be provided. In addition, the number of sockets for an inspection of the inspection plate 153 may also be one, two or more than two. This is similar to the other preferred embodiments.

(7) The area on the tray T may also be divided in two in the Y-axis direction, so that the area correspond to the components transfer mechanisms 160 which are provided in the X-axis robots 120 according to the first preferred embodiment, respectively. In these divided areas, electronic components are transferred separately by each of the components transfer mechanisms 160 which are provided in the X-axis robots 120. This helps shorten the distance by which the components transfer mechanism 160 moves in the Y-axis direction. It also helps shorten the distance by which the tray T moves in the Y-axis direction by the Y-direction tray transfer mechanism 180. Therefore, the size of the apparatus in the Y-axis direction can be made smaller.

(8) According to the first preferred embodiment, communications are exchanged between the electronic component transfer unit 100A and the electronic component inspection unit 200. However, these communications are not necessarily needed. For example, the inspection socket 152 is monitored, using the inspection-position confirmation camera 154. When it is confirmed as a trigger that the electronic component D has been attached to the inspection socket 152, the electronic component D starts to be transferred and inspected. Alternatively, on the inspection socket 152, a mark is formed which shows the type of such a socket and the contents of an inspection. Using the inspection-position confirmation camera 154, this is read so that the contents of an inspection or the like can be selected. As a result, there will be no need for the above-described communications.

As to the inspection contents, the type of the electronic component D to be inspected, the process of an inspection, and other characteristics can be inspected. If a table is prepared which shows the relationship between this mark and the inspection contents, proper inspection contents can be selected by referring to this table.

(9) According to the first preferred embodiment, in the inspection area 150, in order to prevent the components transfer mechanisms 160 (or the suction heads 165) that are provided in the different X-axis robots 120 from interfering with each other, one of the suction heads 165 which may interfere with each other retreats in the Y-axis direction. However, the operation for preventing such interference may also be conducted, of course, outside of the inspection area 150.

Furthermore, if the plurality of components transfer mechanisms 160 which are provided in the common X-axis robots 120 are moving in the directions where they come close to each other, then the components transfer mechanism 160 on one side, or the components transfer mechanisms 160 on both sides, are moved in the directions opposite to the directions in which they are moving. Thereby, the components transfer mechanisms 160 can be prevented from colliding with each other. In this case, for example, a detecting device can be provided which detects, according to the output of the above-described encoder, the fact that both components transfer mechanisms 160 have come close within a certain distance between them. Based upon the detection by the detecting device, the above-described operation for preventing such a collision can be conducted.

(10) According to the first preferred embodiment, the direction in which the inspection plate 153 (or the inspection sockets 152a, 152b) is attached is detected, by detecting the opening portion 155 which is formed in the inspection plate 153 using the opening detection portion 156 (e.g., an optical sensor, a limit switch or other suitable element) on the side of the base stand 110. Instead of this, another mechanism can also be used for detecting the direction in which the inspection plate 153 is attached.

For example, in the apparatus according to the first preferred embodiment, a mark (e.g., a dotted or crossed mark) is preferably formed on the inspection plate 153. The mark on the inspection plate 153 is confirmed using the inspection-position confirmation camera 154. As a result, the direction in which the inspection plate 153 or the inspection sockets 152a, 152b are attached, and in addition, if necessary, their position (i.e., their coordinates in the X and Y-axis directions), can be detected. In this way, if the position of the inspection plate 153 is detected in advance, the electronic components D can be connected more precisely and reliably to the inspection sockets 152a, 152b.

A mark (e.g., a dotted or crossed mark) is preferably formed on each inspection socket 152a, 152b. The mark on each inspection socket 152a, 152b is confirmed using the inspection-position confirmation camera 154. As a result, the direction in which each inspection socket 152a, 152b is attached can also be detected. In this case, the direction and position (i.e., their coordinates in the X and Y-axis directions) of the inspection sockets 152a, 152b themselves can be directly detected. The electronic component D can be certainly connected to the inspection sockets 152a, 152b.

The number of such marks that are formed on each of the inspection plate 153 and the inspection sockets 152a, 152b may be one, or two or more. For example, two marks are formed on any of the inspection plate 153 and the inspection sockets 152a, 152b, and an image of these marks is captured by the inspection-position confirmation camera 154. Based on the coordinates of the two marks, the position and direction of the inspection sockets 152a, 152b can be detected. In this case, the marks that are put in different positions are used, and thereby, the position and direction of the inspection sockets 152a, 152b can be more precisely detected.

Even without such a detecting device as described above for detecting the direction of an attachment, the position and direction of the inspection sockets 152a, 152b may also be detected. For example, an operator can conduct an input operation, using an input device (such as an input switch, a mouse and a keyboard).

The other preferred embodiments have been described, mainly by targeting the electronic component inspection apparatus 1A according to the first preferred embodiment. However, of course, other preferred embodiments can be provided even according to the first to ninth preferred embodiments.

As described hereinbefore, in the electronic component inspection apparatus according to various preferred embodiments of the present invention, electronic components that are placed in the component standby portion are transferred to the inspection portion by the component transferring device. Then, after a predetermined inspection is conducted here, using the component transferring device, the electronic components after they have been inspected are transferred to the component storage portion that corresponds to the inspection result, and they are stored in it. This electronic component inspection apparatus is especially useful in inspecting electronic components efficiently and precisely.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. An electronic component inspection apparatus, comprising:
   an inspection portion which inspects a component;
   a component standby portion in which the component waits before the component is inspected by the inspection portion;
   a component storage portion which stores the component after the component has been inspected;
   a component transferring device which has a suction nozzle that applies suction to pick up the component and transfer the component between the component standby portion or the component storage portion and the inspection portion;
   an image capturing device arranged to capture an image of the component that is being transferred by the component transferring device; and
   a controlling device which transfers the component to the inspection portion, via a position in which the image capturing device captures an image of the component when the component is held by the suction nozzle and is being transferred from the component standby portion to the inspection portion, and based on a result of the captured image of the component, the controlling device controls the drive of the component transferring device so that the component is set in the inspection portion;
   wherein
   the inspection portion, the component standby portion, the component storage portion and the image capturing device, are arranged along a line within a range of motion of the suction nozzle; and
   the component transferring device includes a track that extends in a direction along which the inspection portion, the component standby portion, the component storage portion and the image capturing device are disposed, and moves the suction nozzle along the track.

2. The electronic component inspection apparatus according to claim 1, wherein the component transferring device includes a pair of the tracks arranged substantially parallel to each other and between which the inspection portion, the component standby portion, the component storage portion and the image capturing device are disposed, and the component transferring device includes a pair of suction nozzles arranged to move along the pair of tracks.

3. The electronic component inspection apparatus according to claim 2, further comprising:
   a detecting device for detecting whether the suction nozzles, which move along the track, come within a close-state condition defined by a predetermined interval between the pair of suction nozzles; and
   a collision-prevention controlling device for, based on the close-state detection by the detecting device, controlling the drive of the component transferring device, so that the suction nozzles are prevented from colliding.

4. The electronic component inspection apparatus according to claim 3, wherein the pair of suction nozzles moves along the track and based on the close-state detection by the detecting device, the collision-prevention controlling device moves at least one suction nozzle of the pair of suction nozzles in an opposite direction.

5. The electronic component inspection apparatus according to claim 3, wherein the suction nozzles each move along a pair of the tracks, and the component transferring device moves at least one suction nozzle of the suction nozzles in directions other than the directions of the tracks, and based on the close-state detection by the detecting device, the collision-prevention controlling device moves the suction nozzles in directions other than the directions of the tracks.

6. The electronic component inspection apparatus according to claim 1, wherein two of each of the component standby portion, the component storage portion and the image capturing device are provided, and said two of each of the component standby portion, the component storage portion and the image capturing device are arranged along a line such that the inspection portion is located between each of the two component standby portions, the two component storage portions and the two image capturing devices, and the component transferring device has a pair of the suction nozzles which move along the track.

7. The electronic component inspection apparatus according to claim 6, further comprising:
   a detecting device for detecting whether the suction nozzles, which move along the track, come within a close-state condition defined by a pretermined interval between the pair of suction nozzles; and
   a collision-prevention controlling device for, based on the close-state detection by the detecting device, controlling the drive of the component transferring device, so that the suction nozzles are prevented from colliding.

8. The electronic component inspection apparatus according to claim 1, wherein two of each of the component standby portion, the component storage portion and the image capturing device are provided, and said two of each of the component standby portion, the component storage portion and the image capturing device are arranged along a line such that the inspection portion is located between each of the two component standby portions, the two component storage portions and the two image capturing devices, and the component transferring device includes a pair of the tracks arranged substantially parallel to each other and between which the inspection portion, the two component standby portions, the two component storage portions and the two image capturing devices are disposed, and the component transferring device includes a pair of suction nozzles arranged to move along the pair of tracks.

9. The electronic component inspection apparatus according to claim 8, further comprising:
   a detecting device for detecting whether the suction nozzles, which move along the track, come within a close-state condition defined by a pretermined interval between the pair of suction nozzles; and
   a collision-prevention controlling device for, based on the close-state detection by the detecting device, controlling the drive of the component transferring device, so that the suction nozzles are prevented from colliding.

10. The electronic component inspection apparatus according to claim 1, wherein the component standby portion is arranged to hold a wafer on which a chip component in a diced state defining the component is held.

11. The electronic component inspection apparatus according to claim 10, wherein the component standby portion is arranged to hold a plurality of components that are stored in a container, and the position in which the wafer with the chip component in the diced state stands by, and the position in which the plurality of components which is stored in the container stands by, are arranged in a line along the track.

12. The electronic component inspection apparatus according to claim 1, wherein:
the component standby portion places as a unit a chip component which defines the component;
wafer placement portion is provided on a side of the component standby portion and in which a wafer with the chip component in a diced state is placed, and a chip-component removal device is provided which removes and moves the chip component from the wafer placement portion to the component standby portion;
the chip-component removal device switches from a state in which the chip component is lifted from the wafer and is held face up, to a state in which the chip component is turned over from the removed state and is held face down; and
the component transferring device applies suction using the suction nozzle to the chip component which is placed face up in the component standby portion or the chip component which is placed face down by the chip-component removal device, and transfers the chip component to the inspection portion.

13. The electronic component inspection apparatus according to claim 12, wherein the component standby portion is arranged to hold a plurality of components that are stored in a container, and the position in which the wafer with the chip component in the diced state stands by, and the position in which the plurality of components which is stored in the container stands by, are arranged in a line along the track.

14. The electronic component inspection apparatus according to claim 1, wherein:
the component storage portion includes a packaging device for providing a component storage tape which has a plurality of concave portions arranged in a line for storing in the concave portions of the component storage tape components after the components have been inspected, and for covering with a cover tape the openings of the concave portions after the components are stored therein; and
the component transferring device stores the components after the components are inspected in the concave portions of the tape.

15. An electronic component inspection apparatus, comprising:
an inspection portion which inspects a component;
a component standby portion in which the component waits before the component is inspected by the inspection portion;
a component storage portion which stores the component after the component has been inspected;
a component transferring device which has a suction nozzle that applies suction to pick Up the component and transfer the component between the component standby portion or the component storage portion and the inspection portion;

an image capturing device arranged to capture an image of the component that is being transferred by the component transferring device; and
a controlling device which transfers the component to the inspection portion, via a position in which the image capturing device captures an image of the component when the component is held by the suction nozzle and is being transferred from the component standby portion to the inspection portion, and based on a result of the captured image of the component, the controlling device controls the drive of the component transferring device so that the component is set in the inspection portion;
wherein
at least one of the component standby portion and the component storage portion holds a component which is stored in a container.

16. The electronic component inspection apparatus according to claim 15, wherein:
the container that holds the component before the component has been inspected is positioned in the component standby portion;
the container that holds the component after the component has been inspected is positioned in the component storage portion; and
the containers are each arranged in a line along the track.

17. The electronic component inspection apparatus according to claim 15, further comprising a container moving device for moving the container along a horizontal plane, in directions other than the directions in which the suction nozzle moves.

18. The electronic component inspection apparatus according to claim 17, wherein the container moving device moves the container in directions substantially perpendicular to the directions in which the suction nozzle moves.

19. The electronic component inspection apparatus according to claim 17, wherein:
the container that holds the component before the component has been inspected is positioned in the component standby portion;
the container that holds the component after the component has been inspected is positioned in the component storage portion; and
the container moving device moves each of the containers independently of each of the respective component standby portion and the component storage portion.

20. The electronic component inspection apparatus according to claim 15, further comprising:
container storage portion in which the container is removed from and put into, the component standby portion or the component storage portion; and
a container transferring device which transfers the container between the component standby portion or the component storage portion and the container storage portion.

21. The electronic component inspection apparatus according to claim 20, wherein two container storage portions are provided, a respective one of the two container storage portions is provided in each of the component standby portion and the component storage portion, and the two container storage portions arranged in the respective component standby portion and the component storage portion are disposed in a line along the track.

22. The electronic component inspection apparatus according to claim 20, further comprising a container moving device, wherein the container moving device performs a function of the container transferring device to remove from and put into the container storage portion one of the containers.

23. The electronic component inspection apparatus according to claim 22, wherein the component transferring device transfers the one of the containers along the track.

* * * * *